US012690351B2

(12) United States Patent
Bae et al.

(10) Patent No.: US 12,690,351 B2
(45) Date of Patent: Jul. 21, 2026

(54) DISPLAY APPARATUS

(71) Applicant: LG Display Co., Ltd., Seoul (KR)

(72) Inventors: Kyoungji Bae, Paju-si (KR);
JaeKyeong Yun, Paju-si (KR);
Sungmoo Kim, Paju-si (KR); **Takashi
Hirano, Paju-si (KR); Jinah Kwak**,
Paju-si (KR); Heetae Lim, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 473 days.

(21) Appl. No.: 18/485,960

(22) Filed: Oct. 12, 2023

(65) Prior Publication Data

US 2024/0147802 A1      May 2, 2024

(30) Foreign Application Priority Data

Oct. 31, 2022    (KR) ........................ 10-2022-0142601

(51) Int. Cl.
| | |
|---|---|
| *H10K 50/13* | (2023.01) |
| *H10K 50/15* | (2023.01) |
| *H10K 50/16* | (2023.01) |
| *H10K 50/17* | (2023.01) |
| *H10K 59/35* | (2023.01) |
| *H10K 102/00* | (2023.01) |

(52) U.S. Cl.
CPC ........... *H10K 59/351* (2023.02); *H10K 50/13*
(2023.02); *H10K 50/15* (2023.02); ***H10K
50/16* (2023.02); *H10K 50/17*** (2023.02);
*H10K 50/171* (2023.02); *H10K 2102/351*
(2023.02)

(58) Field of Classification Search
CPC ........ H10K 50/13; H10K 50/15; H10K 50/17;
H10K 50/171

USPC ..................................................... 313/498–512
See application file for complete search history.

(56) References Cited

U.S. PATENT DOCUMENTS

| | | | | |
|---|---|---|---|---|
| 2008/0111474 A1* | 5/2008 | Sung | ...................... | H10K 59/38 |
| | | | | 445/35 |
| 2013/0140535 A1* | 6/2013 | Chu | ...................... | H10K 59/351 |
| | | | | 257/40 |
| 2014/0183496 A1* | 7/2014 | Heo | ........................ | H10K 59/32 |
| | | | | 438/35 |
| 2016/0126485 A1* | 5/2016 | Lee | ........................ | H10K 59/35 |
| | | | | 438/35 |
| 2021/0313403 A1* | 10/2021 | Jeong | ...................... | H10K 50/19 |

FOREIGN PATENT DOCUMENTS

CN         110767715 A  *  2/2020  ............. H10K 59/35

* cited by examiner

*Primary Examiner* — Christopher M Raabe

(74) *Attorney, Agent, or Firm* — Seed Intellectual
Property Law Group LLP

(57) ABSTRACT

A display apparatus includes a substrate including a plurality
of subpixels. Each of the plurality of subpixels includes a
first electrode, a first emission part on the first electrode, the
first emission part including a first hole functional layer and
a first emission layer, a first charge generating layer on the
first emission part, a second emission part on the first charge
generating layer, the second emission part including a sec-
ond hole functional layer and a second emission layer, a
second charge generating layer on the second emission part,
and a third emission part on the second charge generating
layer, the third emission part including a third hole func-
tional layer and a third emission layer. Thicknesses of the
first hole functional layers respectively at the plurality of
subpixels are different.

41 Claims, 9 Drawing Sheets

Figure 4:
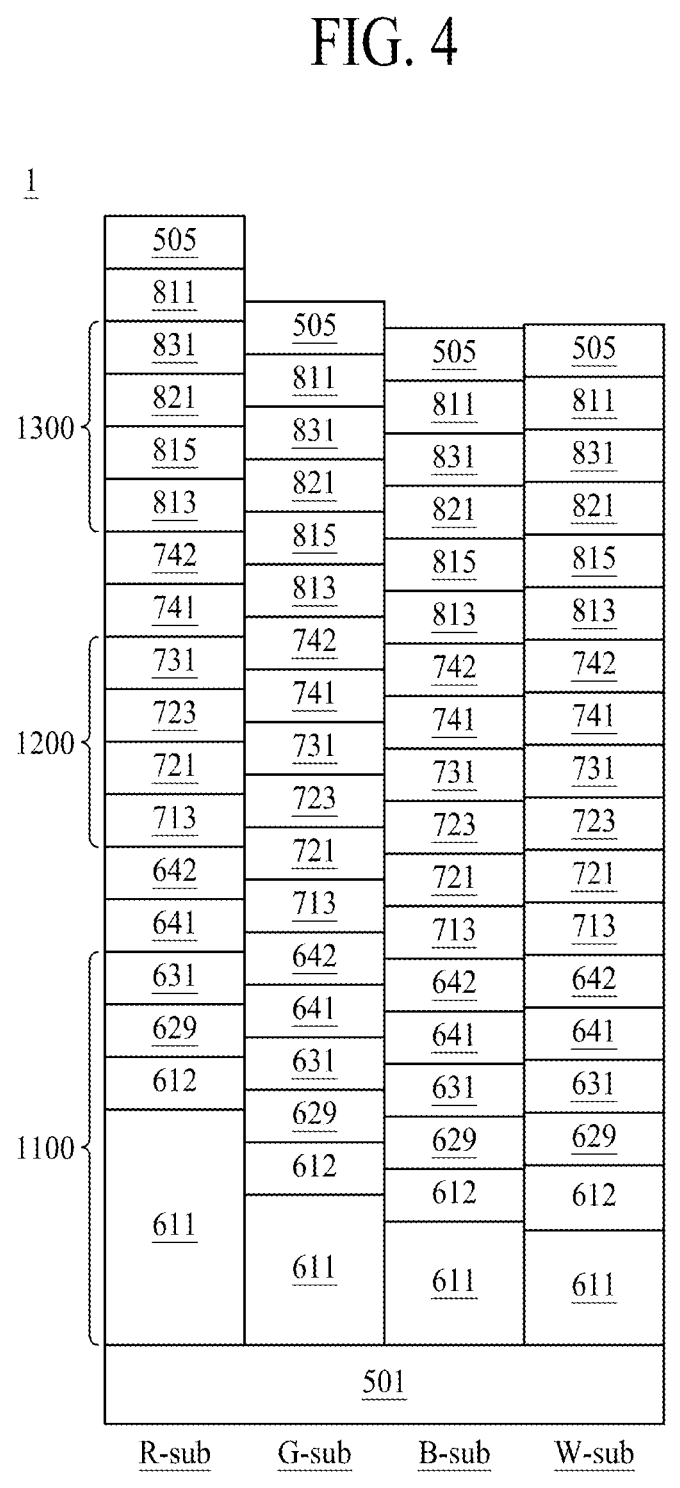

| R-sub | G-sub | B-sub | W-sub |
|---|---|---|---|
| 505 | | | |
| 811 | | | |
| 831 | 505 | | |
| 821 | 811 | 505 | 505 |
| 815 | 831 | 811 | 811 |
| 813 | 821 | 831 | 831 |
| 742 | 815 | 821 | 821 |
| 741 | 813 | 815 | 815 |
| 731 | 742 | 813 | 813 |
| 723 | 741 | 742 | 742 |
| 721 | 731 | 741 | 741 |
| 713 | 723 | 731 | 731 |
| 642 | 721 | 723 | 723 |
| 641 | 713 | 721 | 721 |
| 631 | 642 | 713 | 713 |
| 629 | 641 | 642 | 642 |
| 612 | 631 | 641 | 641 |
| 611 | 629 | 631 | 631 |
| | 612 | 629 | 629 |
| | 611 | 612 | 612 |
| | | 611 | 611 |
| 501 | | | |

Figure 6:
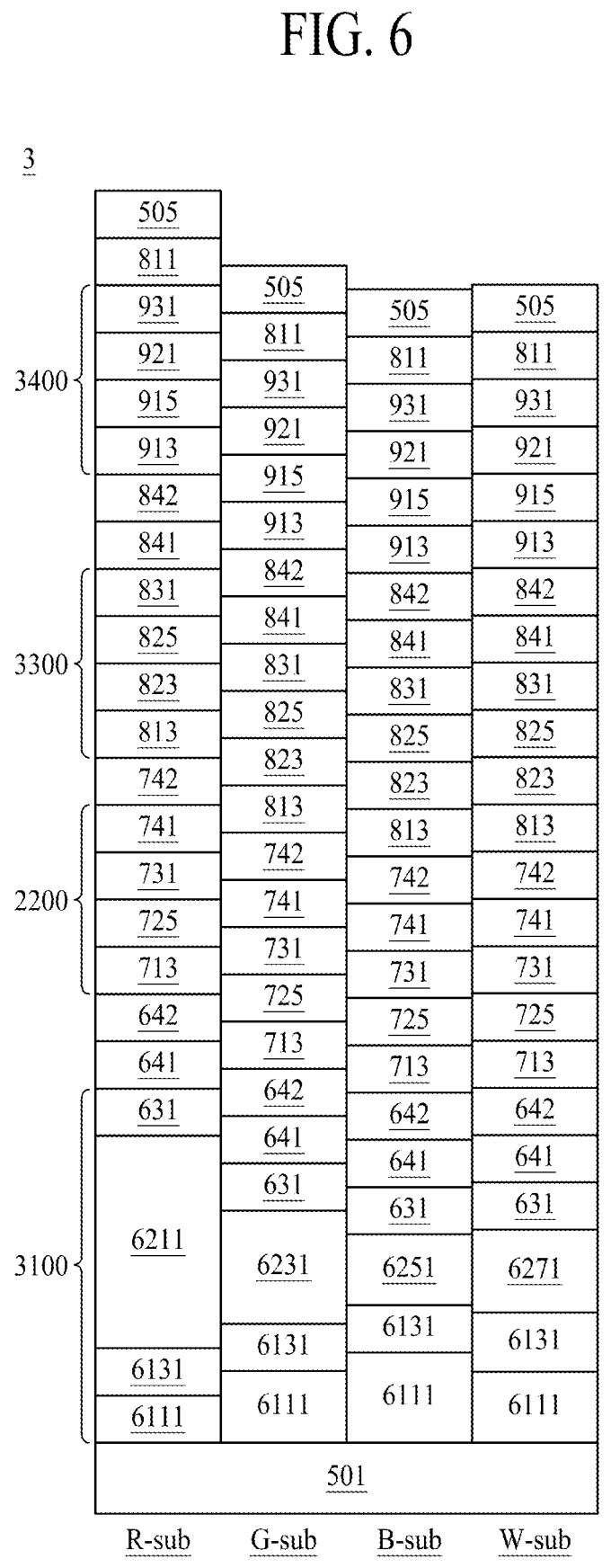

| R-sub | G-sub | B-sub | W-sub |
|---|---|---|---|
| 505 | | | |
| 811 | 505 | | |
| 931 | 811 | 505 | 505 |
| 921 | 931 | 811 | 811 |
| 915 | 921 | 931 | 931 |
| 913 | 915 | 921 | 921 |
| 842 | 913 | 915 | 915 |
| 841 | 842 | 913 | 913 |
| 831 | 841 | 842 | 842 |
| 825 | 831 | 841 | 841 |
| 823 | 825 | 831 | 831 |
| 813 | 823 | 825 | 825 |
| 742 | 813 | 823 | 823 |
| 741 | 742 | 813 | 813 |
| 731 | 741 | 742 | 742 |
| 725 | 731 | 741 | 741 |
| 713 | 725 | 731 | 731 |
| 642 | 713 | 725 | 725 |
| 641 | 642 | 713 | 713 |
| 631 | 641 | 642 | 642 |
| 6211 | 631 | 641 | 641 |
| | 6231 | 631 | 631 |
| | | 6251 | 6271 |
| | | 6131 | 6131 |
| 6131 | 6131 | 6111 | 6111 |
| 6111 | 6111 | | |
| 501 | | | |

3400 (931, 921, 915, 913)
3300 (831, 825, 823, 813)
2200 (741, 731, 725, 713)
3100 (631, 6211, 6131, 6111)

Wavelength(nm)

Wavelength(nm)

Wavelength(nm)

DISPLAY APPARATUS

CROSS-REFERENCE TO RELATED APPLICATIONS

This application claims the benefit of the Korean Patent Application No. 10-2022-0142601 filed on Oct. 31, 2022, which is hereby incorporated by reference as if fully set forth herein.

BACKGROUND

Technical Field

The present disclosure relates to a display apparatus.

Description of the Related Art

As society advances to the information-oriented society, various display apparatuses for processing and displaying massive information have been developed. Display apparatuses for displaying an image include various kinds of display apparatuses such as liquid crystal display (LCD) apparatuses, light emitting display apparatuses, and electrophoresis display apparatuses.

Light emitting display apparatuses are light self-emitting display apparatuses and may be manufactured to be lightweight and have a thin thickness because a separate light source is not needed unlike LCD apparatuses. Also, based on low voltage driving, light emitting display apparatuses are efficient in power consumption and good in color implementation, response time, viewing angle, and contrast ratio, and thus, are being researched as next-generation display apparatuses.

BRIEF SUMMARY

An emission layer and/or an organic layer of a light emitting display apparatus may be formed by a deposition process or a solution process. In a light emitting display apparatus including an emission layer and/or an organic layer formed by the deposition process, a lifetime may be long but it may be difficult to adjust a thickness of the emission layer and/or the organic layer, and due to this, there may be a problem where it is difficult to optimize efficiency. In a light emitting display apparatus including an emission layer and/or an organic layer formed by the solution process, a thickness of the emission layer and/or the organic layer may be adjusted for each pixel.

Therefore, the inventors have recognized problems described above and have performed various research and experiments for adjusting a thickness of an emission layer and/or an organic layer in a solution process and enhancing efficiency. Based on the various research and experiments, the inventors have invented a new display apparatus which may enhance the efficiency of the display apparatus.

An aspect of the present disclosure is directed to providing a display apparatus for enhancing the efficiency of the display apparatus.

Additional features and aspects will be set forth in the description that follows, and in part will be apparent from the description or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises a substrate including a plurality of subpixels, each of the plurality of subpixels may comprise a first electrode, a first emission part on the first electrode, the first emission part including a first hole functional layer and a first emission layer, a first charge generating layer on the first emission part, a second emission part on the first charge generating layer, the second emission part including a second hole functional layer and a second emission layer, a second charge generating layer on the second emission part, and a third emission part on the second charge generating layer, the third emission part including a third hole functional layer and a third emission layer. Thicknesses of the first hole functional layers respectively at the plurality of subpixels may be different.

According to an embodiment of the present disclosure, a display apparatus may be configured and a thickness of an emission layer and/or an organic layer may be adjusted by a deposition process and a solution process, and thus, the efficiency of the display apparatus may be enhanced and a current may be reduced.

According to an embodiment of the present disclosure, layers between a first electrode and a second electrode may differ in thickness for each subpixel, and as thicknesses of layers between a first electrode and a second electrode of each subpixel are changed, the cavity characteristics of the subpixels may differ. Accordingly, a display apparatus may be implemented where the efficiency of each subpixel is improved and a current is reduced.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain principles of the disclosure.

FIG. 4 illustrates a display apparatus according to an embodiment of the present disclosure.

FIG. 6 illustrates a display apparatus according to another embodiment of the present disclosure.

DETAILED DESCRIPTION

Figure 1:
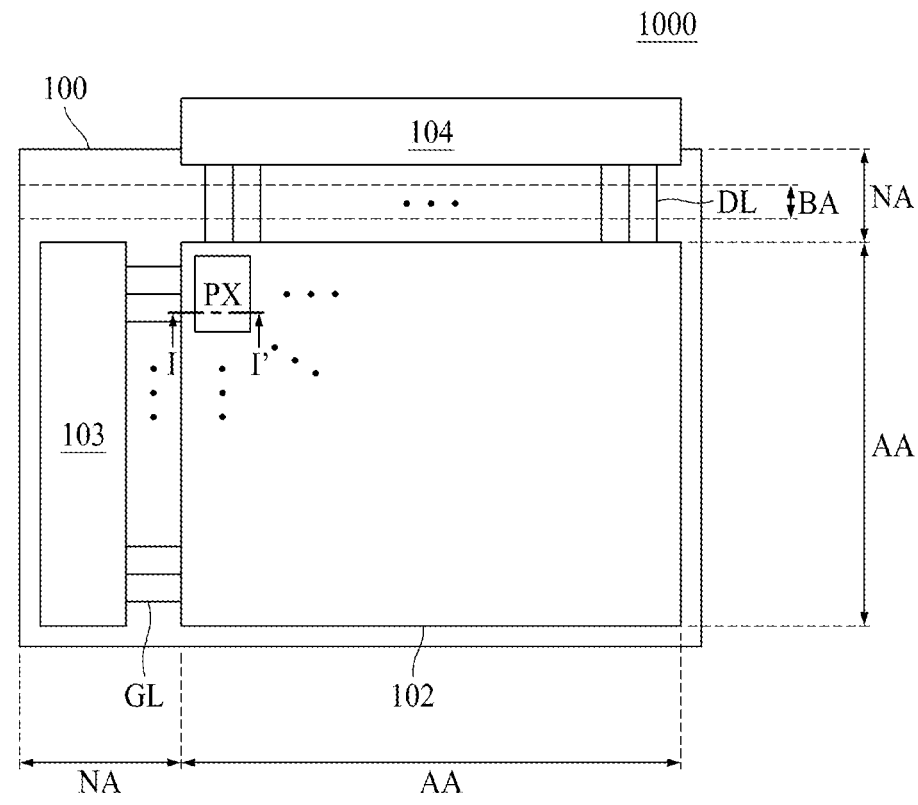
FIG. 1 illustrates a display apparatus according to an embodiment of the present disclosure.

Throughout the drawings and the detailed description, unless otherwise described, the same drawing reference numerals should be understood to refer to the same elements, features, and structures.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used. In the description of embodiments, when a structure is described as being positioned "on or above or over" or "under or below" another structure, this description should be construed as including a case in which the structures contact each other as well as a case in which a third structure is disposed therebetween.

In describing a time relationship, for example, when the temporal order is described as, for example, "after," "subsequent," "next," and "before,", or the like a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

In the present disclosure, a "display apparatus" may include a display apparatus as a narrow meaning, such as an organic light emitting module (OLED module) and a quantum dot module (Quantum Dot Module) including a display panel and a driver for driving the display panel. In addition, in the present disclosure, the apparatus may include a set device (or a set apparatus) or a set electronic device such as a notebook computer, a television, a computer monitor, an equipment apparatus including an automotive apparatus or another type apparatus for vehicles, or a mobile electronic device such as a smartphone or an electronic pad, which is a complete product (or a final product) including an OLED module and a Quantum Dot Module, or the like.

Therefore, a display apparatus in the present disclosure may include a display apparatus itself, as a narrow meaning, such as an OLED module and a Quantum Dot Module, or the like, and a set device which is a final consumer device or an application product including the OLED module and the Quantum Dot Module, or the like.

In one or more embodiments, the OLED module and the Quantum Dot Module including a display panel and a driver, or the like may be expressed as "display apparatus" in a narrow sense, and an electronic device which is a final product including the OLED module and the Quantum Dot Module may be expressed separately as a "set apparatus". For example, the display apparatus in a narrow sense may include a display panel, such as an organic light emitting (module) or a quantum dot (Module), and a source printed circuit board (PCB) which is a controller for driving the display panel, and the set apparatus may further include a set PCB which is a set controller electrically connected to the source PCB to overall control the set apparatus.

A display panel applied to an embodiment of the present disclosure may use all types of display panels such as an organic light emitting display panel, a quantum dot display panel, and an electroluminescent display panel, or the like. The display panel according to an embodiment of the present disclosure may be a display panel capable of bezel bending using a flexible substrate for an organic light emitting display panel and a lower backplate support structure, but embodiments of the present disclosure are not limited thereto. In addition, a display panel applied to a display apparatus according to an embodiment of the present disclosure is not limited a shape or a size thereof.

For example, in case of the display panel is the organic light emitting display panel, the display panel may include a plurality of gate lines and a plurality of data lines, and a plurality of pixels respectively provided in the intersection area of the gate lines and/or the data lines. In addition, the display panel may be configured to include an array substrate including a TFT which is an element for selectively applying a voltage to each of the plurality of pixels, a light emitting device layer on the array substrate, and an encapsulation substrate or an encapsulation layer disposed on the array substrate to cover the light emitting device layer, or the like. The encapsulation layer may protect the TFT and the light emitting device layer or the like from an external impact and may prevent water or oxygen from penetrating into the light emitting device layer. In addition, a layer (or the light emitting device layer) provided on the array substrate may include an inorganic light emitting layer, for example, a nano-sized material layer or a quantum dot material, or the like.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

FIG. 1 illustrates a display apparatus according to an embodiment of the present disclosure.

The display apparatus 1000 according to an embodiment of the present disclosure may include a display panel 102. The display panel 102 may include a display area AA provided at the substrate 100 and a non-display area NA disposed at a periphery of the display area AA.

The substrate 100 may include a plastic material having flexibility so as to be bent. For example, the substrate 100 may include a material such as polyimide (PI), polyethylene terephthalate (PET), polyethylene naphthalate (PEN), poly-carbonate (PC), polyethersulfone (PES), polyarylate (PAR), polysulfone (PSF), or cyclic-olefin copolymer (COC), but embodiments of the present disclosure are not limited thereto. For example, a material of the substrate 100 may not exclude glass. As another embodiment of the present disclosure, the substrate 100 may include a semiconductor material such as a silicon wafer or the like.

The display area AA may be an area where a plurality of subpixels PX are provided to display an image. Each of the plurality of subpixels PX may be an individual unit which emits light. A light emitting device and a driving circuit may be provided at each of the plurality of subpixels PX. For example, a display device configured to display an image and a circuit unit configured to drive the display device may be provided at each of the plurality of subpixels PX. For example, when the display apparatus 1000 is an organic light emitting display apparatus, the display device may include an organic light emitting device, and when the display apparatus 1000 is a liquid crystal display (LCD) apparatus, the display device may include a liquid crystal device (or a liquid crystal layer). The plurality of subpixels PX may include a red subpixel R-sub, a green subpixel G-sub, a blue subpixel B-sub, and/or a white subpixel W-sub, or the like, but embodiments of the present disclosure are not limited thereto.

The non-display area NA may be an area which does not display an image. The non-display area NA may be an area where various lines and driving integrated circuits (ICs) for driving the plurality of subpixels PX disposed in the display area AA are provided. For example, at least one of the data driver 104 and the gate driver 103 may be disposed at the non-display area NA, but embodiments of the present disclosure are not limited thereto.

The non-display area NA may be an area which surrounds the display area AA. For example, the non-display area NA may be at a periphery of the display area AA. For example, the non-display area NA may be an area which extends from the display area AA, or may be an area where the plurality of subpixels PX are not provided, but embodiments of the present disclosure are not limited thereto.

The non-display area NA which does not display an image may be a bezel region, or may further include a bending region where the substrate 100 is bent, but embodiments of the present disclosure are not limited thereto.

A plurality of data lines DL and a plurality of gate lines GL may be disposed at the display area AA. For example, the plurality of data lines DL may be arranged in rows or columns, and the plurality of gate lines GL may be arranged in columns or rows. A subpixel PX may be disposed at an area configured by a data line DL and/or a gate line GL.

The subpixel PX of the display area AA may include a thin film transistor (TFT) or a transistor, which includes a semiconductor layer. For example, the TFT or the transistor may include an oxide semiconductor material, but embodiments of the present disclosure are not limited thereto. For example, the TFT may be a transistor, but the terms are not limited thereto.

According to an embodiment of the present disclosure, the gate driver 103 including a gate driving circuit may be disposed at the non-display area NA. The gate driving circuit of the gate driver 103 may sequentially supply a scan signal to the plurality of gate lines GL, and thus, may sequentially drive pixel rows of the display area AA. For example, the pixel row may be a row which configures pixels connected to one gate line. The gate driving circuit may be referred to as a scan driving circuit, but the terms are not limited thereto.

The gate driving circuit may be configured with a TFT including a polycrystalline semiconductor layer, configured with a TFT including an oxide semiconductor layer, or configured with a TFT including a polycrystalline semiconductor layer and a TFT including an oxide semiconductor layer in pairs. In a case where the same semiconductor material is used in TFTs disposed in the non-display area NA and the display area AA, the TFTs may be formed simultaneously in the same process, but embodiments of the present disclosure are not limited thereto.

The gate driving circuit may include a shift register and a level shifter, or the like.

As the display apparatus according to an embodiment of the present disclosure, the gate driving circuit may be implemented as a gate in panel (GIP) type and may be directly disposed at the substrate 100.

The gate driver 103 including the gate driving circuit may sequentially supply a scan signal of an on voltage or an off voltage to the plurality of gate lines GL.

The gate driver 103 according to an embodiment of the present disclosure may be directly formed at the substrate 100 by a TFT using a polycrystalline semiconductor material as a semiconductor layer, or may formed by configuring a TFT which uses a polycrystalline semiconductor material as a semiconductor layer and a TFT which uses an oxide semiconductor material as a semiconductor layer into a complementary metal oxide semiconductor (CMOS) transistor.

According to an embodiment of the present disclosure, the oxide semiconductor material may include at least one or more of an IGZO(InGaZnO)-based oxide semiconductor material, an IZO(InZnO)-based oxide semiconductor material, an IGZTO(InGaZnSnO)-based oxide semiconductor material, an ITZO(InSnZnO)-based oxide semiconductor material, a FIZO(FeInZnO)-based oxide semiconductor material, an ZnO-based oxide semiconductor material, a SIZO(SiInZnO)-based oxide semiconductor material, and a ZnON(Zn-Oxynitride)-based oxide semiconductor material, but embodiments of the present disclosure are not limited thereto.

When the gate driver 103 includes a TFT including an oxide semiconductor layer and a TFT including a polycrystalline semiconductor layer, electron mobility may be high in channel, and thus, a high resolution and a low power may be implemented.

The display apparatus 1000 according to an embodiment of the present disclosure may further include the data driver 104 including a data driving circuit. When a specific gate line is opened by the gate driver 103 including the gate driving circuit, the data driving circuit may convert image data into analog data voltages and may supply the data voltages to the plurality of data lines.

The plurality of gate lines GL disposed at the substrate 100 may include a plurality of scan lines and a plurality of emission control lines. The plurality of scan lines and the plurality of emission control lines may be lines which transfer different kinds of gate signals (for example, scan signals and emission control signals) to gate nodes of different kinds of transistors (for example, scan transistors and emission control transistors).

The gate driver 103 including the gate driving circuit may include a scan driving circuit, which outputs the scan signals to a plurality of scan lines which is a kind of gate line GL, and an emission driving circuit which outputs the emission control signals to a plurality of emission control lines which are a different kind of gate line GL.

The display panel 102 according to an embodiment of the present disclosure may further include a bending region where the substrate 100 is bent. The bending region may be a region where the substrate 100 is bent. The substrate 100 may be maintained in a flat state in a region except the bending region. The data line DL may be disposed to pass through the bending region, and various data lines DL may be provided and connected to a data pad.

Figure 2:
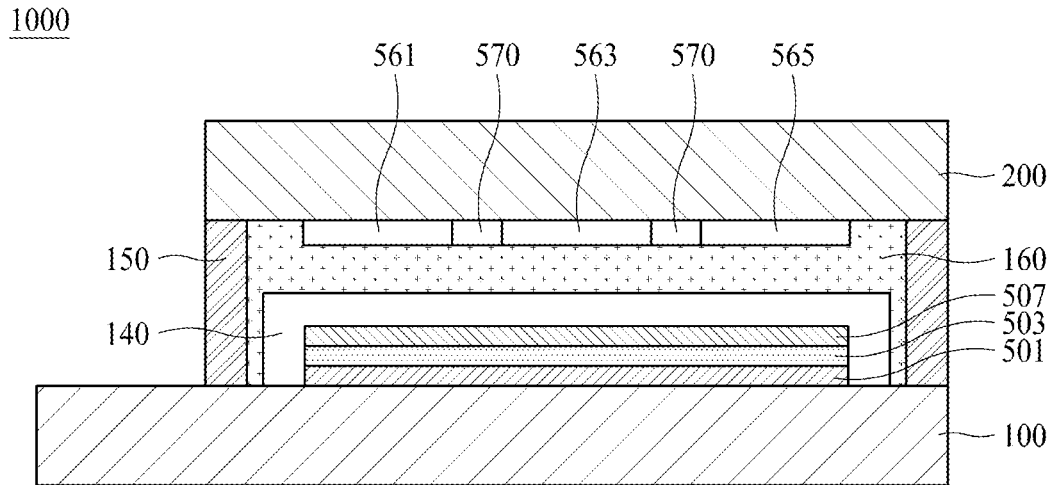
FIG. 2 illustrates a display apparatus according to an embodiment of the present disclosure.

FIG. 2 illustrates a display apparatus according to an embodiment of the present disclosure.

Referring to FIG. 2, the display apparatus 1000 according to an embodiment of the present disclosure may include a substrate 100 and a second substrate 200. The substrate 100 may be a first substrate.

A light emitting device may be disposed on the first substrate 100. For example, the light emitting device may include a first electrode 501, an emission layer 503, and a second electrode 505.

A protection layer 140 may be further provided at the light emitting device. For example, the protection layer 140 may cover the light emitting device. For example, the protection layer 140 may surround the light emitting device. The protection layer 140 may be a second protection layer, but embodiments of the present disclosure are not limited thereto.

The first substrate 100 and the second substrate 200 may be bonded to each other through a dam 150. An encapsulation layer 160 may be disposed inside the dam 150 so as to maintain a gap of the first substrate 100 and the second substrate 200 and/or prevent the penetration of water.

The display apparatus 1000 according to an embodiment of the present disclosure may further include a color filter. The color filter may include a red color filter 561, a green color filter 563, and a blue color filter 565. A light blocking layer 570 may be disposed between the red color filter 561 and the green color filter 563. The light blocking layer 570 may be disposed between the green color filter 563 and the blue color filter 565.

Figure 3:
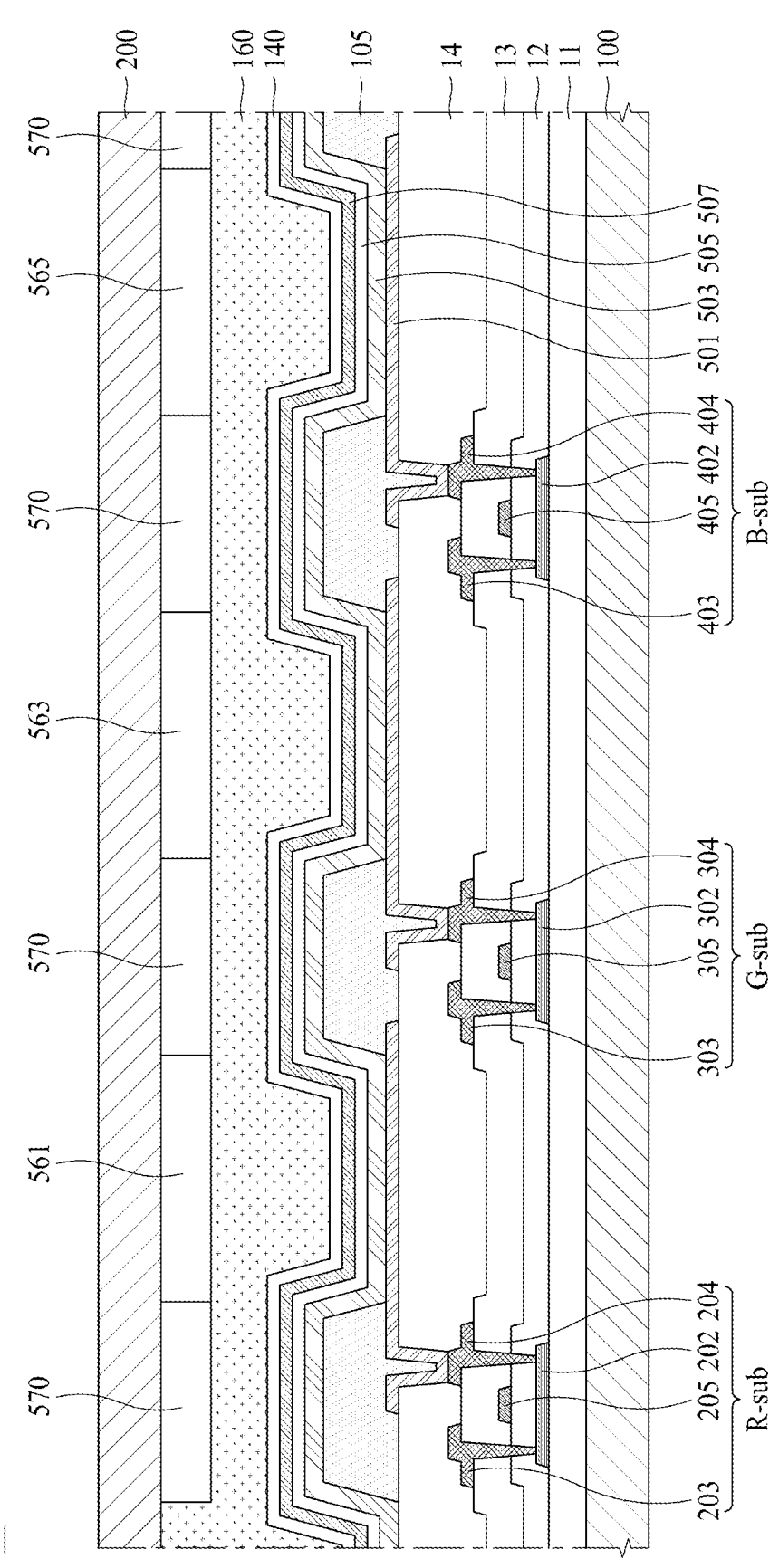
FIG. 3 is a cross-sectional view taken along line I-I' of FIG. 1 according to an embodiment of the present disclosure.

FIG. 3 is a cross-sectional view taken along line I-I' of FIG. 1 according to an embodiment of the present disclosure.

Referring to FIGS. 1 and 3, the display apparatus according to an embodiment of the present disclosure may include a display area AA and a non-display area NA. The non-display area NA may be disposed at a periphery of the display area AA. For example, the non-display area NA may surround the display area AA.

The substrate 100 may include a 1-1$^{st}$ substrate, a 1-2$^{nd}$ substrate, and a middle layer between the 1-1$^{st}$ substrate and the 1-2$^{nd}$ substrate, but embodiments of the present disclosure are not limited thereto.

For example, the 1-1$^{st}$ substrate and the 1-2$^{nd}$ substrate may be formed of at least one or more materials of polyimide, polyethersulfone, polyethylene terephthalate, and polycarbonate, but embodiments of the present disclosure are not limited thereto. When the substrate 100 includes a plastic material, a manufacturing process of the display apparatus may be performed in a state where a supporting substrate including glass is disposed under the substrate 100, and after the manufacturing process of the display apparatus is completed, the supporting substrate may be released. In addition, after the supporting substrate is released, a back plate (or a plate) for supporting the substrate 100 may be disposed under the substrate 100. When the substrate 100 includes a plastic material, water may penetrate into the substrate 100 and may penetrate up to a transistor part or a light emitting device layer of an emission part, causing a reduction in performance of the display apparatus. The display apparatus according to an embodiment of the present disclosure may be configured with two substrates such as the 1-1$^{st}$ substrate and the 1-2$^{nd}$ substrate including a plastic material so as to prevent the performance of the display apparatus from being reduced by the penetration of water. In addition, the middle layer which is an inorganic layer may be formed between the 1-1$^{st}$ substrate and the 1-2$^{nd}$ substrate, and thus, the penetration of water into the substrate may be prevented, thereby enhancing the reliability of the display apparatus. The middle layer may include an inorganic layer. For example, the middle layer may include a single layer, including silicon nitride (SiNx) or silicon oxide (SiOx), or a multilayer thereof, but embodiments of the present disclosure are not limited thereto. For example, the substrate may have a multilayer structure where a first polyimide film, an inorganic layer, and a second polyimide film are sequentially stacked.

The display apparatus 1000 disposed on the substrate 100 may include a plurality of areas. In the present disclosure, the display apparatus 1000 may include the display area AA and the non-display area NA, but embodiments of the present disclosure are not limited thereto.

A first buffer layer (or a buffer layer) may be disposed at one surface of the display area AA and the non-display area NA on the substrate 100. The first buffer layer may be provided as a buffer layer (or a first buffer layer) including a single layer including silicon nitride (SiNx) or silicon oxide (SiOx) or a multilayer thereof. The buffer layer may enhance an adhesive force between the substrate 100 and layers formed on the buffer layer and may prevent various kinds of defects such as an alkali component leaked from the substrate 100. The buffer layer may delay the diffusion of water or oxygen penetrating into the substrate 100. The buffer layer may be omitted based on the kind and material of a substrate and the structure and type of a TFT.

A plurality of transistor portions may be provided on the substrate 100 and/or the buffer layer and in the display area AA and the non-display area NA. The transistors of the display area AA may include a switching transistor or a driving transistor for driving of a subpixel PX. The transistor of the non-display area NA may include a transistor or an emission control transistor for driving of a gate driver, for example, a GIP.

Referring to FIG. 3, each pixel may be disposed on the substrate 100. Each pixel may include a red subpixel R-sub, a green subpixel G-sub, and a blue subpixel B-sub.

The red subpixel R-sub, the green subpixel G-sub, and the blue subpixel B-sub may include a transistor. Each of transistors may include semiconductor layers 202, 302, and 402, gate electrodes 205, 305, and 405, source electrodes 203, 303, and 403, and drain electrodes 204, 304, and 404, which are on the substrate 100 or a buffer insulation layer 11.

The buffer insulation layer 11 may be disposed on the substrate 100. For example, the buffer insulation layer 11 may be disposed at a front surface of the substrate 100. The buffer insulation layer 11 may prevent pollution caused by the substrate 100 occurring in a post-process. The buffer insulation layer 11 may include an insulating material. For example, the buffer insulation layer 11 may include a SiOx-based material and/or a SiNx-based material, but embodiments of the present disclosure are not limited thereto. For example, the SiOx-based material may include silicon dioxide (SiO$_2$), but embodiments of the present disclosure are not limited thereto. For example, the buffer layer 11 may have a multilayer structure.

The semiconductor layers 202, 302, and 402, the gate electrodes 205, 305, and 405, the source electrodes 203, 303, and 403, and the drain electrodes 204, 304, and 404 of each of the red subpixel R-sub, the green subpixel G-sub, and the blue subpixel B-sub may be configured on the buffer insulation layer 11.

The semiconductor layers 202, 302, and 402 may include metal oxide or low temperature poly-silicon (LTPS) including polycrystalline silicon. For example, the metal oxide may be configured as one or more of indium-gallium-zinc-oxide (IGZO), indium-zinc-oxide (IZO), indium-gallium-tin-oxide (IGTO), and indium-gallium-oxide (IGO), but embodiments of the present disclosure are not limited thereto.

According to an embodiment of the present disclosure, the semiconductor layers 202, 302, and 402 may include a source region, a drain region, and a channel region. The source region and the drain region may have conductivity and may be connected to the source electrodes 203, 303, and 403 and the drain electrodes 204, 304, and 404. For example, an LPTS semiconductor layer may include a channel region and a source region or a drain region connected to a source electrode or a drain electrode through electron injection doping. The metal oxide may be enhanced in conductive characteristic, based on a doping process of injecting impurities, and may include a channel region where a channel for moving of an electron or a hole is formed.

A first insulation layer 12 may be disposed on the semiconductor layers 202, 302, and 402. The first insulation layer 12 may be disposed between the semiconductor layers 202, 302, and 402 and the gate electrodes 205, 305, and 405, and thus, may insulate the semiconductor layers 202, 302, and 402 from the gate electrodes 205, 305, and 405. For example, the gate electrodes 205, 305, and 405 may be insulated from the semiconductor layers 202, 302, and 402 by the first insulation layer 12. For example, the first insulation layer 12 may extend to outer side of the semiconductor layers 202, 302, and 402. For example, lateral surfaces of the semiconductor layers 202, 302, and 402 and an upper portion, where the semiconductor layers 202, 302, and 402 are not provided, of the buffer insulation layer 11 may be covered by the first insulation layer 12. The first insulation layer 12 may be a gate insulation layer, but embodiments of the present disclosure are not limited thereto.

The first insulation layer 12 may include an insulating material. For example, the first insulation layer 12 may include a SiOx-based material and/or a SiNx-based material, but embodiments of the present disclosure are not limited thereto. As another example, the first insulation layer 12 may include a material having a high dielectric constant. As another example, the first insulation layer 12 may include an insulating organic material or the like.

The gate electrodes 205, 305, and 405 may be disposed on the first insulation layer 12. For example, the gate electrodes 205, 305, and 405 may be disposed to overlap the semiconductor layers 202, 302, and 402. For example, the gate electrodes 205, 305, and 405 may overlap channel regions of the semiconductor layers 202, 302, and 402.

The gate electrodes 205, 305, and 405 may include a conductive material. The gate electrodes 205, 305, and 405 may include a hydrogen barrier material. For example, the hydrogen barrier material may include a hydrogen storing material and/or a hydrogen blocking material. For example, the gate electrodes 205, 305, and 405 may include titanium (Ti) or tantalum (Ta), but embodiments of the present disclosure are not limited thereto. As another example, the gate electrodes 205, 305, and 405 may include a metal material having a low resistance. For example, the gate electrodes 205, 305, and 405 may be formed of a single layer or a multilayer which includes one of silver (Ag), molybdenum (Mo), copper (Cu), titanium (Ti), aluminum (Al), chromium (Cr), gold (Au), nickel (Ni), neodymium (Nd), and tungsten (W), or an alloy thereof, but embodiments of the present disclosure are not limited thereto.

A second insulation layer 13 may be disposed on the gate electrodes 205, 305, and 405. The second insulation layer 13 may be an interlayer insulation layer, but embodiments of the present disclosure are not limited thereto.

The second insulation layer 13 may be disposed on the first insulation layer 12 and the gate electrodes 205, 305, and 405. The second insulation layer 13 may include an insulating material. For example, the second insulation layer 13 may include a SiOx-based material and/or a SiNx-based material, but embodiments of the present disclosure are not limited thereto. For example, the SiOx-based material may include silicon dioxide ($SiO_2$), but embodiments of the present disclosure are not limited thereto. As another example, the second insulation layer 13 may be formed of an insulating organic material or the like. As another example, the second insulation layer 13 may configured in a multiple layer.

The source electrodes 203, 303, and 403 and the drain electrodes 204, 304, and 404 may be disposed on the second insulation layer 13. The source electrodes 203, 303, and 403 and the drain electrodes 204, 304, and 404 may be electrically connected to the source regions and drain regions of the semiconductor layers 202, 302, and 402. The source electrodes 203, 303, and 403 and the drain electrodes 204, 304, and 404 may be formed of a single layer or a multilayer which includes one of silver (Ag), molybdenum (Mo), copper (Cu), titanium (Ti), aluminum (Al), chromium (Cr), gold (Au), nickel (Ni), neodymium (Nd), and tungsten (W), or an alloy thereof, but embodiments of the present disclosure are not limited thereto. As another example, the source electrodes 203, 303, and 403 and the drain electrodes 204, 304, and 404 may each be formed of two or more layers including a first layer including Ti and a second layer including at least one or more of Mo, Cu, Al, Ag, Cr, Au, Nd, and Ni, but embodiments of the present disclosure are not limited thereto.

A first protection layer 14 may be disposed on the second insulation layer 13. For example, the first protection layer 14 may be disposed on the source electrodes 203, 303, and 403 and the drain electrodes 204, 304, and 404. The first protection layer 14 may include an insulating material. The first protection layer 14 may include a material which differs from the second insulation layer 13. The first protection layer 14 may include a material which is relatively high in mobility. For example, the first protection layer 14 may include an organic insulating material. For example, the first protection layer 14 may include an inorganic insulation layer such as SiNx or SiOx or an organic insulation layer such as polyacrylate or polyimide, or the like, but embodiments of the present disclosure are not limited thereto. The first protection layer 14 may be a first planarization layer, but embodiments of the present disclosure are not limited thereto.

A first electrode 510 may be disposed on the first protection layer 14. The first electrode 501 may include a transparent conductive material. For example, the first electrode 501 may include at least one or more of Ag, Al, Au, Mo, W, Cr, lead (Pd), indium tin oxide (ITO), indium zinc oxide (IZO), and an alloy thereof, but embodiments of the present disclosure are not limited thereto. For example, the first electrode 501 may have a three-layer structure of ITO/Ag/ITO or ITO/APC (aluminum-palladium-copper)/ITO. As another example, the first electrode 501 may include a multilayer or an alloy including Ag, manganese (Mn), and ytterbium (Yb), but embodiments of the present disclosure are not limited thereto. For example, the first electrode 501 may be an anode electrode, but embodiments of the present disclosure are not limited thereto.

According to an embodiment of the present disclosure, the first electrode 501 may be configured for each subpixel. For example, the first electrode 501 may be configured for each of a first subpixel, a second subpixel, and a third subpixel. For example, the first subpixel may be a red subpixel R-sub, the second subpixel may be a green subpixel G-sub. For example, the third subpixel may be a blue subpixel B-sub, but embodiments of the present disclosure are not limited thereto.

The first electrode 501 may be connected to each of the drain electrodes 204, 304, and 404 of transistors of the red subpixel R-sub, the green subpixel G-sub, and the blue subpixel B-sub and may be disposed at an emission region. For example, the second insulation layer 13 and the first protection layer 14 may include a contact hole which partially exposes the drain electrodes 204, 304, and 404 of the transistors of the red subpixel R-sub, the green subpixel G-sub, and the blue subpixel B-sub. The first electrode 501 may be connected to the drain electrodes 204, 304, and 404 through the contact hole of the first insulation layer 12 and the second insulation layer 13. As another example, the first electrode 501 may be connected to the source electrodes 203, 303, and 403 through the contact hole. The first electrode 501 may include a region overlapping the drain electrodes 204, 304, and 404. Accordingly, a driving current generated by the transistor may be supplied to the first electrode 501.

A bank 105 may be disposed at a portion, except the emission region, of each of the red subpixel R-sub, the green subpixel G-sub, and the blue subpixel B-sub, on the first electrode 501. The bank 105 may be disposed on a portion of the first electrode 501. The bank 105 may divide a plurality of subpixels, reduce or minimize the spread of light, and prevent the occurrence of color mixture in various viewing angles. The bank 105 may expose the first electrode 501 corresponding to the emission region and may overlap an end portion of the first electrode 501. The bank 105 may overlap a hole which is formed at the second insulation layer 13 and the first protection layer 14.

The bank 105 may overlap an end (or one side) of the first electrode 501. For example, the bank 105 may overlap each of the transistors of the red subpixel R-sub, the green subpixel G-sub, and the blue subpixel B-sub.

For example, the bank 105 may include at least one or more materials of inorganic insulating materials such as SiNx and SiOx, or organic insulating materials such as benzocyclobutene (BCB), acrylic-based resin, epoxy-based resin, phenolic-based resin, polyamide-based resin, and polyimide-based resin, but embodiments of the present disclosure are not limited thereto. As another example, the bank 105 may include a black bank to which a black pigment is added, so as to reduce the reflection of light, but embodiments of the present disclosure are not limited thereto.

A spacer may be further disposed on the bank 105. The spacer may buffer an empty space between an upper substrate and the substrate 100 where a light emitting device or a light emitting device layer 503 is provided, and thus, may reduce or minimize the damage of the display apparatus 1000 caused by an external impact. The spacer may include the same material as the bank 105 and may be formed simultaneously with the bank 105, but embodiments of the present disclosure are not limited thereto.

The light emitting device layer 503 may be disposed on an opening portion of the bank 105 exposing the first electrode 501. The light emitting device layer 503 may include one or more of a red emission layer, a green emission layer, a blue emission layer, and a white emission layer, so as to emit light of specific color, but embodiments of the present disclosure are not limited thereto.

When the light emitting device layer 503 includes a white organic emission layer, the light emitting device layer 503 may be disposed all over the substrate 100 and the opening portion of the bank 105.

The second electrode 505 may be disposed on the light emitting device layer 503. The second electrode 505 may supply an electron to the light emitting device layer 503. For example, the second electrode 505 may include a conductive material having a low work function, but embodiments of the present disclosure are not limited thereto. For example, the second electrode 505 may be a cathode electrode, but embodiments of the present disclosure are not limited thereto.

When the display apparatus 1000 has a top emission type, the second electrode 505 may be disposed using a transparent conductive material which transmits light. For example, the second electrode 505 may be formed of at least one or more of indium tin oxide (ITO) and indium zinc oxide (IZO), but embodiments of the present disclosure are not limited thereto.

For example, the second electrode 505 may include a semitransparent conductive material which transmits light. For example, the second electrode 505 may be configured to include at least one or more of alloys such as LiF/Al, CsF/Al, Mg:Ag, Ca/Ag, Ca:Ag, LiF/Mg:Ag, LiF/Ca/Ag, Mg:Ag/Yb/LiF, Ag:Yb, and LiF/Ca:Ag, but embodiments of the present disclosure are not limited thereto.

When the display apparatus 1000 has a bottom emission type, the second electrode 505 may be a reflection electrode reflecting light and may be disposed using an opaque conductive material. For example, the second electrode 505 may include at least one or more of Ag, Al, Au, Mo, W, Cr, and an alloy thereof, but embodiments of the present disclosure are not limited thereto.

The light emitting device layer 503 may further include a plurality of functional layers, in addition to the emission layer, but embodiments of the present disclosure are not limited thereto. For example, the light emitting device layer 503 may further include a first functional layer (or a hole-related layer) and a second functional layer (or an electron-related layer).

According to an embodiment of the present disclosure, the light emitting device layer 503 may be formed by stacking a first functional layer, an emission layer, and a second functional layer in order or in reverse order thereof on the first electrode 501. For example, the first functional layer may be a layer which injects a hole or transfers a hole into the emission layer. The first functional layer may be a hole injection layer, a hole transport layer, and an electron blocking layer, but embodiments of the present disclosure are not limited thereto. The second functional layer may be a layer which injects an electron or transfers an electron into the emission layer. The second functional layer may be an electron injection layer, an electron transport layer, and a hole blocking layer, but embodiments of the present disclosure are not limited thereto.

The light emitting device layer 503 may include one emission part. The one emission part may include a red emission layer, a green emission layer, and a blue emission layer which respectively emit red light, green light, and blue light, for each subpixel PX.

The light emitting device layer 503 may include two or more emission parts. An emission part may be referred to as a stack, but the terms are not limited thereto. The two or more emission parts may include a first emission part and a second emission part. The first emission part and the second emission part may each include a red emission layer, a green emission layer, and a blue emission layer which respectively emit red light, green light, and blue light, for each subpixel PX. Two or more emission layers included in the first emission part and the second emission part may be emission layers which emit lights having the same color. As another example, a first emission layer included in the first emission part may be a blue emission layer, a sky blue emission layer, a dark blue emission layer, a combination of a blue emission layer and a red emission layer, a combination of a sky blue emission layer and a red emission layer, or a combination of a dark blue emission layer and a red emission layer, but embodiments of the present disclosure are not limited thereto. For example, a second emission layer included in the second emission part may be a yellow emission layer, a yellow-green emission layer, a green emission layer, a combination of a yellow emission layer and a red emission layer, a combination of a yellow-green emission layer and a red emission layer, a combination of a green emission layer and a red emission layer, a combination of a yellow emission layer, a yellow-green emission layer, and a green emission layer, a combination of a yellow emission layer, a yellow-green emission layer, a green emission layer, and a red emission layer, a combination of two yellow-green emission layers and one green emission layer, a combination of one yellow-green emission layer and two green emission layers, a combination of two yellow-green emission layers, one green emission layer, and a red emission layer, or a combination of one yellow-green emission layer, two green emission layers, and a red emission layer, but embodiments of the present disclosure are not limited thereto. A charge generating layer may be provided between the first emission part and the second emission part. The charge generating layer may include an N-type charge generating layer and a P-type charge generating layer. Each of the first emission part and the second emission part may include one or more of a hole injection layer, a hole transport layer, a hole blocking layer, an electron blocking layer, an electron transport layer, and an electron injection layer, but embodiments of the present disclosure are not limited thereto.

The two or more emission parts may include a first emission part, a second emission part, and a third emission part. A first emission layer included in the first emission part may be as described above. A second emission layer included in the second emission part may be as described above. A third emission layer included in the third emission part may be configured to be equal to the first emission layer, but embodiments of the present disclosure are not limited thereto. A first charge generating layer may be provided between the first emission part and the second emission part. The first charge generating layer may include an N-type charge generating layer and a P-type charge generating layer. A second charge generating layer may be provided between the second emission part and the third emission part. The second charge generating layer may include an N-type charge generating layer and a P-type charge generating layer. Each of the first emission part, the second emission part, and the third emission part may include one or more of a hole injection layer, a hole transport layer, a hole blocking layer, an electron blocking layer, an electron transport layer, and an electron injection layer, but embodiments of the present disclosure are not limited thereto.

The two or more emission parts may include a first emission part, a second emission part, a third emission part, and a fourth emission part. Emission layers of two or more of the first emission part, the second emission part, the third emission part, and the fourth emission part may be configured as emission layers which emit lights having the same color. For example, emission layers of two or more of the first emission part, the second emission part, the third emission part, and the fourth emission part may be configured as blue emission layers, but embodiments of the present disclosure are not limited thereto. Emission layers of at least one or more of the first emission part, the second emission part, the third emission part, and the fourth emission part may include a blue emission layer and another emission layer. For example, emission layers of at least one or more of the first emission part, the second emission part, the third emission part, and the fourth emission part may be a yellow emission layer, a yellow-green emission layer, a green emission layer, a combination of a yellow emission layer and a red emission layer, a combination of a yellow-green emission layer and a red emission layer, a combination of a green emission layer and a red emission layer, a combination of a yellow emission layer, a yellow-green emission layer, and a green emission layer, a combination of a yellow emission layer, a yellow-green emission layer, a green emission layer, and a red emission layer, a combination of two yellow-green emission layers and one green emission layer, a combination of one yellow-green emission layer and two green emission layers, a combination of two yellow-green emission layers, one green emission layer, and a red emission layer, a combination of one yellow-green emission layer, two green emission layers, and a red emission layer, but embodiments of the present disclosure are not limited thereto. A first charge generating layer may be provided between the first emission part and the second emission part. The first charge generating layer may include an N-type charge generating layer and a P-type charge generating layer. A second charge generating layer may be provided between the second emission part and the third emission part. The second charge generating layer may include an N-type charge generating layer and a P-type charge generating layer. A third charge generating layer may be provided between the third emission part and the fourth emission part. The third charge generating layer may include an N-type charge generating layer and a P-type charge generating layer. Each of the first emission part, the second emission part, the third emission part, and the fourth emission part may include one or more of a hole injection layer, a hole transport layer, a hole blocking layer, an electron blocking layer, an electron transport layer, and an electron injection layer, but embodiments of the present disclosure are not limited thereto.

The non-display area NA of the display apparatus 1000 may include an end portion including a dam part where a driving circuit unit and a plurality of dams are provided. The end portion of the non-display area NA may be a region where the display apparatus 1000 is sealed by the plurality of dams, an encapsulation layer, and a connection part electrically connected to the second electrode 505 and an EVSS line. The first insulation layer 12, the second insulation layer 13, and the first protection layer 14 disposed on the substrate 100 may extend and may be disposed at the end portion.

Lines may be disposed at the end portion of the non-display area NA so that a source voltage and touch signals applied from a flexible printed circuit board (FPCB) of the display apparatus 1000 are supplied through the lines.

The plurality of dams may be disposed at the end portion of the non-display area NA. The plurality of dams may include two or more dams, but the number of dams is not limited thereto. Each of the plurality of dams may surround the display area AA.

The second protection layer 140 may be disposed on the second electrode 505. The second protection layer 140 may protect the light emitting device layer 503. The second protection layer 140 may prevent the light emitting device layer 503 from being degraded when external water or oxygen penetrates into the light emitting device layer 503. For example, the second protection layer 140 may be formed of a single layer or a multilayer. For example, the second protection layer 140 may have a structure where an inorganic layer including an inorganic insulating material and an organic layer including an organic material are stacked, but embodiments of the present disclosure are not limited thereto.

A capping layer 507 may be further provided on the second electrode 505. The capping layer 507 may be disposed between the second electrode 505 and the second protection layer 140. The capping layer 507 may be disposed as one layer on the second electrode 505 without being patterned for each subpixel, like the second electrode 505. The capping layer 507 may enhance an optical characteristic of the light emitting device layer 503 to improve light efficiency and a viewing angle. For example, the capping layer 507 may protect the second electrode 505 so as not to be degraded. For example, the capping layer 507 may include an organic layer or an inorganic layer. For example, the capping layer 507 may be an inorganic layer and may include a metal material such as lithium fluoride (LiF), and moreover, may further include an organic layer, but embodiments of the present disclosure are not limited thereto.

An encapsulation layer 160 may be disposed on the light emitting device layer 503. For example, the encapsulation layer 160 may be disposed on the second electrode 505 and the capping layer 507. The encapsulation layer 160 may protect the display apparatus 1000 from external water, oxygen, or particles. For example, the encapsulation layer 160 may prevent the penetration of external oxygen and water, and thus, may prevent the oxidation of a light emitting material and an electrode material.

The encapsulation layer 160 may include a transparent material so that light emitted from the light emitting device layer 503 passes through the encapsulation layer 160.

The encapsulation layer 160 may include at least one or more of a first encapsulation layer, a second encapsulation layer, and a third encapsulation layer, but embodiments of the present disclosure are not limited thereto. The first encapsulation layer, the second encapsulation layer, and the third encapsulation layer may have a structure where the first to third encapsulation layers are sequentially stacked, but embodiments of the present disclosure are not limited thereto.

The first encapsulation layer and the third encapsulation layer may include at least one or more materials of SiNx, SiOx, and oxide aluminum (AlyOz), but embodiments of the present disclosure are not limited thereto.

The second encapsulation layer may cover particles or foreign materials occurring in a manufacturing process. The second encapsulation layer may planarize a surface of the first encapsulation layer.

The second encapsulation layer may include an organic material, for example, a polymer such as silicon oxycarbon (SiOCz) epoxy, polyimide, polyethylene, or an acrylate-based, but embodiments of the present disclosure are not limited thereto.

A touch part for a touch operation of the display apparatus 1000 may be disposed on the encapsulation layer 160.

A buffer layer (or a touch buffer layer or a second buffer layer) may be disposed on the encapsulation layer 160. The buffer layer may extend up to a region where the FPCB disposed at the non-display area NA and the connection part of the substrate 100 are disposed. The buffer layer may be formed of a single layer or a multilayer, which includes SiNx or SiOx, but embodiments of the present disclosure are not limited thereto.

A bridge electrode may be disposed on the buffer layer. The bridge electrode may electrically connect touch electrodes with one another and may transfer a touch signal. The bridge electrode may be formed of a single layer or a multilayer which includes one of Ag, Mo, Cu, Ti, Al, Cr, Au, Ni, Nd, and W, or an alloy thereof, but embodiments of the present disclosure are not limited thereto.

An insulation layer may be disposed on the bridge electrode. The touch electrodes spaced apart from one another on the insulation layer may be connected to the bridge electrode through a contact hole formed in the insulation layer. For example, the insulation layer may be formed of a single layer or a multilayer, which includes SiNx or SiOx, but embodiments of the present disclosure are not limited thereto.

The touch electrode may be disposed on the insulation layer. The touch electrode may be connected to a plurality of touch lines disposed within the non-display area NA and may be connected to a touch circuit of the FPCB.

The touch circuit may supply a touch driving signal to the touch electrode so as to drive a touch operation, detect a touch sensing signal from the touch electrode, and sense whether there is a touch and/or a touch position (coordinates), based on the detected touch sensing signal.

The touch electrode may be formed of a single layer or a multilayer which includes one of Ag, Mo, Cu, Ti, Al, Cr, Au, Ni, Nd, and W, or an alloy thereof, but embodiments of the present disclosure are not limited thereto. For example, the touch electrode and the bridge electrode may be disposed at positions corresponding to the bank 105 and the spacer.

At least one or more protection layers may be disposed on the touch electrode. The at least one or more protection layers may extend up to a region where the FPCB disposed at the non-display area NA and the connection part of the substrate 100 are disposed. The at least one or more protection layers may include at least one or more materials of inorganic insulating materials such as SiNx and SiOx and organic insulating materials such as benzocyclobutene (BCB), acrylic-based resin, epoxy-based resin, phenolic-based resin, polyamide-based resin, and polyimide-based resin, but embodiments of the present disclosure are not limited thereto.

The color filter and the light blocking layer 570 may be disposed on the encapsulation layer 160. For example, the color filters 561, 563, and 565 and the light blocking layer 570 may be disposed to correspond to a subpixel.

The color filter may include a red color filter 561 provided at the red subpixel R-sub, a green color filter 563 provided at the green subpixel G-sub, and a blue color filter 565 provided at the blue subpixel B-sub. The light blocking layer 570 may be disposed between the red color filter 561 and the green color filter 563. The light blocking layer 570 may be disposed between the green color filter 563 and the blue color filter 565. The light blocking layer 570 may be disposed between the red color filter 561 and the blue color filter 565.

When the display apparatus according to an embodiment of the present disclosure has the top emission type, as illustrated, the color filter and the light blocking layer 570 may be disposed on the encapsulation layer 160. As another example, when the display apparatus according to an embodiment of the present disclosure has the bottom emission type, the color filter and the light blocking layer 570 may be disposed under the light emitting device layer 503, for example, between the first protection layer 14 and the second insulation layer 13, but embodiments of the present disclosure are not limited thereto.

A protection layer 200 (or a first protection layer or a protection member) may be disposed on the color filter and the light blocking layer 570. The protection layer 200 may protect internal elements from an external impact. The protection layer 200 may be a second substrate, but embodiments of the present disclosure are not limited thereto.

FIG. 4 illustrates a display apparatus according to an embodiment of the present disclosure.

Referring to FIG. 4, the display apparatus according to an embodiment of the present disclosure may include a plurality of subpixels. A substrate may include the plurality of subpixels. The plurality of subpixels may include a first subpixel, a second subpixel, and a third subpixel, but embodiments of the present disclosure are not limited thereto. For example, the first subpixel may be a red subpixel R-sub, the second subpixel may be a green subpixel G-sub, and the third subpixel may be a blue subpixel B-sub, but embodiments of the present disclosure are not limited thereto.

The plurality of subpixels may further include a fourth subpixel. For example, the plurality of subpixels may include a first subpixel, a second subpixel, a third subpixel, and a fourth subpixel, but embodiments of the present disclosure are not limited thereto. For example, the first subpixel may be a red subpixel R-sub, the second subpixel may be a green subpixel G-sub, the third subpixel may be a blue subpixel B-sub, and the fourth subpixel may be a white subpixel W-sub, but embodiments of the present disclosure are not limited thereto. Hereinafter, an example will be described where the first subpixel is the red subpixel R-sub, the second subpixel is the green subpixel G-sub, the third subpixel is the blue subpixel B-sub, and the fourth subpixel is the white subpixel W-sub.

According to an embodiment of the present disclosure, each of the plurality of subpixels may include at least one or more emission parts. For example, the red subpixel R-sub, the green subpixel G-sub, the blue subpixel B-sub, and the white subpixel W-sub may each include at least one or more emission parts. For example, the at least one or more emission parts may be disposed on a first electrode 501. For example, the at least one or more emission parts may be disposed between the first electrode 501 and the second electrode 505. For example, the at least one or more emission parts may include three emission parts, but embodiments of the present disclosure are not limited thereto. For example, the at least one or more emission parts may include a first emission part 1100, a second emission part 1200, and a third emission part 1300.

The red subpixel R-sub, the green subpixel G-sub, the blue subpixel B-sub, and the white subpixel W-sub according to an embodiment of the present disclosure may include the first emission part 1100. The first emission part 1100 may include a first hole functional layer, a first emission layer, and a first electron functional layer, but embodiments of the present disclosure are not limited thereto. For example, the first hole functional layer may include a hole injection layer, a hole transport layer, and an electron blocking layer, but embodiments of the present disclosure are not limited thereto. For example, a first electron functional layer may include an electron injection layer, an electron transport layer, and a hole blocking layer, but embodiments of the present disclosure are not limited thereto. For example, the first emission part 1100 may include a hole injection layer 611, a first hole transport layer 612, a first emission layer 629, and a first electron transport layer 631, but embodiments of the present disclosure are not limited thereto.

According to an embodiment of the present disclosure, the first hole functional layer may be formed on the first electrode 501. The first hole functional layer may include the hole injection layer 611 and the first hole transport layer 612. According to an embodiment of the present disclosure, the hole injection layer 611 may be formed by a solution process. For example, the hole injection layer 611 may be formed by a solution process such as an inkjet process or a nozzle printing process, but embodiments of the present disclosure are not limited thereto.

The bank 105 may include a hydrophobic organic material or inorganic material. For example, the bank 105 may include an organic insulating material or an inorganic insulating material, and hydrophobic surface processing may be performed on a surface of the bank 105. For example, a mixed gas of an argon (Ar) gas and a fluoride gas such as $CF_4$ or $C_2F_6$ may be converted into plasma, and then, plasma processing may be performed on the surface of the bank 105 by using the plasma to increase a contact angle of the bank 105, thereby allowing the surface of the bank 105 to have hydrophobicity. As another example, for the bank 105, an additive such as a hydrophobic polymer may be added to an organic insulating material for forming a bank, and thus, the surface of the bank 105 may have hydrophobicity.

In a case where the bank 105 is formed of a hydrophobic material, a solution process on the hole injection layer 611 may be easily performed. For example, based on an upper portion of the bank 105 having hydrophobic properties, a problem may be minimized or solved where a solution for forming the hole injection layer 611 spreads to regions between subpixels R-sub, G-sub, B-sub, and W-sub adjacent to one another. For example, the hole injection layer 611 may enhance an interface characteristic between the first electrode 501 and the first emission layer 629, and thus, a hole supplied from the first electrode 501 may be easily injected into the first emission layer 629. The hole injection layer 611 may be formed to be divided for each of a plurality of subpixels, based on the first electrode 501.

The hole injection layer 611 may include an organic material including fluoride. For example, the hole injection layer 611 may include an organic material where a functional group or some atoms of a polymer is substituted into fluoride or a functional group including fluoride. For example, the hole injection layer 611 may include a material where a functional group or some atoms of a polymer such as polyimide, styrene, or methyl methacrylate or the like is substituted into fluoride or a functional group including fluoride, but embodiments of the present disclosure are not limited thereto. As another example, the hole injection layer 611 may include a fluoride-based polymer such as polytetrafluoroethylene, but embodiments of the present disclosure are not limited thereto.

The hole injection layer 611 may have a cross-sectional profile including a plurality of curved surfaces. For example, when the hole transport layer 612 is deposited on the hole injection layer 611 having the cross-sectional profile, the hole transport layer 612 may be conformally formed along the surface of the hole injection layer 611. For example, a surface shape of the hole injection layer 612 may be based on a surface shape of the surface of the hole injection layer 611. For example, the hole injection layer 611 may have a shape conforming to the surface shape of the hole injection layer 611.

When a light emitting material is deposited on the hole transport layer 612, the light emitting material may be conformally formed along the surface of the hole injection layer 611. For example, the first emission layer 629 formed by a deposition process on the hole injection layer 611 may be formed along a cross-sectional profile of the hole injection layer 611, in an emission region. For example, a surface shape of the first emission layer 629 may be based on a surface shape of the hole injection layer 611. Therefore, a thickness of the first emission layer 629 may be constant, but a total thickness of layers between the first electrode 501 and the second electrode 505 may not be constant. Based on a change in thickness of the layers between the first electrode 501 and the second electrode 505, a multi-cavity effect may be obtained, and thus, the luminance and/or efficiency of the display apparatus 1 may be enhanced. For example, the layers between the first electrode 501 and the second electrode 505 may have different thicknesses for each subpixel, and as the thicknesses of the layers between the first electrode 501 and the second electrode 505 are changed for each subpixel, different cavity characteristics may be obtained for each subpixel. Accordingly, a display apparatus may be provided where efficiency is improved and a current is reduced for each subpixel. A cross-sectional profile(s) of the hole injection layer 611 and/or the emission layer will be described below with reference to FIGS. 7A to 8B.

According to an embodiment of the present disclosure, the first hole functional layer may be at the red subpixel R-sub, the green subpixel G-sub, and the blue subpixel B-sub. For example, the first hole functional layer may be at the red subpixel R-sub, the green subpixel G-sub, and the blue subpixel B-sub, and the white subpixel W-sub. A thickness of the first hole functional layer may be different for each subpixel. Because a thickness of the first hole functional layer is differently set, an optimal cavity for each color may be implemented, and charge balance optimized for each color may be implemented. For example, because a thickness of the first hole functional layer is differently set, an optimal cavity for each subpixel may be implemented, and charge balance optimized for each subpixel may be implemented. For example, a thickness of the first hole functional layer of the red subpixel R-sub may be different from a thickness of the first hole functional layer of the blue subpixel B-sub. For example, a thickness of the first hole functional layer of the red subpixel R-sub may be greater than a thickness of the first hole functional layer of the blue subpixel B-sub. For example, a thickness of the hole injection layer 611 of the red subpixel R-sub may be different from a thickness of the hole injection layer 611 of the blue subpixel B-sub. For example, a thickness of the hole injection layer 611 of the red subpixel R-sub may be greater than a thickness of the hole injection layer 611 of the blue subpixel B-sub. For example, a thickness of the hole injection layer 611 of the red subpixel R-sub may be 70 nm to 90 nm, but embodiments of the present disclosure are not limited thereto. For example, a thickness of the hole injection layer 611 of the blue subpixel B-sub may be 30 nm to 50 nm, but embodiments of the present disclosure are not limited thereto.

According to an embodiment of the present disclosure, a thickness of the first hole functional layer of the red subpixel R-sub may be different from a thickness of the first hole functional layer of the green subpixel G-sub. For example, a thickness of the first hole functional layer of the red subpixel R-sub may be greater than a thickness of the first hole functional layer of the green subpixel G-sub. For example, a thickness of the hole injection layer 611 of the red subpixel R-sub may be different from a thickness of the hole injection layer 611 of the green subpixel G-sub. For example, a thickness of the hole injection layer 611 of the red subpixel R-sub may be greater than a thickness of the hole injection layer 611 of the green subpixel G-sub. For example, a thickness of the hole injection layer 611 of the red subpixel R-sub may be 70 nm to 90 nm, but embodiments of the present disclosure are not limited thereto. For example, a thickness of the hole injection layer 611 of the green subpixel G-sub may be 10 nm to 20 nm, but embodiments of the present disclosure are not limited thereto.

According to an embodiment of the present disclosure, a thickness of the first hole functional layer of the red subpixel R-sub may be different from a thickness of the first hole functional layer of the white subpixel W-sub. For example, a thickness of the first hole functional layer of the red subpixel R-sub may be greater than a thickness of the first hole functional layer of the white subpixel W-sub. For example, a thickness of the hole injection layer 611 of the red subpixel R-sub may be different from a thickness of the hole injection layer 611 of the white subpixel W-sub. For example, a thickness of the hole injection layer 611 of the red subpixel R-sub may be greater than a thickness of the hole injection layer 611 of the white subpixel W-sub. For example, a thickness of the hole injection layer 611 of the red subpixel R-sub may be 70 nm to 90 nm, but embodiments of the present disclosure are not limited thereto. For example, a thickness of the hole injection layer 611 of the white subpixel W-sub may be 20 nm to 45 nm, but embodiments of the present disclosure are not limited thereto.

According to an embodiment of the present disclosure, a thickness of the first hole functional layer of the red subpixel R-sub may be different from a thickness of the first hole functional layer of the blue subpixel B-sub and a thickness of the first hole functional layer of the green subpixel G-sub. For example, a thickness of the first hole functional layer of the red subpixel R-sub may be greater than a thickness of the first hole functional layer of the blue subpixel B-sub and a thickness of the first hole functional layer of the green subpixel G-sub. For example, a thickness of the hole injection layer 611 of the red subpixel R-sub may be different from a thickness of the hole injection layer 611 of the blue subpixel B-sub and a thickness of the hole injection layer 611 of the green subpixel G-sub. For example, a thickness of the hole injection layer 611 of the red subpixel R-sub may be greater than a thickness of the hole injection layer 611 of the blue subpixel B-sub and a thickness of the hole injection layer 611 of the green subpixel G-sub. For example, a thickness of the hole injection layer 611 of the red subpixel R-sub may be greater than a thickness of the hole injection layer 611 of the blue subpixel B-sub, and a thickness of the hole injection layer 611 of the blue subpixel B-sub may be greater than a thickness of the hole injection layer 611 of the green subpixel G-sub. For example, a thickness of the hole injection layer 611 of the red subpixel R-sub may be 70 nm to 90 nm, but embodiments of the present disclosure are not limited thereto. For example, a thickness of the hole injection layer 611 of the blue subpixel B-sub may be 30 nm to 50 nm, but embodiments of the present disclosure are not limited thereto. For example, a thickness of the hole injection layer 611 of the green subpixel G-sub may be 10 nm to 20 nm, but embodiments of the present disclosure are not limited thereto.

According to an embodiment of the present disclosure, a thickness of the first hole functional layer of the red subpixel R-sub may be different from a thickness of the first hole functional layer of the blue subpixel B-sub, a thickness of the first hole functional layer of the white subpixel W-sub, and a thickness of the first hole functional layer of the green subpixel G-sub. For example, a thickness of the hole functional layer of the red subpixel R-sub may be greater than a thickness of the first hole functional layer of the blue subpixel B-sub, a thickness of the first hole functional layer of the white subpixel W-sub, and a thickness of the first hole functional layer of the green subpixel G-sub. For example, a thickness of the hole injection layer 611 of the red subpixel R-sub may be different from a thickness of the hole injection layer 611 of the blue subpixel B-sub, a thickness of the hole injection layer 611 of the white subpixel W-sub, and a thickness of the hole injection layer 611 of the green subpixel G-sub. For example, a thickness of the hole injection layer 611 of the red subpixel R-sub may be greater than a thickness of the hole injection layer 611 of the blue subpixel B-sub, a thickness of the hole injection layer 611 of the white subpixel W-sub, and a thickness of the hole injection layer 611 of the green subpixel G-sub. For example, a thickness of the hole injection layer 611 of the red subpixel R-sub may be greater than a thickness of the hole injection layer 611 of the blue subpixel B-sub, a thickness of the hole injection layer 611 of the blue subpixel B-sub may be greater than a thickness of the hole injection layer 611 of the white subpixel W-sub, and a thickness of the hole injection layer 611 of the white subpixel W-sub may be greater than a thickness of the hole injection layer 611 of the green subpixel G-sub. For example, a thickness of the hole injection layer 611 of the red subpixel R-sub may be 70 nm to 90 nm, but embodiments of the present disclosure are not limited thereto. For example, a thickness of the hole injection layer 611 of the blue subpixel B-sub may be 30 nm to 50 nm, but embodiments of the present disclosure are not limited thereto. For example, a thickness of the hole injection layer 611 of the white subpixel W-sub may be 20 nm to 45 nm, but embodiments of the present disclosure are not limited thereto. For example, a thickness of the hole injection layer 611 of the green subpixel G-sub may be 10 nm to 20 nm, but embodiments of the present disclosure are not limited thereto.

According to an embodiment of the present disclosure, the first hole transport layer 612 may be disposed on the hole injection layer 611. For example, the first hole transport layer 612 may be at the red subpixel R-sub, the green subpixel G-sub, the blue subpixel B-sub, and the white subpixel W-sub. The first hole transport layer 612 may be formed by a deposition process. The first hole transport layer 612 may be conformally formed along the surface of the hole injection layer 611. For example, the first hole transport layer 612 may be formed along a cross-sectional profile of the hole injection layer 611. For example, a surface shape of the first hole transport layer 612 may be based on a surface shape of the hole injection layer 611. In the drawing, it is illustrated that the first hole transport layer 612 to the electron transport layer 831 are formed for each subpixel, and the first hole transport layer 612 to the electron transport layer 831 may be formed by a deposition process and thus may be formed as one layer.

According to an embodiment of the present disclosure, the first emission layer 629 may be disposed on the first hole transport layer 612. For example, the first emission layer 629 may be at the red subpixel R-sub, the green subpixel G-sub, and the blue subpixel B-sub. For example, the first emission layer 629 may be at the red subpixel R-sub, the green subpixel G-sub, the blue subpixel B-sub, and the white subpixel W-sub. The first emission layer 629 may be formed by a deposition process. The first emission layer 629 may be conformally formed along the surface of the hole injection layer 611. For example, a surface shape of the first emission layer 629 may be based on surface shapes of at least one or more of the hole injection layer 611 and the first hole transport layer 612. For example, a surface shape of the first emission layer 629 may be based on a surface shape of the hole injection layer 611. For example, the first emission layer 629 may be formed along a cross-sectional profile of the hole injection layer 611. The first emission layer 629 and the first electron transport layer 631 on the hole injection layer 611 may be conformally formed along a surface of the hole injection layer 611. For example, the first emission layer 629 and the first electron transport layer 631 on the hole injection layer 611 may be formed along a cross-sectional profile of the hole injection layer 611. For example, a surface shape of the first emission layer 629 and the first electron transport layer 631 may be based on a surface shape of the hole injection layer 611. Also, layers in a second emission part 1200 and a third emission part 1300 disposed on a first emission part 1100 may be conformally formed along a surface of the hole injection layer 611. For example, the layers in the second emission part 1200 and the third emission part 1300 disposed on the first emission part 1100 may be formed along a cross-sectional profile of the hole injection layer 611. For example, surface shapes of the layers in the second emission part 1200 and the third emission part 1300 disposed on the first emission part 1100 may be based on a surface shape of the hole injection layer 611.

The first emission layer 629 may be an emission layer which emits blue light. For example, the first emission layer 629 at the red subpixel R-sub, the green subpixel G-sub, and the blue subpixel B-sub may be an emission layer which emits blue light. For example, the first emission layer 629 at the red subpixel R-sub, the green subpixel G-sub, the blue subpixel B-sub, and the white subpixel W-sub may be an emission layer which emits blue light. For example, the first emission layer 629 may include at least one or more dopants and at least one or more hosts, but embodiments of the present disclosure are not limited thereto. The dopant may be a fluorescent dopant or a phosphorescent dopant. For example, the dopant of the first emission layer 629 may include a blue fluorescent dopant, but embodiments of the present disclosure are not limited thereto. For example, a peak wavelength of the first emission layer 629 may be within a range of 420 nm to 480 nm. For example, the first emission layer 629 may emit light in a wavelength of 420 nm to 480 nm. The at least one or more hosts may include a host having a hole characteristic and a host having an electron characteristic, but embodiments of the present disclosure are not limited thereto.

The first electron transport layer 631 may be disposed on the first emission layer 629. For example, the first electron transport layer 631 may be at the red subpixel R-sub, the green subpixel G-sub, and the blue subpixel B-sub. For example, the first electron transport layer 631 may be at the red subpixel R-sub, the green subpixel G-sub, the blue subpixel B-sub, and the white subpixel W-sub. The first electron transport layer 631 may be formed by a deposition process. For example, the first electron transport layer 631 may be conformally formed along the surface of the hole injection layer 611. For example, the first electron transport layer 631 may be formed along a cross-sectional profile of the hole injection layer 611. For example, a surface shape of the first electron transport layer 631 may be based on a surface shape of the hole injection layer 611.

The first electron transport layer 631 may easily transfer an electron, supplied from the second electrode 505, to the first emission layer 629. An exciton may be generated from a hole and an electron supplied from the first emission layer 629, and thus, the first emission layer 629 may emit light.

The first electron transport layer 631 may be one of imidazole, oxadiazole, benzoxazole, phenanthroline, benzothiazole, benzimidazole, triazine, and derivatives thereof, but embodiments of the present disclosure are not limited thereto. For example, the first electron transport layer 631 may be one of Liq(8-hydroxyquinolinolato-lithium), PBD (2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum), but embodiments of the present disclosure are not limited thereto.

According to an embodiment of the present disclosure, the second emission part 1200 may be disposed on the first emission part 1100. For example, the second emission part 1200 may be at the red subpixel R-sub, the green subpixel G-sub, and the blue subpixel B-sub. For example, the second emission part 1200 may be at the red subpixel R-sub, the green subpixel G-sub, the blue subpixel B-sub, and the white subpixel W-sub. Layers of the second emission part 1200 may be formed by a deposition process. For example, the second emission part 1200 may be conformally formed along the surface of the hole injection layer 611. For example, the layers of the second emission part 1200 may be formed based on a cross-sectional profile of the hole injection layer 611. For example, a surface shape of the second emission part 1200 may be based on a surface shape of the hole injection layer 611.

According to an embodiment of the present disclosure, the second emission part 1200 may include a second hole functional layer, an emission layer, and a second electron functional layer, but embodiments of the present disclosure are not limited thereto. For example, the second emission part 1200 may include a second hole transport layer 713, at least one or more emission layers, and a second electron transport layer 731, but embodiments of the present disclosure are not limited thereto. The at least one or more emission layers may include a second emission layer 721 and a third emission layer 723. For example, the second emission layer 721 and the third emission layer 723 may be a second emission layer, but the terms are not limited thereto.

The second hole transport layer 713 may be disposed on the first emission part 1100. For example, the second hole transport layer 713 may be at the red subpixel R-sub, the green subpixel G-sub, and the blue subpixel B-sub. For example, the second hole transport layer 713 may be at the red subpixel R-sub, the green subpixel G-sub, the blue subpixel B-sub, and the white subpixel W-sub. Layers of the second hole transport layer 713 may be formed by a deposition process. For example, the second hole transport layer 713 may be conformally formed along the surface of the hole injection layer 611. For example, the second hole transport layer 713 may be formed based on a cross-sectional profile of the hole injection layer 611. For example, a surface shape of the second hole transport layer 713 may be based on surface shapes of at least one or more of the hole injection layer 611 and the first hole transport layer 612. For example, a surface shape of the second hole transport layer 713 may be based on a surface shape of the hole injection layer 611. The second hole transport layer 713 may include the same material as the first hole transport layer 612, but embodiments of the present disclosure are not limited thereto.

The second electron transport layer 731 may be disposed on the at least one or more emission layers. For example, the second electron transport layer 731 may be at the red subpixel R-sub, the green subpixel G-sub, and the blue subpixel B-sub. For example, the second electron transport layer 731 may be at the red subpixel R-sub, the green subpixel G-sub, the blue subpixel B-sub, and the white subpixel W-sub. Layers of the second electron transport layer 731 may be formed by a deposition process. For example, the second electron transport layer 731 may be conformally formed along the surface of the hole injection layer 611. For example, the second electron transport layer 731 may be formed based on a cross-sectional profile of the hole injection layer 611. For example, a surface shape of the second electron transport layer 731 may be based on surface shapes of at least one or more of the hole injection layer 611 and the first hole transport layer 612. For example, a surface shape of the second electron transport layer 731 may be based on a surface shape of the hole injection layer 611. For example, the second electron transport layer 731 may be disposed on the third emission layer 723. The second electron transport layer 731 may include the same material as the first electron transport layer 631, but embodiments of the present disclosure are not limited thereto.

The second emission layer 721 may be disposed on the second hole transport layer 713. The second emission layer 721 may be formed by a deposition process. For example, the second emission layer 721 may be conformally formed along the surface of the hole injection layer 611. For example, the second emission layer 721 may be formed based on a cross-sectional profile of the hole injection layer 611. For example, a surface shape of the second emission layer 721 may be based on surface shapes of at least one or more of the hole injection layer 611 and the first hole transport layer 612. For example, a surface shape of the second emission layer 721 may be based on a surface shape of the hole injection layer 611. For example, the second emission layer 721 may be disposed at the red subpixel R-sub, the green subpixel G-sub, the blue subpixel B-sub, and the white subpixel W-sub.

The second emission layer 721 may be an emission layer which emits green light. For example, the second emission layer 721 may include at least one or more dopants and at least one or more hosts, but embodiments of the present disclosure are not limited thereto. The dopant may be a fluorescent dopant or a phosphorescent dopant. For example, the dopant of the second emission layer 721 may include a green phosphorescent dopant, but embodiments of the present disclosure are not limited thereto. For example, a peak wavelength of the second emission layer 721 may be within a range of 520 nm to 590 nm. For example, the second emission layer 721 may emit light in a wavelength of 520 nm to 590 nm. The at least one or more hosts may include a host having a hole characteristic and a host having an electron characteristic, but embodiments of the present disclosure are not limited thereto.

The third emission layer 723 may be disposed on the second emission layer 721. The third emission layer 723 may be formed by a deposition process. For example, the third emission layer 723 may be conformally formed along the surface of the hole injection layer 611. For example, the third emission layer 723 may be formed based on a cross-sectional profile of the hole injection layer 611. For example, a surface shape of the third emission layer 723 may be based on surface shapes of at least one or more of the hole injection layer 611 and the first hole transport layer 612. For example, a surface shape of the third emission layer 723 may be based on a surface shape of the hole injection layer 611. For example, the third emission layer 723 may be disposed at the red subpixel R-sub, the green subpixel G-sub, the blue subpixel B-sub, and the white subpixel W-sub.

The third emission layer 723 may be an emission layer which emits red light. For example, the third emission layer 723 may include at least one or more dopants and at least one or more hosts, but embodiments of the present disclosure are not limited thereto. The dopant may be a fluorescent dopant or a phosphorescent dopant. For example, the dopant of the third emission layer 723 may include a red phosphorescent dopant, but embodiments of the present disclosure are not limited thereto. For example, a peak wavelength of the third emission layer 723 may be within a range of 600 nm to 650 nm. For example, the third emission layer 723 may emit light in a wavelength of 600 nm to 650 nm. The at least one or more hosts may include a host having a hole characteristic and a host having an electron characteristic, but embodiments of the present disclosure are not limited thereto.

According to an embodiment of the present disclosure, a red emission layer which is the third emission layer 723 may be further provided than a case where the second emission layer 721 is a green emission layer, red efficiency may be improved. For example, a red emission layer which is the third emission layer 723 may be provided closer to the second electrode 505 than a green emission layer which is the second emission layer 721, and thus, red efficiency may be improved. For example, the second emission part 1200 may configure the second emission layer 721 and the third emission layer 723, and thus, green and/or red efficiency may be more improved.

According to an embodiment of the present disclosure, a hole of the second hole transport layer 713 and an electron of the second electron transport layer 731 may be supplied to the second emission layer 721 and the third emission layer 723. Accordingly, an exciton may be generated by a combination of a hole and an electron in the second emission layer 721 and the third emission layer 723, and thus, the second emission layer 721 and the third emission layer 723 may emit light.

A first charge generating layer may be provided between the first emission part 1100 and the second emission part 1200. For example, the first charge generating layer may be provided on the first emission part 1100. For example, the first charge generating layer may be at the red subpixel R-sub, the green subpixel G-sub, and the blue subpixel B-sub. For example, the first charge generating layer may be at the red subpixel R-sub, the green subpixel G-sub, the blue subpixel B-sub, and the white subpixel W-sub. The first charge generating layer may be formed by a deposition process. For example, the first charge generating layer may be conformally formed along the surface of the hole injection layer 611. For example, the first charge generating layer may be formed along a cross-sectional profile of the hole injection layer 611. For example, a surface shape of the first charge generating layer may be based on a surface shape of at least one or more of the hole injection layer 611 and the first hole transport layer 612. For example, a surface shape of the first charge generating layer may be based on a surface shape of the hole injection layer 611. For example, the first charge generating layer may adjust charge balance between the first emission part 1100 and the second emission part 1200. The first charge generating layer may include a first N-type charge generating layer 641 and a first P-type charge generating layer 642. For example, the first N-type charge generating layer 641 may be disposed on the first electron transport layer 631. For example, the first P-type charge generating layer 642 may be disposed on the first N-type charge generating layer 641. For example, the second hole transport layer 713 may be disposed on the first P-type charge generating layer 642.

According to an embodiment of the present disclosure, the first N-type charge generating layer 641 may inject an electron into the first emission layer 629. For example, the first N-type charge generating layer 641 may include an organic layer which is formed by doping a host with alkali metal such as lithium (Li), sodium (Na), potassium (K), or cesium (Cs) or alkali earth metal such as magnesium (Mg), strontium (Sr), barium (Ba), or radium (Ra), but embodiments of the present disclosure are not limited thereto.

The first P-type charge generating layer 642 may inject a hole into the second emission part 1200. For example, the first P-type charge generating layer 642 may inject a hole into the second emission layer 721 and the third emission layer 723. The first P-type charge generating layer 642 may include an organic layer including a P-type dopant, but embodiments of the present disclosure are not limited thereto.

The third emission part 1300 may be disposed on the second emission part 1200. For example, the third emission part 1300 may be at the red subpixel R-sub, the green subpixel G-sub, and the blue subpixel B-sub. For example, the third emission part 1300 may be at the red subpixel R-sub, the green subpixel G-sub, the blue subpixel B-sub, and the white subpixel W-sub. Layers of the third emission part 1300 may be formed by a deposition process. For example, the third emission part 1300 may be conformally formed along the surface of the hole injection layer 611. For example, the layers of the third emission part 1300 may be formed based on a cross-sectional profile of the hole injection layer 611. For example, a surface shape of the third emission part 1300 may be based on surface shapes of at least one or more of the hole injection layer 611 and the first hole transport layer 612. For example, a surface shape of the third emission part 1300 may be based on a surface shape of the hole injection layer 611. For example, the third emission part 1300 may include a third hole functional layer, an emission layer, and a third electron functional layer, but embodiments of the present disclosure are not limited thereto. For example, the third emission part 1300 may include at least one or more hole transport layers, a fourth emission layer 821, and a third electron transport layer 831, but embodiments of the present disclosure are not limited thereto. The at least one or more hole transport layer may be a third hole transfer layer, but embodiments of the present disclosure are not limited thereto. For example, the at least one or more hole transport layers may include a third hole transport layer 813 and a fourth hole transport layer 815, but embodiments of the present disclosure are not limited thereto. For example, the third hole transport layer 813 and the fourth hole transport layer 815 may be a third hole transport layer, but the terms are not limited thereto. For example, the fourth emission layer 821 may be a third emission layer, but the terms are not limited thereto.

The third hole transport layer 813 and the fourth hole transport layer 815 may be disposed on the second emission part 1200. For example, the fourth hole transport layer 815 may be disposed on the third hole transport layer 813. For example, the third hole transport layer 813 and the fourth hole transport layer 815 may be at the red subpixel R-sub, the green subpixel G-sub, and the blue subpixel B-sub. For example, the third hole transport layer 813 and the fourth hole transport layer 815 may be at the red subpixel R-sub, the green subpixel G-sub, the blue subpixel B-sub, and the white subpixel W-sub. The third hole transport layer 813 and the fourth hole transport layer 815 may be formed by a deposition process. For example, the third hole transport layer 813 and the fourth hole transport layer 815 may be conformally formed along the surface of the hole injection layer 611. For example, the third hole transport layer 813 and the fourth hole transport layer 815 may be formed based on a cross-sectional profile of the hole injection layer 611. For example, a surface shape of the third hole transport layer 813 and the fourth hole transport layer 815 may be based on surface shapes of at least one or more of the hole injection layer 611 and the first hole transport layer 612. For example, a surface shape of the third hole transport layer 813 and the fourth hole transport layer 815 may be based on a surface shape of the hole injection layer 611. The third hole transport layer 813 and the fourth hole transport layer 815 may include the same material as the first hole transport layer 612, but embodiments of the present disclosure are not limited thereto. As another example, the third hole transport layer 813 and the fourth hole transport layer 815 may be provided as one transport layer, or one of the third hole transport layer 813 and the fourth hole transport layer 815 may be omitted.

The third electron transport layer 831 may be disposed on the fourth emission layer 821. For example, the third electron transport layer 831 may be at the red subpixel R-sub, the green subpixel G-sub, and the blue subpixel B-sub. For example, the third electron transport layer 831 may be at the red subpixel R-sub, the green subpixel G-sub, the blue subpixel B-sub, and the white subpixel W-sub. The third electron transport layer 831 may be formed by a deposition process. For example, the third electron transport layer 831 may be conformally formed along the surface of the hole injection layer 611. For example, the third electron transport layer 831 may be formed to correspond to a cross-sectional profile of the hole injection layer 611. For example, a surface shape of the third electron transport layer 831 may be based on surface shapes of at least one or more of the hole injection layer 611 and the first hole transport layer 612. For example, a surface shape of the third electron transport layer 831 may be based on a surface shape of the hole injection layer 611. The third electron transport layer 831 may include the same material as the first electron transport layer 631, but embodiments of the present disclosure are not limited thereto.

The fourth emission layer 821 may be disposed on the fourth hole transport layer 815. The fourth emission layer 821 may be formed by a deposition process. For example, the fourth emission layer 821 may be conformally formed along the surface of the hole injection layer 611. For example, the fourth emission layer 821 may be formed based on a cross-sectional profile of the hole injection layer 611. For example, a surface shape of the fourth emission layer 821 may be based on surface shapes of at least one or more of the hole injection layer 611 and the first hole transport layer 612. For example, a surface shape of the fourth emission layer 821 may be based on a surface shape of the hole injection layer 611. For example, the fourth emission layer 821 may be disposed at the red subpixel R-sub, the green subpixel G-sub, the blue subpixel B-sub, and the white subpixel W-sub. For example, the fourth emission layer 821 may be a third emission layer, but the terms are not limited thereto.

The fourth emission layer 821 may be an emission layer which emits blue light. For example, the fourth emission layer 821 may include at least one or more dopants and at least one or more hosts, but embodiments of the present disclosure are not limited thereto. The dopant may be a fluorescent dopant or a phosphorescent dopant. For example, the dopant of the fourth emission layer 821 may include a blue phosphorescent dopant, but embodiments of the present disclosure are not limited thereto. For example, a peak wavelength of the fourth emission layer 821 may be within a range of 420 nm to 480 nm. For example, the fourth emission layer 821 may emit light in a wavelength of 420 nm to 480 nm. The at least one or more hosts may include a host having a hole characteristic and a host having an electron characteristic, but embodiments of the present disclosure are not limited thereto.

According to an embodiment of the present disclosure, holes of the third hole transport layer 813 and the fourth hole transport layer 815 and an electron of the third electron transport layer 831 may be supplied to the fourth emission layer 821. Accordingly, an exciton may be generated by a combination of a hole and an electron in the fourth emission layer 821, and thus, the fourth emission layer 821 may emit light.

A second charge generating layer may be provided between the second emission part 1200 and the third emission part 1300. For example, the second charge generating layer may be provided on the second emission part 1200. For example, the second charge generating layer may be at the red subpixel R-sub, the green subpixel G-sub, and the blue subpixel B-sub. For example, the second charge generating layer may be at the red subpixel R-sub, the green subpixel G-sub, the blue subpixel B-sub, and the white subpixel W-sub. The second charge generating layer may be formed by a deposition process. For example, the second charge generating layer may be conformally formed along the surface of the hole injection layer 611. For example, the second charge generating layer may be formed along a cross-sectional profile of the hole injection layer 611. For example, a surface shape of the second charge generating layer may be based on a surface shape of at least one or more of the hole injection layer 611 and the first hole transport layer 612. For example, a surface shape of the second charge generating layer may be based on a surface shape of the hole injection layer 611. For example, the second charge generating layer may adjust charge balance between the second emission part 1200 and the third emission part 1300. The second charge generating layer may include a second N-type charge generating layer 741 and a second P-type charge generating layer 742. For example, the second N-type charge generating layer 741 may be disposed on the second electron transport layer 731. For example, the second P-type charge generating layer 742 may be disposed on the second N-type charge generating layer 741. For example, the third hole transport layer 813 may be disposed on the second P-type charge generating layer 742.

According to an embodiment of the present disclosure, the second N-type charge generating layer 741 may inject an electron into the fourth emission layer 821. For example, the second N-type charge generating layer 741 may include an organic layer which is formed by doping a host with alkali metal such as lithium (Li), sodium (Na), potassium (K), or cesium (Cs) or alkali earth metal such as magnesium (Mg), strontium (Sr), barium (Ba), or radium (Ra), but embodiments of the present disclosure are not limited thereto.

The second P-type charge generating layer 742 may inject a hole into the third emission part 1300. For example, the second P-type charge generating layer 742 may inject a hole into the fourth emission layer 821. The second P-type charge generating layer 742 may include an organic layer including a P-type dopant, but embodiments of the present disclosure are not limited thereto.

According to an embodiment of the present disclosure, two or more emission layers of emission layers included in at least three emission parts may be configured to emit lights having the same color. For example, two or more emission layers of the at least three emission parts may be configured as a blue emission layer which emits light having the same color. For example, a first emission layer between the first emission part 1100 and the third emission part 1300 may be configured as a blue emission layer, but embodiments of the present disclosure are not limited thereto.

According to an embodiment of the present disclosure, surface shapes of the first hole transport layer 612, the first emission layer 629, the first charge generating layers 641 and 642, the second emission part 1200, the second charge generating layers 741 and 742, and the third emission part 1300 may be based on surface shapes of at least one or more of the hole injection layer 611 and the first hole transport layer 612. For example, surface shapes of the first hole transport layer 612, the first emission layer 629, the first charge generating layers 641 and 642, the second emission part 1200, the second charge generating layers 741 and 742, and the third emission part 1300 may be based on the surface shape of the hole injection layer 611.

According to an embodiment of the present disclosure, an electron injection layer 811 may be further provided on the third emission part 1300. For example, the electron injection layer 811 may be at the red subpixel R-sub, the green subpixel G-sub, and the blue subpixel B-sub. For example, the electron injection layer 811 may be at the red subpixel R-sub, the green subpixel G-sub, the blue subpixel B-sub, and the white subpixel W-sub. Layers of the electron injection layer 811 may be formed by a deposition process. For example, the electron injection layer 811 may be conformally formed along the surface of the hole injection layer 611. For example, the electron injection layer 811 may be formed to correspond to a cross-sectional profile of the hole injection layer 611. For example, a surface shape of the electron injection layer 811 may be based on surface shapes of at least one or more of the hole injection layer 611 and the first hole transport layer 612. For example, a surface shape of the electron injection layer 811 may be based on a surface shape of the hole injection layer 611. For example, the electron injection layer 811 may be configured on the third electron transport layer 831. The electron injection layer 811 may enable an electron supplied from the second electrode 505 to be smoothly injected into the electron transport layer 134. For example, the electron injection layer 811 may include one or more of $BaF_2$, LiF, CsF, NaF, $Li_2O$, BaO, lithium quinolate (Liq), and lithium benzoate, but embodiments of the present disclosure are not limited thereto.

The second electrode 505 may be disposed on the electron injection layer 811. For example, the second electrode 505 may be at the red subpixel R-sub, the green subpixel G-sub, and the blue subpixel B-sub. For example, the second electrode 505 may be at the red subpixel R-sub, the green subpixel G-sub, the blue subpixel B-sub, and the white subpixel W-sub. The second electrode 505 may be formed by a deposition process. For example, the second electrode 505 may be conformally formed along the surface of the hole injection layer 611. For example, the second electrode 505 may be formed to correspond to a cross-sectional profile of the hole injection layer 611. For example, a surface shape of the second electrode 505 may be based on surface shapes of at least one or more of the hole injection layer 611 and the first hole transport layer 612. For example, a surface shape of the second electrode 505 may be based on a surface shape of the hole injection layer 611.

The second electrode 505 may include a metal material having a low work function, so as to smoothly supply an electron. For example, the second electrode 505 may include one or more materials of Ca, Ba, Al, Ag, and an alloy thereof, but embodiments of the present disclosure are not limited thereto.

The second electrode 505 may be formed of one layer without being patterned for each of the subpixels R-sub, G-sub, B-sub, and W-sub. In a case where the display apparatus 1000 is driven as the top emission type, the second electrode 505 may be formed to have a thin thickness and may be formed to be substantially transparent.

According to an embodiment of the present disclosure, at least one or more of the first emission part 1100, the second According to an embodiment of the present disclosure, a surface shape of the first hole transport layer 612, the first emission layer 629, the first electron transport layer 631, the first charge generating layers 641 and 642, the second emission part 1200, the second charge generating layers 741 and 742, the third emission part 1300, the electron injection layer 811, and the second electrode 505 may be based on a surface shape of the hole injection layer 611.

A color filter may be disposed on the second electrode 505. The color filter may include a red color filter, a green color filter, a blue color filter, and a white color filter. For example, the red color filter may be disposed to correspond to the red subpixel R-sub. For example, the green color filter may be disposed to correspond to the green subpixel G-sub. For example, the blue color filter may be disposed to correspond to the blue subpixel B-sub. For example, the white color filter may be disposed to correspond to the white subpixel W-sub. Accordingly, the display apparatus may output light based on a wavelength which is selectively transmitted by the color filter.

The following Table 1 may represent efficiency according to an experimental example and an embodiment of the present disclosure.

In the experimental example, as described with reference to FIG. 4, three emission parts may be provided, and layers corresponding to the three emission parts for each of subpixels R-sub, G-sub, B-sub, and W-sub may be formed by a deposition process. A hole transfer layer, an emission layer, and an electron transfer layer of first to third emission parts may be provided as one layer without being patterned. A hole injection layer, a first hole transport layer, a first emission layer, and a first electron transport layer of the first emission part may be provided as one layer without being patterned. A first charge generating layer between the first emission part and the second emission part and a second charge generating layer between the second emission part and the third emission part may be provided as one layer.

TABLE 1

| | | Experimental Example | | | | Embodiment | | | |
|---|---|---|---|---|---|---|---|---|---|
| | | R | G | B | W | R | G | B | W |
| Device | CIEx | 0.682 | 0.252 | 0.155 | 0.273 | 0.684 | 0.240 | 0.153 | 0.273 |
| Characteristic | CIEy | 0.316 | 0.715 | 0.042 | 0.285 | 0.314 | 0.715 | 0.040 | 0.285 |
| | Efficiency | 3.70 | 15.40 | 4.90 | 74.70 | 16.20 | 45.00 | 5.30 | 74.40 |
| Panel | Luminance | 5.40 | 13.30 | 0.80 | 48.60 | 5.70 | 13.20 | 0.80 | 48.50 |
| Characteristic | Current | 2.69 | 1.60 | 0.31 | 1.21 | 0.64 | 0.54 | 0.26 | 1.20 |
| | Panel Efficiency | | 21.76 | | | | 47.80 | | | emission part 1200, and the third emission part 1300 may be formed by a process which differs from other one or more emission parts. For example, the first emission part 1100 may be formed by a solution process, and the second emission part 1200 and/or the third emission part 1300 may be formed by a deposition process. For example, the hole injection layer 611 in the first emission part 1100 may be formed by a solution process. For example, the first hole transport layer 612, the first emission layer 629, the first electron transport layer 631, the first charge generating layers 641 and 642, the second emission part 1200, the second charge generating layers 741 and 742, the third emission part 1300, the electron injection layer 811, and the second electrode 505, which are on the hole injection layer 611 of the first emission part 1100, may be formed by a deposition process.

In Table 1, a device characteristic, color coordinates and efficiency have been measured. The device characteristic has been measured under a condition where a display apparatus is configured as in FIG. 4. The efficiency of an embodiment represents a relative value compared to the efficiency of the experimental example. Color coordinates of red of the experimental example have been measured to be (0.682, 0.316), and color coordinates of red of an embodiment have been measured to be (0.684, 0.314). Color coordinates of green of the experimental example have been measured to be (0.252, 0.715), and color coordinates of green of an embodiment have been measured to be (0.240, 0.715). Color coordinates of blue of the experimental example have been measured to be (0.155, 0.042), and color coordinates of blue of an embodiment have been measured to be (0.153, 0.040).

Color coordinates of white of the experimental example have been measured to be (0.273, 0.285), and color coordinates of white of an embodiment have been measured to be (0.273, 0.285). Accordingly, it may be seen that an embodiment of the present disclosure has a color coordinate characteristic similar to the experiment example. For example, it may be seen that an embodiment where a hole injection layer is formed by a solution process has a color coordinate characteristic similar to the experiment example.

An efficiency of red of the experimental example has been measured to be 3.70 cd/A (candela/Ampere), and the efficiency of red of an embodiment has been measured to be 16.20 cd/A. An efficiency of green of the experimental example has been measured to be 15.40 cd/A, and the efficiency of green of an embodiment has been measured to be 45.00 cd/A. An efficiency of blue of the experimental example has been measured to be 4.90 cd/A, and the efficiency of blue of an embodiment has been measured to be 5.30 cd/A. An efficiency of white of the experimental example has been measured to be 74.70 cd/A, and the efficiency of white of an embodiment has been measured to be 74.40 cd/A. Accordingly, it may be seen that an embodiment of the present disclosure is enhanced more in efficiency than the experimental example. For example, it may be seen that an embodiment of the present disclosure is enhanced more in red, green, and blue efficiency than the experimental example. For example, it may be seen that an embodiment where the hole injection layer is formed by the solution process is enhanced more in red, green, and blue efficiency than the experimental example.

Table 1 shows that the luminance, the current, and the panel efficiency have been measured in a case where a display apparatus is driven based on a dynamic image. Luminance represents average luminance. The panel characteristic has been measured under a condition where the display apparatus of FIG. 3 is configured and the light emitting device layer 503 of FIG. 3 is configured as in FIG. 4.

The luminance of red of the experimental example has been measured to be 5.40 cd/m$^2$ (candela/square meter)(or nit), and the luminance of red of an embodiment has been measured to be 5.70 cd/m$^2$. The luminance of green of the experimental example has been measured to be 13.30 cd/m$^2$, and the luminance of green of an embodiment has been measured to be 13.20 cd/m$^2$. The luminance of blue of the experimental example has been measured to be 0.80 cd/m$^2$, and the luminance of blue of an embodiment has been measured to be 0.80 cd/m$^2$. The luminance of white of the experimental example has been measured to be 48.60 cd/m$^2$, and the luminance of white of an embodiment has been measured to be 48.50 cd/m$^2$. For example, average luminance of red, green, blue, and white of the experimental example has been measured to be 68.10 cd/m$^2$, and average luminance of red, green, blue, and white of an embodiment has been measured to be 68.20 cd/m$^2$. Accordingly, it may be seen that an embodiment of the present disclosure has luminance similar to the experimental example. For example, it may be seen that an embodiment where the hole injection layer is formed by the solution process has luminance similar to the experimental example.

The current of red of the experimental example has been measured to be 2.69 A (Ampere), and the current of red of an embodiment has been measured to be 0.64 A. The current of green of the experimental example has been measured to be 1.6 A, and the current of green of an embodiment has been measured to be 0.54 A. The current of blue of the experimental example has been measured to be 0.31 A, and the current of blue of an embodiment has been measured to be 0.26 A. The current of white of the experimental example has been measured to be 1.21 A, and the current of white of an embodiment has been measured to be 1.20 A. For example, average current of red, green, blue, and white of the experimental example has been measured to be 5.81 A, and average current of red, green, blue, and white of an embodiment has been measured to be 2.64 A. Accordingly, it may be seen that an embodiment of the present disclosure is reduced more in current than the experimental example. For example, it may be seen that an embodiment of the present disclosure is reduced more in current of red, green, blue, and white than the experimental example. For example, it may be seen that an embodiment where the hole injection layer is formed by the solution process is reduced more in current of red, green, blue, and white than the experimental example.

The panel efficiency of the experimental example has been measured to be 21.76 cd/A, and the panel efficiency of an embodiment has been measured to be 47.80 cd/A. The panel efficiency of an embodiment represents a relative value compared to the panel efficiency of the experimental example. Accordingly, it may be seen that an embodiment of the present disclosure is enhanced more in panel efficiency than the experimental example. For example, it may be seen that an embodiment of the present disclosure is enhanced about 220% more in panel efficiency than the experimental example. For example, it may be seen that an embodiment where the hole injection layer is formed by the solution process is enhanced more in panel efficiency than the experimental example.

In an embodiment where the hole injection layer according to an embodiment of the present disclosure is formed by the solution process, it may be seen that the device efficiency and the panel efficiency in a dynamic image are enhanced and a current in a dynamic image is reduced. Accordingly, a display apparatus may be provided where efficiency is enhanced and a current is reduced.

Figure 5:
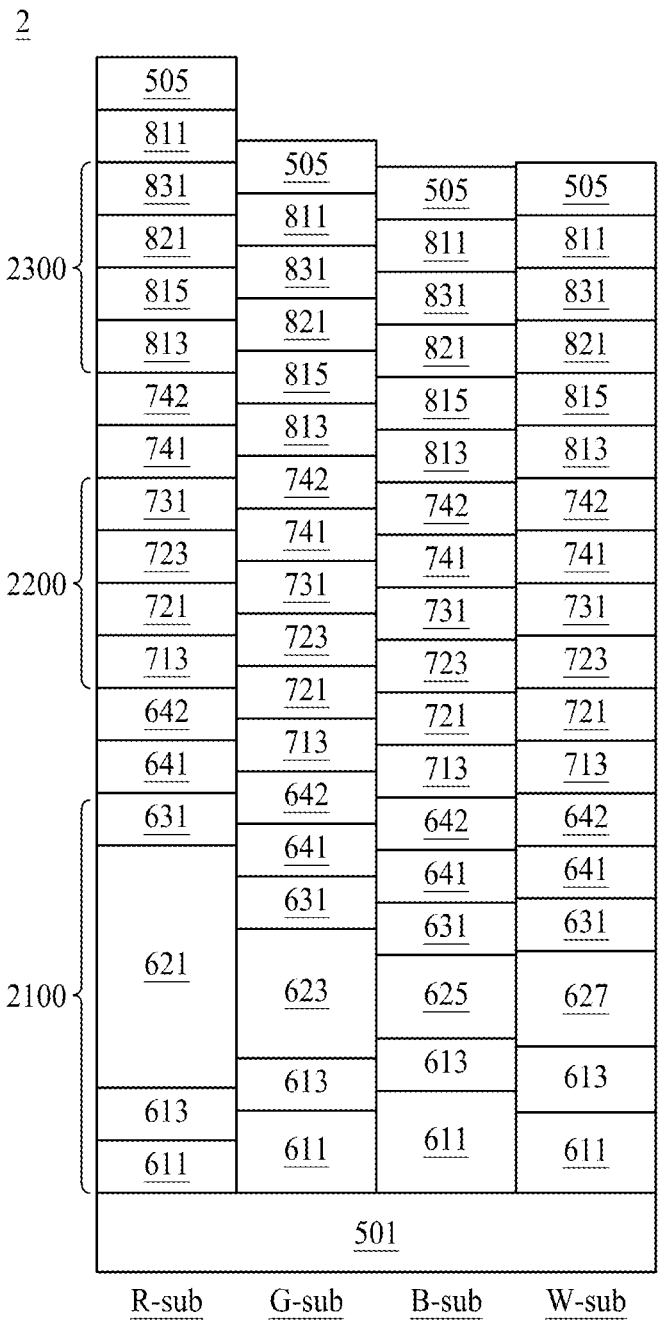
FIG. 5 illustrates a display apparatus according to another embodiment of the present disclosure.

FIG. 5 illustrates a display apparatus according to another embodiment of the present disclosure.

Referring to FIG. 5, a display apparatus 2 according to another embodiment of the present disclosure may include a plurality of subpixels. A substrate may include the plurality of subpixels. The plurality of subpixels may include a first subpixel, a second subpixel, and a third subpixel, but embodiments of the present disclosure are not limited thereto. For example, the first subpixel may be a red subpixel R-sub, the second subpixel may be a green subpixel G-sub, and the third subpixel may be a blue subpixel B-sub, but embodiments of the present disclosure are not limited thereto.

The plurality of subpixels may further include a fourth subpixel. For example, the plurality of subpixels may include a first subpixel, a second subpixel, a third subpixel, and a fourth subpixel, but embodiments of the present disclosure are not limited thereto. For example, the first subpixel may be a red subpixel R-sub, the second subpixel may be a green subpixel G-sub, the third subpixel may be a blue subpixel B-sub, and the fourth subpixel may be a white subpixel W-sub, but embodiments of the present disclosure are not limited thereto. Hereinafter, an example will be described where the first subpixel is the red subpixel R-sub, the second subpixel is the green subpixel G-sub, the third subpixel is the blue subpixel B-sub, and the fourth subpixel is the white subpixel W-sub.

According to an embodiment of the present disclosure, each of the plurality of subpixels may include at least one or more emission parts. For example, the red subpixel R-sub, the green subpixel G-sub, the blue subpixel B-sub, and the white subpixel W-sub may each include at least one or more emission parts. For example, the at least one or more emission parts may be on a first electrode 501. For example, the at least one or more emission parts may be disposed between the first electrode 501 and the second electrode 505. For example, the at least one or more emission parts may include three emission parts, but embodiments of the present disclosure are not limited thereto. For example, the at least three emission parts may include a first emission part 2100, a second emission part 2200, and a third emission part 2300.

The red subpixel R-sub, the green subpixel G-sub, the blue subpixel B-sub, and the white subpixel W-sub according to another embodiment of the present disclosure may include the first emission part 2100. The first emission part 2100 may include a first hole functional layer, a first emission layer, and a first electron functional layer, but embodiments of the present disclosure are not limited thereto. For example, the first hole functional layer may include a hole injection layer, a hole transport layer, and an electron blocking layer, but embodiments of the present disclosure are not limited thereto. For example, the first electron functional layer may include an electron injection layer, an electron transport layer, and a hole blocking layer, but embodiments of the present disclosure are not limited thereto. For example, the first emission part 2100 may include a hole injection layer 611, a first hole transport layer 613, an emission layer, and a first electron transport layer 631, but embodiments of the present disclosure are not limited thereto.

According to an embodiment of the present disclosure, the first hole functional layer may be formed on the first electrode 501. The first hole functional layer may be at the red subpixel R-sub, the green subpixel G-sub, and the blue subpixel B-sub. For example, the first hole functional layer may be at the red subpixel R-sub, the green subpixel G-sub, the blue subpixel B-sub, and the white subpixel W-sub. The first hole functional layer may include the hole injection layer 611 and the first hole transport layer 613. According to an embodiment of the present disclosure, the hole injection layer 611 and the first hole transport layer 613 may be formed by a solution process. For example, the first hole transport layer 613 may be formed along the shape of the hole injection layer 611. For example, the hole injection layer 611 and the hole transport layer 613 may be formed by a solution process such as an inkjet process or a nozzle printing process, but embodiments of the present disclosure are not limited thereto.

A bank 105 may be substantially the same as the description of FIG. 4, and thus, a description thereof is omitted.

A hole injection layer 611 may include an organic material including fluoride. For example, the hole injection layer 611 may include an organic material where a functional group or some atoms of a polymer is substituted into fluoride or a functional group including fluoride. For example, the hole injection layer 611 may include a material where a functional group or some atoms of a polymer such as polyimide, styrene, or methyl methacrylate or the like is substituted into fluoride or a functional group including fluoride, but embodiments of the present disclosure are not limited thereto. As another example, the hole injection layer 611 may include a fluoride-based polymer such as polytetrafluoroethylene, but embodiments of the present disclosure are not limited thereto. The first hole transport layer 613 may include a material which is the same as or different from the hole injection layer, but embodiments of the present disclosure are not limited thereto. For example, the first hole transport layer 613 may include an amine-based material including an aromatic ring such as carbazole, naphthalene, or fluorine, but embodiments of the present disclosure are not limited thereto.

According to an embodiment of the present disclosure, a thickness of a first hole functional layer may be different for each subpixel. Because a thickness of the first hole functional layer is different for each subpixel, a color-based optimal cavity may be implemented, and a color-based optimized charge balance may be implemented. For example, because a thickness of the first hole functional layer is different for each subpixel, a subpixel-based optimal cavity may be implemented, and a subpixel-based optimized charge balance may be implemented. For example, a thickness of a first hole functional layer of a red subpixel R-sub may be equal to or different from a first hole functional layer of a green subpixel G-sub. For example, a thickness of the first hole functional layer of the red subpixel R-sub may be smaller than or equal to a thickness of the first hole functional layer of the green subpixel G-sub. For example, a thickness of the hole injection layer 611 of the red subpixel R-sub may be smaller than or equal to a thickness of the hole injection layer 611 of a blue subpixel B-sub. For example, a thickness of the hole injection layer 611 of the red subpixel R-sub may be smaller than or equal to a thickness of a hole injection layer 611 of the green subpixel G-sub. For example, a thickness of the hole injection layer 611 of the red subpixel R-sub may be 5 nm to 15 nm, but embodiments of the present disclosure are not limited thereto. For example, a thickness of the hole injection layer 611 of the green subpixel G-sub may be 10 nm to 15 nm, but embodiments of the present disclosure are not limited thereto.

According to an embodiment of the present disclosure, a thickness of the first hole functional layer of the red subpixel R-sub may be different from a thickness of the first hole functional layer of the blue subpixel B-sub. For example, a thickness of the first hole functional layer of the red subpixel R-sub may be smaller than a thickness of the first hole functional layer of the blue subpixel B-sub. For example, a thickness of the hole injection layer 611 of the red subpixel R-sub may be different from a thickness of the hole injection layer 611 of the blue subpixel B-sub. For example, a thickness of the hole injection layer 611 of the red subpixel R-sub may be smaller than a thickness of the hole injection layer 611 of the blue subpixel B-sub. For example, a thickness of the hole injection layer 611 of the red subpixel R-sub may be 5 nm to 15 nm, but embodiments of the present disclosure are not limited thereto. For example, a thickness of the hole injection layer 611 of the blue subpixel B-sub may be 25 nm to 45 nm, but embodiments of the present disclosure are not limited thereto.

According to an embodiment of the present disclosure, a thickness of a first hole functional layer of the red subpixel R-sub may be equal to or different from a thickness of a first hole functional layer of a white subpixel W-sub. For example, a thickness of the first hole functional layer of the red subpixel R-sub may be smaller than or equal to a thickness of the first hole functional layer of the white subpixel W-sub. For example, a thickness of a hole injection layer 611 of the red subpixel R-sub may be equal to or different from a thickness of a hole injection layer 611 of the white subpixel W-sub. For example, a thickness of the hole injection layer 611 of the red subpixel R-sub may be smaller than or equal to a thickness of the hole injection layer 611 of the white subpixel W-sub. For example, a thickness of the hole injection layer 611 of the red subpixel R-sub may be 5 nm to 15 nm, but embodiments of the present disclosure are not limited thereto. For example, a thickness of the hole injection layer 611 of the white subpixel W-sub may be 10 nm to 20 nm, but embodiments of the present disclosure are not limited thereto.

According to an embodiment of the present disclosure, a thickness of the first hole functional layer of the green subpixel G-sub may be different from a thickness of the first hole functional layer of the blue subpixel B-sub. For example, a thickness of the first hole functional layer of the green subpixel G-sub may be smaller than a thickness of the first hole functional layer of the blue subpixel B-sub. For example, a thickness of the hole injection layer 611 of the green subpixel G-sub may be different from a thickness of the hole injection layer 611 of the blue subpixel B-sub. For example, a thickness of the hole injection layer 611 of the green subpixel G-sub may be smaller than a thickness of the hole injection layer 611 of the blue subpixel B-sub. For example, a thickness of the hole injection layer 611 of the green subpixel G-sub may be 10 nm to 15 nm, but embodiments of the present disclosure are not limited thereto. For example, a thickness of the hole injection layer 611 of the blue subpixel B-sub may be 25 nm to 45 nm, but embodiments of the present disclosure are not limited thereto.

According to an embodiment of the present disclosure, a thickness of a first hole functional layer of the green subpixel G-sub may be equal to or different from a thickness of a first hole functional layer of a white subpixel W-sub. For example, a thickness of the first hole functional layer of the green subpixel G-sub may be smaller than or equal to a thickness of the first hole functional layer of the white subpixel W-sub. For example, a thickness of a hole injection layer 611 of the green subpixel G-sub may be equal to or different from a thickness of a hole injection layer 611 of the white subpixel W-sub. For example, a thickness of the hole injection layer 611 of the green subpixel G-sub may be smaller than or equal to a thickness of the hole injection layer 611 of the white subpixel W-sub. For example, a thickness of the hole injection layer 611 of the green subpixel G-sub may be 10 nm to 15 nm, but embodiments of the present disclosure are not limited thereto. For example, a thickness of the hole injection layer 611 of the white subpixel W-sub may be 15 nm to 20 nm, but embodiments of the present disclosure are not limited thereto.

According to an embodiment of the present disclosure, a thickness of a first hole functional layer of a blue subpixel B-sub may be different from a thickness of the first hole functional layer of the red subpixel R-sub and a thickness of the first hole functional layer of the green subpixel G-sub. For example, a thickness of the first hole functional layer of the blue subpixel B-sub may be greater than a thickness of the first hole functional layer of the red subpixel R-sub and a thickness of the first hole functional layer of the green subpixel G-sub. For example, a thickness of a hole injection layer 611 of the blue subpixel B-sub may be different from a thickness of a hole injection layer 611 of the red subpixel R-sub and a thickness of the hole injection layer 611 of the green subpixel G-sub. For example, a thickness of the hole injection layer 611 of the blue subpixel B-sub may be greater than a thickness of the hole injection layer 611 of the red subpixel R-sub and a thickness of the hole injection layer 611 of the green subpixel G-sub. For example, a thickness of the hole injection layer 611 of the blue subpixel B-sub may be greater than a thickness of the hole injection layer 611 of the green subpixel G-sub, a thickness of the hole injection layer 611 of the green subpixel G-sub may be greater than a thickness of the hole injection layer 611 of the red subpixel R-sub. For example, a thickness of the hole injection layer 611 of the blue subpixel B-sub may be 25 nm to 45 nm, but embodiments of the present disclosure are not limited thereto. For example, a thickness of the hole injection layer 611 of the green subpixel G-sub may be 10 nm to 15 nm, but embodiments of the present disclosure are not limited thereto. For example, a thickness of the hole injection layer 611 of the red subpixel R-sub may be 5 nm to 15 nm, but embodiments of the present disclosure are not limited thereto.

According to an embodiment of the present disclosure, a thickness of the first hole functional layer of the blue subpixel B-sub may be different from a thickness of the first hole functional layer of the white subpixel W-sub. For example, a thickness of the first hole functional layer of the blue subpixel B-sub may be greater than a thickness of the first hole functional layer of the white subpixel W-sub. For example, a thickness of the hole injection layer 611 of the blue subpixel B-sub may be different from a thickness of the hole injection layer 611 of the white subpixel W-sub. For example, a thickness of the hole injection layer 611 of the blue subpixel B-sub may be smaller than a thickness of the hole injection layer 611 of the white subpixel W-sub. For example, a thickness of the hole injection layer 611 of the blue subpixel B-sub may be 25 nm to 45 nm, but embodiments of the present disclosure are not limited thereto. For example, a thickness of the hole injection layer 611 of the white subpixel W-sub may be 15 nm to 20 nm, but embodiments of the present disclosure are not limited thereto.

According to an embodiment of the present disclosure, a thickness of the first hole functional layer of the blue subpixel B-sub may be different from a thickness of the first hole functional layer of the white subpixel W-sub, a thickness of the first hole functional layer of the green subpixel G-sub, and a thickness of the first hole functional layer of the red subpixel R-sub. For example, the thickness of the first hole functional layer of the blue subpixel B-sub may be greater than the thickness of the first hole functional layer of the white subpixel W-sub, the thickness of the first hole functional layer of the green subpixel G-sub, and the thickness of the first hole functional layer of the red subpixel R-sub. For example, a thickness of a hole injection layer 611 of the blue subpixel B-sub may be greater than a thickness of a hole injection layer 611 of the white subpixel W-sub, a thickness of the hole injection layer 611 of the green subpixel G-sub, and a thickness of the hole injection layer 611 of the red subpixel R-sub. For example, a thickness of a hole injection layer 611 of the blue subpixel B-sub may be greater than a thickness of the hole injection layer 611 of the white subpixel W-sub, a thickness of the hole injection layer 611 of the white subpixel W-sub may be greater than a thickness of the hole injection layer 611 of the green subpixel G-sub, and a thickness of the hole injection layer 611 of the green subpixel G-sub may be greater than a thickness of the hole injection layer 611 of the red subpixel R-sub. For example, a thickness of the hole injection layer 611 of the blue subpixel B-sub may be 25 nm to 45 nm, but embodiments of the present disclosure are not limited thereto. For example, a thickness of the hole injection layer 611 of the white subpixel W-sub may be 15 nm to 20 nm, but embodiments of the present disclosure are not limited thereto. For example, a thickness of the hole injection layer 611 of the green subpixel G-sub may be 10 nm to 15 nm, but embodiments of the present disclosure are not limited thereto. For example, a thickness of the hole injection layer

611 of the red subpixel R-sub may be 5 nm to 15 nm, but embodiments of the present disclosure are not limited thereto.

A first hole transport layer 613 may be disposed on the hole injection layer 611. The first hole transport layer 613 may be at the red subpixel R-sub, the green subpixel G-sub, and the blue subpixel B-sub. For example, the first hole transport layer 613 may be at the red subpixel R-sub, the green subpixel G-sub, the blue subpixel B-sub, and the white subpixel W-sub. The first hole transport layer 613 may be formed by a solution process. For example, the first hole transport layer 613 may be formed along the shape of the hole injection layer 611. For example, a thickness of the first hole transport layer 613 may be formed with the same or different thickness for each subpixel, but embodiments of the present disclosure are not limited thereto. For example, in a case where a thickness of the first hole transport layer 613 is formed to be the same for each subpixel, cavity characteristic and efficiency may be more enhanced, and a current may be reduced. For example, a thickness of the first hole transport layer 613 may be 10 nm to 15 nm, but embodiments of the present disclosure are not limited thereto.

According to an embodiment of the present disclosure, an emission layer may be disposed on the first hole transport layer 613. The emission layer may be at the red subpixel R-sub, the green subpixel G-sub, and the blue subpixel B-sub. For example, the emission layer may be at the red subpixel R-sub, the green subpixel G-sub, the blue subpixel B-sub, and the white subpixel W-sub. The emission layer may be formed by a solution process. For example, the emission layer may be formed along a shape of the first hole transport layer 613.

According to an embodiment of the present disclosure, two or more of first emission layers in a red subpixel R-sub, a green subpixel G-sub, a blue subpixel B-sub, and a white subpixel W-sub may include the same emission layer. For example, the first emission layers in the blue subpixel B-sub and the white subpixel W-sub may be emission layers which emit lights having the same color. For example, the first emission layer in the blue subpixel B-sub and the white subpixel W-sub may be a blue emission layer.

The first emission layer 621 of the red subpixel R-sub may be a red emission layer. For example, the first emission layer 621 may include at least one or more dopants and at least one or more hosts, but embodiments of the present disclosure are not limited thereto. The dopant may be a fluorescent dopant or a phosphorescent dopant. For example, the dopant of the first emission layer 621 may include a red phosphorescent dopant, but embodiments of the present disclosure are not limited thereto. For example, a peak wavelength of the first emission layer 621 may be within a range of 600 nm to 650 nm. For example, the first emission layer 621 may emit light in a wavelength of 600 nm to 650 nm. The at least one or more hosts may include a host having a hole characteristic and a host having an electron characteristic, but embodiments of the present disclosure are not limited thereto. For example, a hole of the first hole transport layer 613 and an electron of the first electron transport layer 631 may be supplied to the first emission layer 621. Accordingly, an exciton may be generated by a combination of a hole and an electron in the first emission layer 621, and thus, the first emission layer 621 may emit light.

According to an embodiment of the present disclosure, a first emission layer 621 of the red subpixel R-sub may include a carbazole-based material, a fluorine-based material, a naphthalene-based material, a polycarbazole-based material, a polyfluorene-based material, a polyimidazole-based material, or a polynaphthalene-based material, but embodiments of the present disclosure are not limited thereto.

The first emission layer 623 of the green subpixel G-sub may be a green emission layer. For example, the first emission layer 623 may include at least one or more dopants and at least one or more hosts, but embodiments of the present disclosure are not limited thereto. The dopant may be a fluorescent dopant or a phosphorescent dopant. For example, the dopant of the first emission layer 623 may include a green phosphorescent dopant, but embodiments of the present disclosure are not limited thereto. For example, a peak wavelength of the first emission layer 623 may be within a range of 520 nm to 590 nm. For example, the first emission layer 623 may emit light in a wavelength of 520 nm to 590 nm. The at least one or more hosts may include a host having a hole characteristic and a host having an electron characteristic, but embodiments of the present disclosure are not limited thereto. For example, a hole of the first hole transport layer 613 and an electron of the first electron transport layer 631 may be supplied to the first emission layer 623. Accordingly, an exciton may be generated by a combination of a hole and an electron in the first emission layer 623, and thus, the first emission layer 623 may emit light.

According to an embodiment of the present disclosure, a first emission layer 623 of the green subpixel G-sub may include a carbazole-based material, a fluorine-based material, a polycarbazole-based material, or a polyfluorene-based material, but embodiments of the present disclosure are not limited thereto.

The first emission layer 625 of the blue subpixel B-sub may be a blue emission layer. For example, the first emission layer 625 may include at least one or more dopants and at least one or more hosts, but embodiments of the present disclosure are not limited thereto. The dopant may be a fluorescent dopant or a phosphorescent dopant. For example, the dopant of the first emission layer 625 may include a blue fluorescent dopant, but embodiments of the present disclosure are not limited thereto. For example, a peak wavelength of the first emission layer 625 may be within a range of 420 nm to 480 nm. For example, the first emission layer 625 may emit light in a wavelength of 420 nm to 480 nm. The at least one or more hosts may include a host having a hole characteristic and a host having an electron characteristic, but embodiments of the present disclosure are not limited thereto. For example, a hole of the first hole transport layer 613 and an electron of the first electron transport layer 631 may be supplied to the first emission layer 625. Accordingly, an exciton may be generated by a combination of a hole and an electron in the first emission layer 625, and thus, the first emission layer 625 may emit light.

According to an embodiment of the present disclosure, a first emission layer 625 of the blue subpixel B-sub may include a distrylarylene-based material, a pyrene-based material, an anthracene-based material, a polydistrylarylene-based material, a polyanthracene-based material, or a polypyrene-based material, but embodiments of the present disclosure are not limited thereto.

The first emission layer 627 of the white subpixel W-sub may be a blue emission layer. For example, the first emission layer 627 may include at least one or more dopants and at least one or more hosts, but embodiments of the present disclosure are not limited thereto. The dopant may be a fluorescent dopant or a phosphorescent dopant. For example, the dopant of the first emission layer 627 may include a blue fluorescent dopant, but embodiments of the present disclosure are not limited thereto. For example, a peak wavelength of the first emission layer 627 may be within a range of 420 nm to 480 nm. For example, the first emission layer 627 may emit light in a wavelength of 420 nm to 480 nm. The at least one or more hosts may include a host having a hole characteristic and a host having an electron characteristic, but embodiments of the present disclosure are not limited thereto. For example, a hole of the first hole transport layer 613 and an electron of the first electron transport layer 631 may be supplied to the first emission layer 627. Accordingly, an exciton may be generated by a combination of a hole and an electron in the first emission layer 627, and thus, the first emission layer 627 may emit light.

According to an embodiment of the present disclosure, a first emission layer 627 of the white subpixel W-sub may include a distrylarylene-based material, a pyrene-based material, an anthracene-based material, a polydistrylarylene-based material, a polyanthracene-based material, or a poly-pyrene-based material, but embodiments of the present disclosure are not limited thereto.

According to an embodiment of the present disclosure, a thickness of the first emission layer may be different for each subpixel. For example, a thickness of the first emission layer 621 of the red subpixel R-sub may be different from a thickness of the first emission layer 623 of the green subpixel G-sub. For example, the thickness of the first emission layer 621 of the red subpixel R-sub may be greater than the thickness of the first emission layer 623 of the green subpixel G-sub. For example, a thickness of the first emission layer 621 of the red subpixel R-sub may be 60 nm to 90 nm, but embodiments of the present disclosure are not limited thereto. For example, a thickness of the first emission layer 623 of the green subpixel G-sub may be 10 nm to 35 nm, but embodiments of the present disclosure are not limited thereto.

According to an embodiment of the present disclosure, a thickness of the first emission layer 621 of the red subpixel R-sub may be different from a thickness of the first emission layer 625 of the blue subpixel B-sub. For example, the thickness of the first emission layer 621 of the red subpixel R-sub may be greater than the thickness of the first emission layer 625 of the blue subpixel B-sub. For example, a thickness of the first emission layer 621 of the red subpixel R-sub may be 60 nm to 90 nm, but embodiments of the present disclosure are not limited thereto. For example, a thickness of the first emission layer 625 of the blue subpixel B-sub may be 10 nm to 35 nm, but embodiments of the present disclosure are not limited thereto.

According to an embodiment of the present disclosure, a thickness of the first emission layer 621 of the red subpixel R-sub may be different from a thickness of the first emission layer 627 of the white subpixel W-sub. For example, the thickness of the first emission layer 621 of the red subpixel R-sub may be greater than the thickness of the first emission layer 627 of the white subpixel W-sub. For example, a thickness of the first emission layer 621 of the red subpixel R-sub may be 60 nm to 90 nm, but embodiments of the present disclosure are not limited thereto. For example, a thickness of the first emission layer 627 of the white subpixel W-sub may be 10 nm to 30 nm, but embodiments of the present disclosure are not limited thereto.

According to an embodiment of the present disclosure, a thickness of the first emission layer 623 of the green subpixel G-sub may be equal to or different from a thickness of the first emission layer 625 of the blue subpixel B-sub. For example, the thickness of the first emission layer 623 of the green subpixel G-sub may be smaller than or equal to the thickness of the first emission layer 625 of the blue subpixel B-sub. For example, a thickness of the first emission layer 623 of the green subpixel G-sub may be 10 nm to 35 nm, but embodiments of the present disclosure are not limited thereto. For example, a thickness of the first emission layer 625 of the blue subpixel B-sub may be 15 nm to 35 nm, but embodiments of the present disclosure are not limited thereto.

According to an embodiment of the present disclosure, a thickness of the first emission layer 623 of the green subpixel G-sub may be different from a thickness of the first emission layer 627 of the white subpixel W-sub. For example, the thickness of the first emission layer 623 of the green subpixel G-sub may be greater than the thickness of the first emission layer 627 of the white subpixel W-sub. For example, a thickness of the first emission layer 621 of the green subpixel G-sub may be 10 nm to 35 nm, but embodiments of the present disclosure are not limited thereto. For example, a thickness of the first emission layer 627 of the white subpixel W-sub may be 10 nm to 30 nm, but embodiments of the present disclosure are not limited thereto.

According to an embodiment of the present disclosure, a thickness of the first emission layer 625 of the blue subpixel B-sub may be different from a thickness of the first emission layer 627 of the white subpixel W-sub. For example, the thickness of the first emission layer 625 of the blue subpixel B-sub may be greater than the thickness of the first emission layer 627 of the white subpixel W-sub. For example, a thickness of the first emission layer 625 of the blue subpixel B-sub may be 25 nm to 45 nm, but embodiments of the present disclosure are not limited thereto. For example, a thickness of the first emission layer 627 of the white subpixel W-sub may be 15 nm to 20 nm, but embodiments of the present disclosure are not limited thereto.

According to an embodiment of the present disclosure, a thickness of the first emission layer 621 of the red subpixel R-sub may be different from a thickness of the first emission layer 625 of the blue subpixel B-sub and a thickness of the first emission layer 623 of the green subpixel G-sub. For example, the thickness of the first emission layer 621 of the red subpixel R-sub may be greater than a thickness of the first emission layer 625 of the blue subpixel B-sub and a thickness of the first emission layer 623 of the green subpixel G-sub. For example, a thickness of the first emission layer 621 of the red subpixel R-sub may be greater than a thickness of the first emission layer 625 of the blue subpixel B-sub, and a thickness of the first emission layer 625 of the blue subpixel B-sub may be greater than or equal to a thickness of the first emission layer 623 of the green subpixel G-sub. For example, a thickness of the first emission layer 621 of the red subpixel R-sub may be 60 nm to 90 nm, but embodiments of the present disclosure are not limited thereto. For example, a thickness of the first emission layer 625 of the blue subpixel B-sub may be 15 nm to 35 nm, but embodiments of the present disclosure are not limited thereto. For example, a thickness of the first emission layer 623 of the green subpixel G-sub may be 10 nm to 35 nm, but embodiments of the present disclosure are not limited thereto.

According to an embodiment of the present disclosure, a thickness of the first emission layer 621 of the red subpixel R-sub may be different from a thickness of the first emission layer 625 of the blue subpixel B-sub, a thickness of the first emission layer 623 of the green subpixel G-sub, and a thickness of the first emission layer 627 of the white subpixel W-sub. For example, the thickness of the first emission layer 621 of the red subpixel R-sub may be greater than the thickness of the first emission layer 625 of the blue subpixel B-sub, the thickness of the first emission layer 623 of the green subpixel G-sub, and the thickness of the first emission layer 627 of the white subpixel W-sub. For example, a thickness of the first emission layer 621 of the red subpixel R-sub may be greater than a thickness of the first emission layer 625 of the blue subpixel B-sub, a thickness of the first emission layer 625 of the blue subpixel B-sub may be greater than or equal to a thickness of the first emission layer 623 of the green subpixel G-sub, and a thickness of the first emission layer 623 of the green subpixel G-sub may be greater than a thickness of the first emission layer 627 of the white subpixel W-sub. For example, a thickness of the first emission layer 621 of the red subpixel R-sub may be 60 nm to 90 nm, but embodiments of the present disclosure are not limited thereto. For example, a thickness of the first emission layer 625 of the blue subpixel B-sub may be 15 nm to 35 nm, but embodiments of the present disclosure are not limited thereto. For example, a thickness of the first emission layer 623 of the green subpixel G-sub may be 10 nm to 35 nm, but embodiments of the present disclosure are not limited thereto. For example, a thickness of the first emission layer 627 of the white subpixel W-sub may be 10 nm to 30 nm, but embodiments of the present disclosure are not limited thereto.

According to an embodiment of the present disclosure, a thickness of the first emission layer 621 of the red subpixel R-sub may be different from a thickness of the first emission layer 625 of the blue subpixel B-sub, a thickness of the first emission layer 623 of the green subpixel G-sub, and a thickness of the first emission layer 627 of the white subpixel W-sub. For example, a thickness of the first emission layer 621 of the red subpixel R-sub may be greater than a thickness of the first emission layer 625 of the blue subpixel B-sub, a thickness of the first emission layer 623 of the green subpixel G-sub, and a thickness of the first emission layer 627 of the white subpixel W-sub. For example, a thickness of the first emission layer 625 of the blue subpixel B-sub, a thickness of the first emission layer 623 of the green subpixel G-sub, and a thickness of the first emission layer 627 of the white subpixel W-sub may be equal to one another. For example, a thickness of the first emission layer 621 of the red subpixel R-sub may be 60 nm to 90 nm, but embodiments of the present disclosure are not limited thereto. For example, a thickness of the first emission layer 625 of the blue subpixel B-sub may be 15 nm to 35 nm, but embodiments of the present disclosure are not limited thereto. For example, a thickness of the first emission layer 623 of the green subpixel G-sub may be 10 nm to 35 nm, but embodiments of the present disclosure are not limited thereto. For example, a thickness of the first emission layer 627 of the white subpixel W-sub may be 10 nm to 30 nm, but embodiments of the present disclosure are not limited thereto.

According to an embodiment of the present disclosure, a sum of a thickness of the hole injection layer 611 and a thickness of the first emission layer may be different for each subpixel. For example, a sum of a thickness of the hole injection layer 611 and a thickness of the first emission layer 621 of the red subpixel R-sub may be different from a sum of a thickness of the hole injection layer 611 and a thickness of the first emission layer 623 of the green subpixel G-sub. For example, the sum of the thickness of the hole injection layer 611 and the thickness of the first emission layer 621 of the red subpixel R-sub may be greater than the sum of the thickness of the hole injection layer 611 and the thickness of the first emission layer 623 of the green subpixel G-sub. For example, the sum of the thickness of the hole injection layer 611 and the thickness of the first emission layer 621 of the red subpixel R-sub may be 65 nm to 105 nm, but embodiments of the present disclosure are not limited thereto. For example, the sum of the thickness of the hole injection layer 611 and the thickness of the first emission layer 623 of the green subpixel G-sub may be 20 nm to 50 nm, but embodiments of the present disclosure are not limited thereto.

According to an embodiment of the present disclosure, a sum of a thickness of the hole injection layer 611 and a thickness of the first emission layer 621 of the red subpixel R-sub may be different from a sum of a thickness of the hole injection layer 611 and a thickness of the first emission layer 625 of the blue subpixel B-sub. For example, the sum of the thickness of the hole injection layer 611 and the thickness of the first emission layer 621 of the red subpixel R-sub may be greater than the sum of a thickness of the hole injection layer 611 and the thickness of the first emission layer 625 of the blue subpixel B-sub. For example, the sum of the thickness of the hole injection layer 611 and the thickness of the first emission layer 621 of the red subpixel R-sub may be 45 nm to 105 nm, but embodiments of the present disclosure are not limited thereto. For example, the sum of the thickness of the hole injection layer 611 and the thickness of the first emission layer 625 of the blue subpixel B-sub may be 40 nm to 80 nm, but embodiments of the present disclosure are not limited thereto.

According to an embodiment of the present disclosure, a sum of a thickness of the hole injection layer 611 and a thickness of the first emission layer 621 of the red subpixel R-sub may be different from a sum of a thickness of the hole injection layer 611 and a thickness of the first emission layer 627 of the white subpixel W-sub. For example, the sum of the thickness of the hole injection layer 611 and the thickness of the first emission layer 621 of the red subpixel R-sub may be greater than the sum of the thickness of the hole injection layer 611 and the thickness of the first emission layer 627 of the white subpixel W-sub. For example, the sum of the thickness of the hole injection layer 611 and the thickness of the first emission layer 621 of the red subpixel R-sub may be 65 nm to 105 nm, but embodiments of the present disclosure are not limited thereto. For example, the sum of the thickness of the hole injection layer 611 and the thickness of the first emission layer 627 of the white subpixel W-sub may be 25 nm to 50 nm, but embodiments of the present disclosure are not limited thereto.

According to an embodiment of the present disclosure, a sum of a thickness of the hole injection layer 611 and a thickness of the first emission layer 623 of the green subpixel G-sub may be different from a sum of a thickness of the hole injection layer 611 and a thickness of the first emission layer 625 of the blue subpixel B-sub. For example, the sum of the thickness of the hole injection layer 611 and the thickness of the first emission layer 623 of the green subpixel G-sub may be smaller than the sum of the thickness of the hole injection layer 611 and the thickness of the first emission layer 625 of the blue subpixel B-sub. For example, the sum of the thickness of the hole injection layer 611 and the thickness of the first emission layer 623 of the green subpixel G-sub may be 20 nm to 50 nm, but embodiments of the present disclosure are not limited thereto. For example, the sum of the thickness of the hole injection layer 611 and the thickness of the first emission layer 625 of the blue subpixel B-sub may be 40 nm to 80 nm, but embodiments of the present disclosure are not limited thereto.

According to an embodiment of the present disclosure, a sum of a thickness of the hole injection layer 611 and a thickness of the first emission layer 623 of the green subpixel G-sub may be equal to or different from a sum of a thickness of the hole injection layer 611 and a thickness of the first emission layer 627 of the white subpixel W-sub. For example, the sum of the thickness of the hole injection layer 611 and the thickness of the first emission layer 623 of the green subpixel G-sub may be smaller than or equal to the sum of the thickness of the hole injection layer 611, a thickness of the first hole transport layer 613, and the thickness of the first emission layer 627 of the white subpixel W-sub. For example, the sum of the thickness of the hole injection layer 611 and the thickness of the first emission layer 623 of the green subpixel G-sub may be 20 nm to 50 nm, but embodiments of the present disclosure are not limited thereto. For example, the sum of the thickness of the hole injection layer 611 and the thickness of the first emission layer 627 of the white subpixel W-sub may be 25 nm to 50 nm, but embodiments of the present disclosure are not limited thereto.

According to an embodiment of the present disclosure, a sum of a thickness of the hole injection layer 611 and a thickness of the first emission layer 625 of the blue subpixel B-sub may be different from a sum of a thickness of the hole injection layer 611 and a thickness of the first emission layer 627 of the white subpixel W-sub. For example, the sum of the thickness of the hole injection layer 611 and the thickness of the first emission layer 625 of the blue subpixel B-sub may be greater than the sum of the thickness of the hole injection layer 611 and the thickness of the first emission layer 627 of the white subpixel W-sub. For example, the sum of the thickness of the hole injection layer 611 and the thickness of the first emission layer 625 of the blue subpixel B-sub may be 40 nm to 80 nm, but embodiments of the present disclosure are not limited thereto. For example, the sum of the thickness of the hole injection layer 611 and the thickness of the first emission layer 627 of the white subpixel W-sub may be 25 nm to 50 nm, but embodiments of the present disclosure are not limited thereto.

According to an embodiment of the present disclosure, a sum of a thickness of the hole injection layer 611 and a thickness of the first emission layer 621 of the red subpixel R-sub may be different from a sum of a thickness of the hole injection layer 611 and a thickness of the first emission layer 625 of the blue subpixel B-sub and a sum of a thickness of the hole injection layer 611 and a thickness of the first emission layer 623 of the green subpixel G-sub. For example, the sum of the thickness of the hole injection layer 611 and the thickness of the first emission layer 621 of the red subpixel R-sub may be greater than the sum of the thickness of the hole injection layer 611 and the thickness of the first emission layer 625 of the blue subpixel B-sub and the sum of the thickness of the hole injection layer 611 and the thickness of the first emission layer 623 of the green subpixel G-sub. For example, the sum of the thickness of the hole injection layer 611 and the thickness of the first emission layer 621 of the red subpixel R-sub may be greater than the sum of the thickness of the hole injection layer 611 and the thickness of the first emission layer 625 of the blue subpixel B-sub. For example, the sum of the thickness of the hole injection layer 611 and the thickness of the first emission layer 621 of the red subpixel R-sub may be greater than the sum of the thickness of the hole injection layer 611 and the thickness of the first emission layer 623 of the green subpixel G-sub. For example, the sum of the thickness of the hole injection layer 611 and the thickness of the first emission layer 621 of the red subpixel R-sub may be 65 nm to 105 nm, but embodiments of the present disclosure are not limited thereto. For example, the sum of the thickness of the hole injection layer 611 and the thickness of the first emission layer 625 of the blue subpixel B-sub may be 40 nm to 80 nm, but embodiments of the present disclosure are not limited thereto. For example, the sum of the thickness of the hole injection layer 611 and the thickness of the first emission layer 623 of the green subpixel G-sub may be 20 nm to 50 nm, but embodiments of the present disclosure are not limited thereto.

According to an embodiment of the present disclosure, a sum of a thickness of the hole injection layer 611 and a thickness of the first emission layer 621 of the red subpixel R-sub may be different from a sum of a thickness of the hole injection layer 611 and a thickness of the first emission layer 625 of the blue subpixel B-sub, a sum of a thickness of the hole injection layer 611 and a thickness of the first emission layer 627 of the white subpixel W-sub, and a sum of a thickness of the hole injection layer 611 and a thickness of the first emission layer 623 of the green subpixel G-sub. For example, the sum of the thickness of the hole injection layer 611 and the thickness of the first emission layer 621 of the red subpixel R-sub may be greater than the sum of the thickness of the hole injection layer 611 and the thickness of the first emission layer 625 of the blue subpixel B-sub, the sum of the thickness of the hole injection layer 611 and the thickness of the first emission layer 627 of the white subpixel W-sub, and the sum of the thickness of the hole injection layer 611 and the thickness of the first emission layer 623 of the green subpixel G-sub. For example, the sum of the thickness of the hole injection layer 611 and the thickness of the first emission layer 621 of the red subpixel R-sub may be greater than the sum of the thickness of the hole injection layer 611 and the thickness of the first emission layer 625 of the blue subpixel B-sub. For example, the sum of the thickness of the hole injection layer 611 and the thickness of the first emission layer 625 of the blue subpixel B-sub may be greater than the sum of the thickness of the hole injection layer 611 and the thickness of the first emission layer 627 of the white subpixel W-sub. For example, the sum of the thickness of the hole injection layer 611 and the thickness of the first emission layer 627 of the white subpixel W-sub may be greater than or equal to the sum of the thickness of the hole injection layer 611 and the thickness of the first emission layer 623 of the green subpixel G-sub. For example, the sum of the thickness of the hole injection layer 611 and the thickness of the first emission layer 621 of the red subpixel R-sub may be 65 nm to 105 nm, but embodiments of the present disclosure are not limited thereto. For example, the sum of the thickness of the hole injection layer 611 and the thickness of the first emission layer 625 of the blue subpixel B-sub may be 40 nm to 80 nm, but embodiments of the present disclosure are not limited thereto. For example, the sum of the thickness of the hole injection layer 611 and the thickness of the first emission layer 627 of the white subpixel W-sub may be 25 nm to 50 nm, but embodiments of the present disclosure are not limited thereto. For example, the sum of the thickness of the hole injection layer 611 and the thickness of the first emission layer 623 of the green subpixel G-sub may be 20 nm to 50 nm, but embodiments of the present disclosure are not limited thereto.

According to an embodiment of the present disclosure, a sum of a thickness of the hole injection layer 611, a thickness of the first hole transport layer 613, and a thickness of the first emission layer may be different for each subpixel. For example, a sum of a thickness of the hole injection layer 611, a thickness of the first hole transport layer 613, and a thickness of the first emission layer 621 of the red subpixel R-sub may be different from a sum of a thickness of the hole injection layer 611, a thickness of the first hole transport layer 613, and a thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be 75 nm to 120 nm, but embodiments of the present disclosure are not limited thereto. For example, the sum of the thickness of the hole injection layer 611, the thickness of the first hole transport layer 613, and the thickness of the first emission layer 623 of the green subpixel G-sub may be 30 nm to 65 nm, but embodiments of the present disclosure are not limited thereto.

According to an embodiment of the present disclosure, a sum of a thickness of the hole injection layer 611, a thickness of the first hole transport layer 613, and a thickness of the first emission layer 621 of the red subpixel R-sub may be different from a sum of a thickness of the hole injection layer 611, a thickness of the first hole transport layer 613, and a thickness of the first emission layer 625 of the blue subpixel B-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 625 of the blue subpixel B-sub. For example, the sum of the thickness of the hole injection layer 611, the thickness of the first hole transport layer 613, and the thickness of the first emission layer 621 of the red subpixel R-sub may be 75 nm to 120 nm, but embodiments of the present disclosure are not limited thereto. For example, the sum of the thickness of the hole injection layer 611, the thickness of the first hole transport layer 613, and the thickness of the first emission layer 625 of the blue subpixel B-sub may be 50 nm to 95 nm, but embodiments of the present disclosure are not limited thereto.

According to an embodiment of the present disclosure, a sum of a thickness of the hole injection layer 611, a thickness of the first hole transport layer 613, and a thickness of the first emission layer 621 of the red subpixel R-sub may be different from a sum of a thickness of the hole injection layer 611, a thickness of the first hole transport layer 613, and a thickness of the first emission layer 627 of the white subpixel W-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 627 of the white subpixel W-sub. For example, the sum of the thickness of the hole injection layer 611, the thickness of the first hole transport layer 613, and the thickness of the first emission layer 621 of the red subpixel R-sub may be 75 nm to 120 nm, but embodiments of the present disclosure are not limited thereto. For example, the sum of the thickness of the hole injection layer 611, the thickness of the first hole transport layer 613, and the thickness of the first emission layer 627 of the white subpixel W-sub may be 35 nm to 65 nm, but embodiments of the present disclosure are not limited thereto.

According to an embodiment of the present disclosure, a sum of a thickness of the hole injection layer 611, a thickness of the first hole transport layer 613, and a thickness of the first emission layer 623 of the green subpixel G-sub may be different from a sum of a thickness of the hole injection layer 611, a thickness of the first hole transport layer 613, and a thickness of the first emission layer 625 of the blue subpixel B-sub. For example, the sum of the thickness of the hole injection layer 611, the thickness of the first hole transport layer 613, and the thickness of the first emission layer 623 of the green subpixel G-sub may be smaller than the sum of the thickness of the hole injection layer 611, the thickness of the first hole transport layer 613, and the thickness of the first emission layer 625 of the blue subpixel B-sub. For example, the sum of the thickness of the hole injection layer 611, the thickness of the first hole transport layer 613, and the thickness of the first emission layer 623 of the green subpixel G-sub may be 30 nm to 65 nm, but embodiments of the present disclosure are not limited thereto. For example, the sum of the thickness of the hole injection layer 611, the thickness of the first hole transport layer 613, and the thickness of the first emission layer 625 of the blue subpixel B-sub may be 50 nm to 95 nm, but embodiments of the present disclosure are not limited thereto.

According to an embodiment of the present disclosure, a sum of a thickness of the hole injection layer 611, a thickness of the first hole transport layer 613, and a thickness of the first emission layer 623 of the green subpixel G-sub may be equal to or different from a sum of a thickness of the hole injection layer 611, a thickness of the first hole transport layer 613, and a thickness of the first emission layer 627 of the white subpixel W-sub. For example, the sum of the thickness of the hole injection layer 611, the thickness of the first hole transport layer 613, and the thickness of the first emission layer 623 of the green subpixel G-sub may be smaller than or equal to the sum of the thickness of the hole injection layer 611, the thickness of the first hole transport layer 613, and the thickness of the first emission layer 627 of the white subpixel W-sub. For example, the sum of the thickness of the hole injection layer 611, the thickness of the first hole transport layer 613, and the thickness of the first emission layer 623 of the green subpixel G-sub may be 30 nm to 65 nm, but embodiments of the present disclosure are not limited thereto. For example, the sum of the thickness of the hole injection layer 611, the thickness of the first hole transport layer 613, and the thickness of the first emission layer 627 of the white subpixel W-sub may be 35 nm to 65 nm, but embodiments of the present disclosure are not limited thereto.

According to an embodiment of the present disclosure, a sum of a thickness of the hole injection layer 611, a thickness of the first hole transport layer 613, and a thickness of the first emission layer 625 of the blue subpixel B-sub may be different from a sum of a thickness of the hole injection layer 611, a thickness of the first hole transport layer 613, and a thickness of the first emission layer 627 of the white subpixel W-sub. For example, the sum of the thickness of the hole injection layer 611, the thickness of the first hole transport layer 613, and the thickness of the first emission layer 625 of the blue subpixel B-sub may be greater than the sum of the thickness of the hole injection layer 611, the thickness of the first hole transport layer 613, and the thickness of the first emission layer 627 of the white subpixel W-sub. For example, the sum of the thickness of the hole injection layer 611, the thickness of the first hole transport layer 613, and the thickness of the first emission layer 625 of the blue subpixel B-sub may be 50 nm to 95 nm, but embodiments of the present disclosure are not limited thereto. For example, the sum of the thickness of the hole injection layer 611, the thickness of the first hole transport layer 613, and the thickness of the first emission layer 627 of the white subpixel W-sub may be 35 nm to 65 nm, but embodiments of the present disclosure are not limited thereto.

According to an embodiment of the present disclosure, a sum of a thickness of the hole injection layer 611, a thickness of the first hole transport layer 613, and a thickness of the first emission layer 621 of the red subpixel R-sub may be different from a sum of a thickness of the hole injection layer 611, a thickness of the first hole transport layer 613, and a thickness of the first emission layer 625 of the blue subpixel B-sub and a sum of a thickness of the hole injection layer 611, a thickness of the first hole transport layer 613, and a thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 625 of the blue subpixel B-sub and the sum of the thickness of the hole injection layer 611, the thickness of the first hole transport layer 613, and the thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 625 of the blue subpixel B-sub. For example, the sum of the thickness of the hole injection layer 611, the thickness of the first hole transport layer 613, and the thickness of the first emission layer 625 of the blue subpixel B-sub may be greater than the sum of the thickness of the hole injection layer 611, the thickness of the first hole transport layer 613, and the thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be 75 nm to 120 nm, but embodiments of the present disclosure are not limited thereto. For example, the sum of the thickness of the hole injection layer 611, the thickness of the first hole transport layer 613, and the thickness of the first emission layer 625 of the blue subpixel B-sub may be 50 nm to 95 nm, but embodiments of the present disclosure are not limited thereto. For example, the sum of the thickness of the hole injection layer 611, the thickness of the first hole transport layer 613, and the thickness of the first emission layer 623 of the green subpixel G-sub may be 30 nm to 65 nm, but embodiments of the present disclosure are not limited thereto.

According to an embodiment of the present disclosure, a sum of a thickness of the hole injection layer 611, a thickness of the first hole transport layer 613, and a thickness of the first emission layer 621 of the red subpixel R-sub may be different from a sum of a thickness of the hole injection layer

611, a thickness of the first hole transport layer 613, and a thickness of the first emission layer 625 of the blue subpixel B-sub, a sum of a thickness of the hole injection layer 611, a thickness of the first hole transport layer 613, and a thickness of the first emission layer 627 of the white subpixel W-sub, and a sum of a thickness of the hole injection layer 611, a thickness of the first hole transport layer 613, and a thickness of the first emission layer 623 of the green subpixel G-sub. For example, the sum of the thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 625 of the blue subpixel B-sub, the sum of the thickness of the hole injection layer 611, the thickness of the first hole transport layer 613, and the thickness of the first emission layer 627 of the white subpixel W-sub, and the sum of a thickness of the hole injection layer 611, the thickness of the first hole transport layer 613, and the thickness of the first emission layer 623 of the green subpixel G-sub. For example, the sum of a thickness of the hole injection layer 611, the thickness of the first hole transport layer 613, and the thickness of the first emission layer 621 of the red subpixel R-sub may be greater than the sum of the thickness of the hole injection layer 611, the thickness of the first hole transport layer 613, and the thickness of the first emission layer 625 of the blue subpixel B-sub. For example, the sum of the thickness of the hole injection layer 611, the thickness of the first hole transport layer 613, and the thickness of the first emission layer 625 of the blue subpixel B-sub may be greater than the sum of the thickness of the hole injection layer 611, the thickness of the first hole transport layer 613, and the thickness of the first emission layer 627 of the white subpixel W-sub. For example, the sum of the thickness of the hole injection layer 611, the thickness of the first hole transport layer 613, and the thickness of the first emission layer 627 of the white subpixel W-sub may be greater than or equal to the sum of a thickness of the hole injection layer 611, the thickness of the first hole transport layer 613, and the thickness of the first emission layer 623 of the green subpixel G-sub. For example, the sum of a thickness of the hole injection layer 611, the thickness of the first hole transport layer 613, and the thickness of the first emission layer 621 of the red subpixel R-sub may be 75 nm to 120 nm, but embodiments of the present disclosure are not limited thereto. For example, the sum of the thickness of the hole injection layer 611, the thickness of the first hole transport layer 613, and the thickness of the first emission layer 625 of the blue subpixel B-sub may be 50 nm to 95 nm, but embodiments of the present disclosure are not limited thereto. For example, the sum of the thickness of the hole injection layer 611, the thickness of the first hole transport layer 613, and the thickness of the first emission layer 627 of the white subpixel W-sub may be 35 nm to 65 nm, but embodiments of the present disclosure are not limited thereto. For example, the sum of a thickness of the hole injection layer 611, the thickness of the first hole transport layer 613, and the thickness of the first emission layer 623 of the green subpixel G-sub may be 30 nm to 65 nm, but embodiments of the present disclosure are not limited thereto.

According to an embodiment of the present disclosure, the first electron transport layer 631 may be disposed on the first emission layer. For example, the first electron transport layer 631 may be at the red subpixel R-sub, the green subpixel G-sub, and the blue subpixel B-sub. For example, the first electron transport layer 631 may be at the red subpixel R-sub, the green subpixel G-sub, the blue subpixel B-sub, and the white subpixel W-sub. For example, the first electron transport layer 631 may be disposed on the first emission layer of the red subpixel R-sub, the green subpixel G-sub, the blue subpixel B-sub, and the white subpixel W-sub. The first electron transport layer 631 may be the same as the first electron transport layer 631 described above with reference to FIG. 4, and thus, a description thereof may be omitted.

The first electron transport layer 631 may be formed by a deposition process. For example, the first electron transport layer 631 may be conformally formed along surfaces of the first emission layers 621, 623, 625, and 627. For example, the first electron transport layer 631 may be formed to correspond to a cross-sectional profile of each of the first emission layers 621, 623, 625, and 627. For example, a surface shape of the first electron transport layer 631 may be formed based on a surface shape of each of the first emission layers 621, 623, 625, and 627.

According to an embodiment of the present disclosure, the first electron transport layer 631 may be formed to have an equal thickness or different thicknesses for each subpixel, but embodiments of the present disclosure are not limited thereto. For example, a thickness of the first electron transport layer 631 may be 15 nm to 20 nm, but embodiments of the present disclosure are not limited thereto. For example, a thickness of the first electron transport layer 631 may be equal to or different from a thickness of the first hole transport layer 613. For example, a thickness of the first electron transport layer 631 may be greater than or equal to a thickness of the first hole transport layer 613.

The first electron transport layer 631 may easily transfer an electron, supplied from the second electrode 505, to the emission layer. An exciton may be generated from a hole and an electron supplied from the emission layer, and thus, the emission layer may emit light. The first electron transport layer 631 may include the same material as the material described above with reference to FIG. 4, but embodiments of the present disclosure are not limited thereto.

According to an embodiment of the present disclosure, a sum of a thickness of the hole injection layer 611, a thickness of the first emission layer, and a thickness of the first electron transport layer 631 may be different for each subpixel. For example, a sum of a thickness of the hole injection layer 611, a thickness of the first emission layer 621, and a thickness of the first electron transport layer 631 of the red subpixel R-sub may be different from a sum of a thickness of the hole injection layer 611, a thickness of the first emission layer 623, and a thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 623, and the thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be 80 nm to 125 nm, but embodiments of the present disclosure are not limited thereto. For example, the sum of the thickness of the hole injection layer 611, the thickness of the first emission layer 623, and the thickness of the first electron transport layer 631 of the green subpixel G-sub may be 35 nm to 70 nm, but embodiments of the present disclosure are not limited thereto.

According to an embodiment of the present disclosure, a sum of a thickness of the hole injection layer 611, a thickness of the first emission layer 621, and a thickness of the first electron transport layer 631 of the red subpixel R-sub may be different from a sum of a thickness of the hole injection layer 611, a thickness of the first emission layer 625, and a thickness of the first electron transport layer 631 of the blue subpixel B-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 625, and the thickness of the first electron transport layer 631 of the blue subpixel B-sub. For example, the sum of the thickness of the hole injection layer 611, the thickness of the first emission layer 621, and the thickness of the first electron transport layer 631 of the red subpixel R-sub may be 80 nm to 125 nm, but embodiments of the present disclosure are not limited thereto. For example, the sum of the thickness of the hole injection layer 611, the thickness of the first emission layer 625, and the thickness of the first electron transport layer 631 of the blue subpixel B-sub may be 55 nm to 100 nm, but embodiments of the present disclosure are not limited thereto.

According to an embodiment of the present disclosure, a sum of a thickness of the hole injection layer 611, a thickness of the first emission layer 621, and a thickness of the first electron transport layer 631 of the red subpixel R-sub may be different from a sum of a thickness of the hole injection layer 611, a thickness of the first emission layer 627, and a thickness of the first electron transport layer 631 of the white subpixel W-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 627, and the thickness of the first electron transport layer 631 of the white subpixel W-sub. For example, the sum of the thickness of the hole injection layer 611, the thickness of the first emission layer 621, and the thickness of the first electron transport layer 631 of the red subpixel R-sub may be 80 nm to 125 nm, but embodiments of the present disclosure are not limited thereto. For example, the sum of the thickness of the hole injection layer 611, the thickness of the first emission layer 627, and the thickness of the first electron transport layer 631 of the white subpixel W-sub may be 40 nm to 70 nm, but embodiments of the present disclosure are not limited thereto.

According to an embodiment of the present disclosure, a sum of a thickness of the hole injection layer 611, a thickness of the first emission layer 623, and a thickness of the first electron transport layer 631 of the green subpixel G-sub may be different from a sum of a thickness of the hole injection layer 611, a thickness of the first emission layer 625, and a thickness of the first electron transport layer 631 of the blue subpixel B-sub. For example, the sum of the thickness of the hole injection layer 611, the thickness of the first emission layer 625, and the thickness of the first electron transport layer 631 of the green subpixel G-sub may be smaller than the sum of the thickness of the hole injection layer 611, the thickness of the first emission layer 625, and the thickness of the first electron transport layer 631 of the blue subpixel B-sub. For example, the sum of the thickness of the hole injection layer 611, the thickness of the first emission layer 623, and the thickness of the first electron transport layer 631 of the green subpixel G-sub may be 35 nm to 70 nm, but embodiments of the present disclosure are not limited thereto. For example, the sum of the thickness of the hole injection layer 611, the thickness of the first emission layer 625, and the thickness of the first electron transport layer 631 of the blue subpixel B-sub may be 55 nm to 100 nm, but embodiments of the present disclosure are not limited thereto.

According to an embodiment of the present disclosure, a sum of a thickness of the hole injection layer 611, a thickness of the first emission layer 623, and a thickness of the first electron transport layer 631 of the green subpixel G-sub may be equal to or different from a sum of a thickness of the hole injection layer 611, a thickness of the first emission layer 627, and a thickness of the first electron transport layer 631 of the white subpixel W-sub. For example, the sum of the thickness of the hole injection layer 611, the thickness of the first emission layer 623, and the thickness of the first electron transport layer 631 of the green subpixel G-sub may be smaller than or equal to the sum of the thickness of the hole injection layer 611, the thickness of the first emission layer 627, and the thickness of the first electron transport layer 631 of the white subpixel W-sub. For example, the sum of the thickness of the hole injection layer 611, the thickness of the first emission layer 623, and the thickness of the first electron transport layer 631 of the green subpixel G-sub may be 35 nm to 70 nm, but embodiments of the present disclosure are not limited thereto. For example, the sum of the thickness of the hole injection layer 611, the thickness of the first emission layer 627, and the thickness of the first electron transport layer 631 of the white subpixel W-sub may be 40 nm to 70 nm, but embodiments of the present disclosure are not limited thereto.

According to an embodiment of the present disclosure, a sum of a thickness of the hole injection layer 611, a thickness of the first emission layer 625, and a thickness of the first electron transport layer 631 of the blue subpixel B-sub may be different from a sum of a thickness of the hole injection layer 611, a thickness of the first emission layer 627, and a thickness of the first electron transport layer 631 of the white subpixel W-sub. For example, the sum of the thickness of the hole injection layer 611, the thickness of the first emission layer 625, and the thickness of the first electron transport layer 631 of the blue subpixel B-sub may be greater than the sum of the thickness of the hole injection layer 611, the thickness of the first emission layer 627, and the thickness of the first electron transport layer 631 of the white subpixel W-sub. For example, the sum of the thickness of the hole injection layer 611, the thickness of the first emission layer 625, and the thickness of the first electron transport layer 631 of the blue subpixel B-sub may be 55 nm to 100 nm, but embodiments of the present disclosure are not limited thereto. For example, the sum of the thickness of the hole injection layer 611, the thickness of the first emission layer 627, and the thickness of the first electron transport layer 631 of the white subpixel W-sub may be 40 nm to 70 nm, but embodiments of the present disclosure are not limited thereto.

According to an embodiment of the present disclosure, a sum of a thickness of the hole injection layer 611, a thickness of the first emission layer 621, and a thickness of the first electron transport layer 631 of the red subpixel R-sub may be different from a sum of a thickness of the hole injection layer 611, a thickness of the first emission layer 621, and a thickness of the first electron transport layer 631 of the blue subpixel B-sub and a sum of a thickness of the hole injection layer 611, a thickness of the first emission layer 623, and a thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 625, and the thickness of the first electron transport layer 631 of the blue subpixel B-sub and the sum of the thickness of the hole injection layer 611, the thickness of the first emission layer 623, and the thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 625, and the thickness of the first electron transport layer 631 of the blue subpixel B-sub. For example, the sum of the thickness of the hole injection layer 611, the thickness of the first emission layer 625, and the thickness of the first electron transport layer 631 of the blue subpixel B-sub may be greater than the sum of the thickness of the hole injection layer 611, the thickness of the first emission layer 623, and the thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be 80 nm to 125 nm, but embodiments of the present disclosure are not limited thereto. For example, the sum of the thickness of the hole injection layer 611, the thickness of the first emission layer 625, and the thickness of the first electron transport layer 631 of the blue subpixel B-sub may be 55 nm to 100 nm, but embodiments of the present disclosure are not limited thereto. For example, the sum of the thickness of the hole injection layer 611, the thickness of the first emission layer 623, and the thickness of the first electron transport layer 631 of the green subpixel G-sub may be 35 nm to 70 nm, but embodiments of the present disclosure are not limited thereto.

According to an embodiment of the present disclosure, a sum of a thickness of the hole injection layer 611, a thickness of the first emission layer 621, and a thickness of the first electron transport layer 631 of the red subpixel R-sub may be different from a sum of a thickness of the hole injection layer 611, a thickness of the first emission layer 625, and a thickness of the first electron transport layer 631 of the blue subpixel B-sub, a sum of a thickness of the hole injection layer 611, a thickness of the first emission layer 627, and a thickness of the first electron transport layer 631 of the white subpixel W-sub, and a sum of a thickness of the hole injection layer 611, a thickness of the first emission layer 623, and a thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 625, and the thickness of the first electron transport layer 631 of the blue subpixel B-sub, the sum of the thickness of the hole injection layer 611, the thickness of the first emission layer 627, and the thickness of the first electron transport layer 631 of the white subpixel W-sub, and the sum of the thickness of the hole injection layer 611, the thickness of the first emission layer 623, and the thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be greater than the sum of the thickness of the hole injection layer 611, the thickness of the first emission layer 625, and the thickness of the first electron transport layer 631 of the blue subpixel B-sub. For example, the sum of the thickness of the hole injection layer 611, the thickness of the first emission layer 625, and the thickness of the first electron transport layer 631 of the blue subpixel B-sub may be greater than the sum of the thickness of the hole injection layer 611, the thickness of the first emission layer 627, and the thickness of the first electron transport layer 631 of the white subpixel W-sub. For example, the sum of the thickness of the hole injection layer 611, the thickness of the first emission layer 627, and the thickness of the first electron transport layer 631 of the white subpixel W-sub may be greater than the sum of the thickness of the hole injection layer 611, the thickness of the first emission layer 623, and the thickness of the first electron transport layer 631 of the green subpixel G-sub. For example, the sum of the thickness of the hole injection layer 611, the thickness of the first emission layer 621, and the thickness of the first electron transport layer 631 of the red subpixel R-sub may be 80 nm to 125 nm, but embodiments of the present disclosure are not limited thereto. For example, the sum of the thickness of the hole injection layer 611, the thickness of the first emission layer 625, and the thickness of the first electron transport layer 631 of the blue subpixel B-sub may be 55 nm to 100 nm, but embodiments of the present disclosure are not limited thereto. For example, the sum of the thickness of the hole injection layer 611, the thickness of the first emission layer 627, and the thickness of the first electron transport layer 631 of the white subpixel W-sub may be 40 nm to 70 nm, but embodiments of the present disclosure are not limited thereto. For example, the sum of the thickness of the hole injection layer 611, the thickness of the first emission layer 623, and the thickness of the first electron transport layer 631 of the green subpixel G-sub may be 35 nm to 70 nm, but embodiments of the present disclosure are not limited thereto.

According to an embodiment of the present disclosure, a sum of a thickness of the hole injection layer 611, a thickness of the first hole transport layer 613, a thickness of the first emission layer, and a thickness of the first electron transport layer 631 may be different for each subpixel. For example, a sum of a thickness of the hole injection layer 611, a thickness of the first hole transport layer 613, a thickness of the first emission layer 621, and a thickness of the first electron transport layer 631 of the red subpixel R-sub may be different from a sum of a thickness of the hole injection layer 611, a thickness of the first hole transport layer 613, a thickness of the first emission layer 623, and a thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first electron emission layer 623, and the thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be 90 nm to 140 nm, but embodiments of the present disclosure are not limited thereto. For example, the sum of the thickness of the hole injection layer 611, the thickness of the first hole transport layer 613, the thickness of the first emission layer 623, and the thickness of the first electron transport layer 631 of the green subpixel G-sub may be 45 nm to 85 nm, but embodiments of the present disclosure are not limited thereto.

According to an embodiment of the present disclosure, a sum of a thickness of the hole injection layer 611, a thickness of the first hole transport layer 613, a thickness of the first emission layer 621, and a thickness of the first electron transport layer 631 of the red subpixel R-sub may be different from a sum of a thickness of the hole injection layer 611, a thickness of the first hole transport layer 613, a thickness of the first emission layer 625, and a thickness of the first electron transport layer 631 of the blue subpixel B-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 625, and the thickness of the first electron transport layer 631 of the blue subpixel B-sub. For example, the sum of the thickness of the hole injection layer 611, the thickness of the first hole transport layer 613, the thickness of the first emission layer 621, and the thickness of the first electron transport layer 631 of the red subpixel R-sub may be 90 nm to 140 nm, but embodiments of the present disclosure are not limited thereto. For example, the sum of the thickness of the hole injection layer 611, the thickness of the first hole transport layer 613, the thickness of the first emission layer 625, and the thickness of the first electron transport layer 631 of the blue subpixel B-sub may be 65 nm to 115 nm, but embodiments of the present disclosure are not limited thereto.

According to an embodiment of the present disclosure, a sum of a thickness of the hole injection layer 611, a thickness of the first hole transport layer 613, a thickness of the first emission layer 621, and a thickness of the first electron transport layer 631 of the red subpixel R-sub may be different from a sum of a thickness of the hole injection layer 611, a thickness of the first hole transport layer 613, a thickness of the first emission layer 627, and a thickness of the first electron transport layer 631 of the white subpixel W-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 627, and the thickness of the first electron transport layer 631 of the white subpixel W-sub. For example, the sum of the thickness of the hole injection layer 611, the thickness of the first hole transport layer 613, the thickness of the first emission layer 621, and the thickness of the first electron transport layer 631 of the red subpixel R-sub may be 90 nm to 140 nm, but embodiments of the present disclosure are not limited thereto. For example, the sum of the thickness of the hole injection layer 611, the thickness of the first hole transport layer 613, the thickness of the first emission layer 627, and the thickness of the first electron transport layer 631 of the white subpixel W-sub may be 50 nm to 85 nm, but embodiments of the present disclosure are not limited thereto.

According to an embodiment of the present disclosure, a sum of a thickness of the hole injection layer 611, a thickness of the first hole transport layer 613, a thickness of the first emission layer 623, and a thickness of the first electron transport layer 631 of the green subpixel G-sub may be different from a sum of a thickness of the hole injection layer 611, a thickness of the first hole transport layer 613, a thickness of the first emission layer 625, and a thickness of the first electron transport layer 631 of the blue subpixel B-sub. For example, the sum of the thickness of the hole injection layer 611, the thickness of the first hole transport layer 613, the thickness of the first emission layer 623, and the thickness of the first electron transport layer 631 of the green subpixel G-sub may be smaller than the sum of the thickness of the hole injection layer 611, the thickness of the first hole transport layer 613, the thickness of the first emission layer 625, and the thickness of the first electron transport layer 631 of the blue subpixel B-sub. For example, the sum of the thickness of the hole injection layer 611, the thickness of the first hole transport layer 613, the thickness of the first emission layer 623, and the thickness of the first electron transport layer 631 of the green subpixel G-sub may be 45 nm to 85 nm, but embodiments of the present disclosure are not limited thereto. For example, the sum of the thickness of the hole injection layer 611, the thickness of the first hole transport layer 613, the thickness of the first emission layer 625, and the thickness of the first electron transport layer 631 of the blue subpixel B-sub may be 65 nm to 114 nm, but embodiments of the present disclosure are not limited thereto.

According to an embodiment of the present disclosure, a sum of a thickness of the hole injection layer 611, a thickness of the first hole transport layer 613, a thickness of the first emission layer 623, and a thickness of the first electron transport layer 631 of the green subpixel G-sub may be equal to or different from a sum of a thickness of the hole injection layer 611, a thickness of the first hole transport layer 613, a thickness of the first emission layer 627, and a thickness of the first electron transport layer 631 of the white subpixel W-sub. For example, the sum of the thickness of the hole injection layer 611, the thickness of the first hole transport layer 613, the thickness of the first emission layer 623, and the thickness of the first electron transport layer 631 of the green subpixel G-sub may be smaller than or equal to the sum of the thickness of the hole injection layer 611, the thickness of the first hole transport layer 613, the thickness of the first emission layer 627, and the thickness of the first electron transport layer 631 of the white subpixel W-sub. For example, the sum of the thickness of the hole injection layer 611, the thickness of the first hole transport layer 613, the thickness of the first emission layer 623, and the thickness of the first electron transport layer 631 of the green subpixel G-sub may be 45 nm to 85 nm, but embodiments of the present disclosure are not limited thereto. For example, the sum of the thickness of the hole injection layer 611, the thickness of the first hole transport layer 613, the thickness of the first emission layer 627, and the thickness of the first electron transport layer 631 of the white subpixel W-sub may be 50 nm to 85 nm, but embodiments of the present disclosure are not limited thereto.

According to an embodiment of the present disclosure, a sum of a thickness of the hole injection layer 611, a thickness of the first hole transport layer 613, a thickness of the first emission layer 625, and a thickness of the first electron transport layer 631 of the blue subpixel B-sub may be different from a sum of a thickness of the hole injection layer 611, a thickness of the first hole transport layer 613, a thickness of the first emission layer 627, and a thickness of the first electron transport layer 631 of the white subpixel W-sub. For example, the sum of the thickness of the hole injection layer 611, the thickness of the first hole transport layer 613, the thickness of the first emission layer 625, and the thickness of the first electron transport layer 631 of the blue subpixel B-sub may be greater than the sum of the thickness of the hole injection layer 611, the thickness of the first hole transport layer 613, the thickness of the first emission layer 627, and the thickness of the first electron transport layer 631 of the white subpixel W-sub. For example, the sum of the thickness of the hole injection layer 611, the thickness of the first hole transport layer 613, the thickness of the first emission layer 625, and the thickness of the first electron transport layer 631 of the blue subpixel B-sub may be 65 nm to 115 nm, but embodiments of the present disclosure are not limited thereto. For example, the sum of the thickness of the hole injection layer 611, the thickness of the first hole transport layer 613, the thickness of the first emission layer 627, and the thickness of the first electron transport layer 631 of the white subpixel W-sub may be 50 nm to 85 nm, but embodiments of the present disclosure are not limited thereto.

According to an embodiment of the present disclosure, a sum of a thickness of the hole injection layer 611, a thickness of the first hole transport layer 613, a thickness of the first emission layer 621, and a thickness of the first electron transport layer 631 of the red subpixel R-sub may be different from a sum of a thickness of the hole injection layer 611, a thickness of the first hole transport layer 613, a thickness of the first emission layer 625, and a thickness of the first electron transport layer 631 of the blue subpixel B-sub and a sum of a thickness of the hole injection layer 611, a thickness of the first hole transport layer 613, a thickness of the first emission layer 623, and a thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 625, and the thickness of the first electron transport layer 631 of the blue subpixel B-sub and the sum of the thickness of the hole injection layer 611, the thickness of the first hole transport layer 613, the thickness of the first emission layer 623, and the thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 625, and the thickness of the first electron transport layer 631 of the blue subpixel B-sub. For example, the sum of the thickness of the hole injection layer 611, the thickness of the first hole transport layer 613, the thickness of the first emission layer 625, and the thickness of the first electron transport layer 631 of the blue subpixel B-sub may be greater than the sum of the thickness of the hole injection layer 611, the thickness of the first hole transport layer 613, the thickness of the first emission layer 623, and the thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be 90 nm to 140 nm, but embodiments of the present disclosure are not limited thereto. For example, the sum of the thickness of the hole injection layer 611, the thickness of the first hole transport layer 613, the thickness of the first emission layer 625, and the thickness of the first electron transport layer 631 of the blue subpixel B-sub may be 65 nm to 115 nm, but embodiments of the present disclosure are not limited thereto. For example, the sum of the thickness of the hole injection layer 611, the thickness of the first hole transport layer 613, the thickness of the first emission layer 623, and the thickness of the first electron transport layer 631 of the green subpixel G-sub may be 45 nm to 85 nm, but embodiments of the present disclosure are not limited thereto.

According to an embodiment of the present disclosure, a sum of a thickness of the hole injection layer 611, a thickness of the first hole transport layer 613, a thickness of the first emission layer 621, and a thickness of the first electron transport layer 631 of the red subpixel R-sub may be different from a sum of a thickness of the hole injection layer 611, a thickness of the first hole transport layer 613, a thickness of the first emission layer 625, and a thickness of the first electron transport layer 631 of the blue subpixel B-sub, a sum of a thickness of the hole injection layer 611, a thickness of the first hole transport layer 613, a thickness of the first emission layer 627, and a thickness of the first electron transport layer 631 of the white subpixel W-sub, and a sum of a thickness of the hole injection layer 611, a thickness of the first hole transport layer 613, a thickness of the first emission layer 623, and a thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 625, and the thickness of the first electron transport layer 631 of the blue subpixel B-sub, the sum of the thickness of the hole injection layer 611, the thickness of the first hole transport layer 613, the thickness of the first emission layer 627, and the thickness of the first electron transport layer 631 of the white subpixel W-sub, and the sum of the thickness of the hole injection layer 611, the thickness of the first hole transport layer 613, the thickness of the first emission layer 623, and the thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub may be greater than the sum of the thickness of the hole injection layer 611, the thickness of the first hole transport layer 613, the thickness of the first emission layer 625, and the thickness of the first electron transport layer 631 of the blue subpixel B-sub. For example, the sum of the thickness of the hole injection layer 611, the thickness of the first hole transport layer 613, the thickness of the first emission layer 625, and the thickness of the first electron transport layer 631 of the blue subpixel B-sub may be greater than the sum of the thickness of the hole injection layer 611, the thickness of the first hole transport layer 613, the thickness of the first emission layer 627, and the thickness of the first electron transport layer 631 of the white subpixel W-sub. For example, the sum of the thickness of the hole injection layer 611, the thickness of the first hole transport layer 613, the thickness of the first emission layer 627, and the thickness of the first electron transport layer 631 of the white subpixel W-sub may be greater than or equal to the sum of the thickness of the hole injection layer 611, the thickness of the first hole transport layer 613, the thickness of the first emission layer 623, and the thickness of the first electron transport layer 631 of the green subpixel G-sub. For example, the sum of the thickness of the hole injection layer 611, the thickness of the first hole transport layer 613, the thickness of the first emission layer 621, and the thickness of the first electron transport layer 631 of the red subpixel R-sub 90 nm to 140 nm, but embodiments of the present disclosure are not limited thereto. For example, the sum of the thickness of the hole injection layer 611, the thickness of the first hole transport layer 613, the thickness of the first emission layer 625, and the thickness of the first electron transport layer 631 of the blue subpixel B-sub 65 nm to 115 nm, but embodiments of the present disclosure are not limited thereto. For example, the sum of the thickness of the hole injection layer 611, the thickness of the first hole transport layer 613, the thickness of the first emission layer 627, and the thickness of the first electron transport layer 631 of the white subpixel W-sub may be 50 nm to 85 nm, but embodiments of the present disclosure are not limited thereto. For example, the sum of the thickness of the hole injection layer 611, the thickness of the first hole transport layer 613, the thickness of the first emission layer 623, and the thickness of the first electron transport layer 631 of the green subpixel G-sub may be 45 nm to 85 nm, but embodiments of the present disclosure are not limited thereto.

According to an embodiment of the present disclosure, the hole injection layer 611, the first hole transport layer 613, and the first emission layers 621, 623, 625, and 627 are formed by a solution process, and thus, a thickness of layers configuring the first emission part 2100 may be adjusted. For example, a thickness of the hole injection layer 611, the first hole transport layer 613, and the first emission layers 621, 623, 625, and 627 of the first emission part 2100 may be adjusted, and thus, a thickness of layers between the first electrode 501 and the second electrode 505 may be differently implemented for each subpixel. Therefore, a multi-cavity effect may be obtained based on a change in thickness of the layers between the first electrode 501 and the second electrode 505, and thus, the luminance and/or efficiency of the display apparatus 2 may be enhanced. For example, a thickness of the layers between the first electrode 501 and the second electrode 505 may be different for each subpixel, and different cavity characteristics for each subpixel may be obtained based on a change in thickness of the layers between the first electrode 501 and the second electrode 505. Accordingly, the display apparatus 2 may be provided where efficiency is improved and a current is reduced for each subpixel.

According to an embodiment of the present disclosure, a second emission part 2200 may be disposed on the first emission part 2100. The second emission part 2200 may be at the red subpixel R-sub, the green subpixel G-sub, and the blue subpixel B-sub. For example, the second emission part 2200 may be at the red subpixel R-sub, the green subpixel G-sub, the blue subpixel B-sub, and the white subpixel W-sub. Layers of the second emission part 2200 may be formed by a deposition process. For example, layers of the second emission part 2200 may be conformally formed along surfaces of the first emission layers 621, 623, 625, and 627. For example, the layers of the second emission part 2200 may be formed to correspond to a cross-sectional profile of the first emission layers 621, 623, 625, and 627. For example, a surface shape of the layers of the second emission part 2200 may be based on a surface shape of the first emission layers 621, 623, 625, and 627. For example, the second emission part 2200 may include a hole functional layer, an emission layer, and an electron functional layer, but embodiments of the present disclosure are not limited thereto. For example, the second emission part 2200 may include a second hole transport layer 713, at least one or more emission layers, and a second electron transport layer 731, but embodiments of the present disclosure are not limited thereto. The at least one or more emission layers may include a second emission layer 721 and a third emission layer 723. For example, the second emission layer 721 and the third emission layer 723 may be disposed at the red subpixel R-sub, the green subpixel G-sub, the blue subpixel B-sub, and the white subpixel W-sub. A description of the second emission part 2200 may be substantially the same as the description of the second emission part 1200 described above with reference to FIG. 4, and thus, a description thereof is omitted.

A first charge generating layer may be provided between the first emission part 2100 and the second emission part 2200. For example, the first charge generating layer may be at the red subpixel R-sub, the green subpixel G-sub, and the blue subpixel B-sub. For example, the first charge generating layer may be at the red subpixel R-sub, the green subpixel G-sub, the blue subpixel B-sub, and the white subpixel W-sub. The first charge generating layer may be formed by a deposition process. For example, the first charge generating layer may be conformally formed along a surface shape of the first emission layers 621, 623, 625, and 627. For example, the first charge generating layer may be formed to correspond to a cross-sectional profile of the first emission layers 621, 623, 625, and 627. For example, a surface shape of the first charge generating layer may be based on a surface shape of the first emission layers 621, 623, 625, and 627. The first charge generating layer may include a first N-type charge generating layer 641 and a first P-type charge generating layer 642. For example, the second hole transport layer 713 may be disposed on the first P-type charge generating layer 642. A description of the first charge generating layer may be substantially the same as the description of the first charge generating layer described above with reference to FIG. 4, and thus, a description thereof is omitted.

According to an embodiment of the present disclosure, a third emission part 2300 may be disposed on the second emission part 2300. The third emission part 2300 may be at the red subpixel R-sub, the green subpixel G-sub, and the blue subpixel B-sub. For example, the third emission part 2300 may be at the red subpixel R-sub, the green subpixel G-sub, the blue subpixel B-sub, and the white subpixel W-sub. Layers of the third emission part 2300 may be formed by a deposition process. For example, the third emission part 2300 may be conformally formed along the surface shape of the first emission layers 621, 623, 625, and 627. For example, the layers of the third emission part 2300 may be formed to correspond to a cross-sectional profile of the first emission layers 621, 623, 625, and 627. For example, a surface shape of the third emission part 1300 may be based on surface shapes of the first emission layers

621, 623, 625, and 627. For example, the third emission part 2300 may include a hole functional layer, an emission layer, and an electron functional layer, but embodiments of the present disclosure are not limited thereto. For example, the third emission part 2300 may include at least one or more hole transport layers, a fourth emission layer 821, and a third electron transport layer 831, but embodiments of the present disclosure are not limited thereto. The at least one or more hole transport layer may include a third hole transfer layer 813 and a fourth hole transfer layer 815, but embodiments of the present disclosure are not limited thereto. For example, the fourth emission layer 821 may be disposed on the red subpixel R-sub, the green subpixel G-sub, the blue subpixel B-sub, and the white subpixel W-sub. A description of the third emission part 2300 may be substantially the same as the description of the third emission part 1300 described above with reference to FIG. 4, and thus, a description thereof is omitted.

A second charge generating layer may be provided between the second emission part 2200 and the third emission part 2300. The second charge generating layer may be at the red subpixel R-sub, the green subpixel G-sub, and the blue subpixel B-sub. For example, the second charge generating layer may be at the red subpixel R-sub, the green subpixel G-sub, the blue subpixel B-sub, and the white subpixel W-sub. The second charge generating layer may be formed by a deposition process. For example, the second charge generating layer may be conformally formed along a surface shape of the first emission layers 621, 623, 625, and 627. For example, the second charge generating layer may be formed to correspond to a cross-sectional profile of the first emission layers 621, 623, 625, and 627. For example, a surface shape of the second charge generating layer may be based on a surface shape of the first emission layers 621, 623, 625, and 627. The second charge generating layer may include a second N-type charge generating layer 741 and a second P-type charge generating layer 742. For example, the third hole transport layer 813 may be disposed on the second P-type charge generating layer 742. A description of the second charge generating layer may be substantially the same as the description of the second charge generating layer described above with reference to FIG. 4, and thus, a description thereof is omitted.

According to an embodiment of the present disclosure, surface shapes of the first charge generating layers 641 and 642, the second emission part 2200, the second charge generating layers 741 and 742, and the third emission part 2300 may be based on surface shapes of the first emission layers 621, 623, 625, and 627.

According to an embodiment of the present disclosure, an electron injection layer 811 may be further provided on the third emission part 2300. The electron injection layer 811 may be at the red subpixel R-sub, the green subpixel G-sub, and the blue subpixel B-sub. For example, the electron injection layer 811 may be at the red subpixel R-sub, the green subpixel G-sub, the blue subpixel B-sub, and the white subpixel W-sub. For example, the electron injection layer 811 may be disposed on the third hole transport layer 831. The electron injection layer 811 may be formed by a deposition process. For example, the electron injection layer 811 may be conformally formed along the surface of the first emission layers 621, 623, 625, and 627. For example, the electron injection layer 811 may be formed to correspond to a cross-sectional profile of the first emission layers 621, 623, 625, and 627. For example, a surface shape of the electron injection layer 811 may be based on the surface shape of the first emission layers 621, 623, 625, and 627. A second electrode 505 may be disposed on the electron injection layer 811. The second electrode 505 may be at the red subpixel R-sub, the green subpixel G-sub, and the blue subpixel B-sub. For example, the second electrode 505 may be at the red subpixel R-sub, the green subpixel G-sub, the blue subpixel B-sub, and the white subpixel W-sub. The second electrode 505 may be formed by a deposition process. For example, the second electrode 505 may be conformally formed along the surface of the first emission layers 621, 623, 625, and 627. For example, the second white color filter may be disposed to correspond to the white subpixel W-sub. Accordingly, the display apparatus may output light based on a wavelength which is selectively transmitted by the color filter.

The following Table 2 represents efficiency according to an experimental example and another embodiment of the present disclosure. The experimental example may be the same as the descriptions of Table 1, and thus, repeated descriptions thereof are omitted.

TABLE 2

| | | Experimental Example | | | | Embodiment | | | |
|---|---|---|---|---|---|---|---|---|---|
| | | R | G | B | W | R | G | B | W |
| Device | CIEx | 0.682 | 0.252 | 0.155 | 0.273 | 0.684 | 0.265 | 0.151 | 0.309 |
| Characteristic | CIEy | 0.316 | 0.715 | 0.042 | 0.285 | 0.314 | 0.707 | 0.043 | 0.315 |
| | Efficiency | 3.70 | 15.40 | 4.90 | 74.70 | 43.40 | 62.30 | 4.70 | 70.50 |
| Panel | Luminance | 5.40 | 13.30 | 0.80 | 48.60 | 3.10 | 15.10 | 1.80 | 48.10 |
| Characteristic | Current | 2.69 | 1.60 | 0.31 | 1.21 | 0.13 | 0.45 | 0.70 | 1.26 |
| | Panel Efficiency | 21.76 | | | | 49.48 | | | | electrode 505 may be formed to correspond to a cross-sectional profile of the first emission layers 621, 623, 625, and 627. For example, a surface shape of the second electrode 505 may be based on the surface shape of the first emission layers 621, 623, 625, and 627. A description of the electron injection layer 811 and the second electrode 505 may be substantially the same as the description of the electron injection layer 811 and the second electrode 505 described above with reference to FIG. 4, and thus, a description thereof is omitted.

According to an embodiment of the present disclosure, at least one or more emission part of the first emission part 2100, the second emission part 2200, and the third emission part 2300 may be formed by a process which differs from other one or more emission parts. For example, the first emission part 2100 may be formed by a solution process, and the second emission part 2200 and/or the third emission part 2300 may be formed by a deposition process. For example, the hole injection layer 611, the first hole transport layer 613, and the first emission layers 621, 623, 625, and 627 in the first emission part 2100 may be formed by a solution process. For example, the first electron transport layer 631, the first charge generating layers 641 and 642, the second emission part 2200, the second charge generating layers 741 and 742, the third emission part 2300, the electron injection layer 811, and the second electrode 505, which are at the first emission layers 621, 623, 625, and 627, may be formed by a deposition process.

According to an embodiment of the present disclosure, a surface shape of the first electron transport layer 631, the first charge generating layers 641 and 642, the second emission part 1200, the second charge generating layers 741 and 742, the third emission part 1300, the electron injection layer 811, and the second electrode 505 may be based on a surface shape of the first emission layers 621, 623, 625, and 627.

A color filter may be disposed on the second electrode 505. The color filter may include a red color filter, a green color filter, a blue color filter, and a white color filter. For example, the red color filter may be disposed to correspond to the red subpixel R-sub. For example, the green color filter may be disposed to correspond to the green subpixel G-sub. For example, the blue color filter may be disposed to correspond to the blue subpixel B-sub. For example, the In Table 2, in the device characteristic, color coordinates and efficiency have been measured. The device characteristic has been measured under a condition where a display apparatus is configured as in FIG. 5. The efficiency of an embodiment represents a relative value compared to the efficiency of the experimental example. Color coordinates of red of the experimental example have been measured to be (0.682, 0.316), and color coordinates of red of an embodiment have been measured to be (0.684, 0.314). Color coordinates of green of the experimental example have been measured to be (0.252, 0.715), and color coordinates of green of an embodiment have been measured to be (0.265, 0.707). Color coordinates of blue of the experimental example have been measured to be (0.155, 0.042), and color coordinates of blue of an embodiment have been measured to be (0.151, 0.043). Color coordinates of white of the experimental example have been measured to be (0.273, 0.285), and color coordinates of white of an embodiment have been measured to be (0.309, 0.315). Accordingly, it may be seen that an embodiment of the present disclosure has a color coordinate characteristic similar to the experimental example, or is enhanced in color coordinate characteristic of white. For example, it may be seen that an embodiment where a hole injection layer, a hole transport layer, and an emission layer are formed by a solution process has a color coordinate characteristic similar to the experimental example, or is enhanced in color coordinate characteristic of white.

An efficiency of red of the experimental example has been measured to be 3.70 cd/A, and the efficiency of red of an embodiment has been measured to be 43.40 cd/A. An efficiency of green of the experimental example has been measured to be 15.40 cd/A, and the efficiency of green of an embodiment has been measured to be 62.30 cd/A. An efficiency of blue of the experimental example has been measured to be 4.90 cd/A, and the efficiency of blue of an embodiment has been measured to be 4.70 cd/A. An efficiency of white of the experimental example has been measured to be 74.70 cd/A, and the efficiency of white of an embodiment has been measured to be 70.50 cd/A. Accordingly, it may be seen that an embodiment of the present disclosure is enhanced more in efficiency than the experimental example. For example, it may be seen that an embodiment of the present disclosure is enhanced more in red and green efficiency than the experimental example. For example, it may be seen that an embodiment where the hole injection layer, the hole transport layer, and an emission layer are formed by the solution process is enhanced more in red and green efficiency than the experimental example.

Table 2 shows that the luminance, the current, and the panel efficiency have been measured in a case where a display apparatus is driven based on a dynamic image. Luminance represents average luminance. The panel characteristic has been measured under a condition where the display apparatus of FIG. 3 is configured and the light emitting device layer 503 of FIG. 3 is configured as in FIG. 5.

The luminance of red of the experimental example has been measured to be 5.40 cd/m$^2$, and the luminance of red of an embodiment has been measured to be 3.10 cd/m$^2$. The luminance of green of the experimental example has been measured to be 13.30 cd/m$^2$, and the luminance of green of an embodiment has been measured to be 15.10 cd/m$^2$. The luminance of blue of the experimental example has been measured to be 0.80 cd/m$^2$, and the luminance of blue of an embodiment has been measured to be 1.80 cd/m$^2$. The luminance of white of the experimental example has been measured to be 48.60 cd/m$^2$, and the luminance of white of an embodiment has been measured to be 48.10 cd/m$^2$. For example, average luminance of red, green, blue, and white of the experimental example has been measured to be 68.10 cd/m$^2$, and average luminance of red, green, blue, and white of an embodiment has been measured to be 68.00 cd/m$^2$. Accordingly, it may be seen that an embodiment of the present disclosure has luminance similar to the experimental example. For example, it may be seen that an embodiment where the hole injection layer, the hole transport layer, and an emission layer are formed by the solution process has luminance similar to the experimental example.

The current of red of the experimental example has been measured to be 2.69 A, and the current of red of an embodiment has been measured to be 0.13 A. The current of green of the experimental example has been measured to be 1.6 A, and the current of green of an embodiment has been measured to be 0.45 A. The current of blue of the experimental example has been measured to be 0.31 A, and the current of blue of an embodiment has been measured to be 0.76 A. The current of white of the experimental example has been measured to be 1.21 A, and the current of white of an embodiment has been measured to be 1.26 A. For example, average current of red, green, blue, and white of the experimental example has been measured to be 5.81 A, and average current of red, green, blue, and white of an embodiment has been measured to be 2.54 A. Accordingly, it may be seen that an embodiment of the present disclosure is reduced more in current than the experimental example. For example, it may be seen that an embodiment of the present disclosure is reduced more in current of red, green, blue, and white than the experimental example. For example, it may be seen that an embodiment where the hole injection layer, the hole transport layer, and an emission layer are formed by the solution process is reduced more in current of red, green, blue, and white than the experimental example.

The panel efficiency of the experimental example has been measured to be 21.76 cd/A, and the panel efficiency of an embodiment has been measured to be 49.48 cd/A. The panel efficiency of an embodiment represents a relative value compared to the panel efficiency of the experimental example. Accordingly, it may be seen that an embodiment of the present disclosure is enhanced more in panel efficiency than the experimental example. For example, it may be seen that an embodiment of the present disclosure is enhanced about 227% more in panel efficiency than the experimental example. For example, it may be seen that an embodiment where the hole injection layer, the hole transport layer, and an emission layer are formed by the solution process is enhanced more in panel efficiency than the experimental example.

In an embodiment where the hole injection layer, the hole transport layer, and an emission layer according to an embodiment of the present disclosure is formed by the solution process, it may be seen that the device efficiency and the panel efficiency in a dynamic image are enhanced and a current in a dynamic image is reduced. Accordingly, a display apparatus may be provided where efficiency is enhanced and a current is reduced.

FIG. 6 illustrates a display apparatus according to another embodiment of the present disclosure.

Referring to FIG. 6, a display apparatus 3 according to another embodiment of the present disclosure may include a plurality of subpixels. A substrate may include the plurality of subpixels. The plurality of subpixels may include a first subpixel, a second subpixel, and a third subpixel, but embodiments of the present disclosure are not limited thereto. For example, the first subpixel may be a red subpixel R-sub, the second subpixel may be a green subpixel G-sub, and the third subpixel may be a blue subpixel B-sub, but embodiments of the present disclosure are not limited thereto.

The plurality of subpixels may further include a fourth subpixel. For example, the plurality of subpixels may include a first subpixel, a second subpixel, a third subpixel, and a fourth subpixel, but embodiments of the present disclosure are not limited thereto. For example, the first subpixel may be a red subpixel R-sub, and the second subpixel may be a green subpixel G-sub, but embodiments of the present disclosure are not limited thereto. For example, the third subpixel may be a blue subpixel B-sub, and the fourth subpixel may be a white subpixel W-sub, but embodiments of the present disclosure are not limited thereto. Hereinafter, an example will be described where the first subpixel is the red subpixel R-sub, the second subpixel is the green subpixel G-sub, the third subpixel is the blue subpixel B-sub, and the fourth subpixel is the white subpixel W-sub.

The red subpixel R-sub, the green subpixel G-sub, the blue subpixel B-sub, and the white subpixel W-sub according to an embodiment of the present disclosure may include at least one or more emission parts. For example, the at least one or more emission parts may be on a first electrode 501. For example, the at least one or more emission parts may be disposed between the first electrode 501 and the second electrode 505. For example, the at least one or more emission parts may include four emission parts, but embodiments of the present disclosure are not limited thereto. For example, the at least one or more emission parts may include a first emission part 3100, a second emission part 3200, a third emission part 3300, and a fourth emission part 3400.

According to an embodiment of the present disclosure, each of the plurality of subpixels may include at least one or more emission parts. For example, the red subpixel R-sub, the green subpixel G-sub, the blue subpixel B-sub, and the white subpixel W-sub may include the first emission part 3100. The first emission part 3100 may include a first hole functional layer, an emission layer, and a first electron functional layer, but embodiments of the present disclosure are not limited thereto. For example, the first hole functional layer may include a hole injection layer, a hole transport layer, and an electron blocking layer, but embodiments of the present disclosure are not limited thereto. For example, the first electron functional layer may include an electron injection layer, an electron transport layer, and a hole blocking layer, but embodiments of the present disclosure are not limited thereto. For example, the first emission part 3100 may include a hole injection layer 6111, a first hole transport layer 6131, an emission layer, and a first electron transport layer 631, but embodiments of the present disclosure are not limited thereto.

According to an embodiment of the present disclosure, the first hole functional layer may be formed on the first electrode 501. The first hole functional layer may be at the red subpixel R-sub, the green subpixel G-sub, and the blue subpixel B-sub. For example, the first hole functional layer may be at the red subpixel R-sub, the green subpixel G-sub, the blue subpixel B-sub, and the white subpixel W-sub. The first hole functional layer may include the hole injection layer 6111 and the first hole transport layer 6131. According to an embodiment of the present disclosure, the hole injection layer 6111 and the first hole transport layer 6131 may be formed by a solution process. For example, the hole injection layer 6111 and the first hole transport layer 6131 may be formed by a solution process such as an inkjet process or a nozzle printing process, but embodiments of the present disclosure are not limited thereto.

A bank 105 may be substantially the same as the description of FIG. 4, and thus, a description thereof is omitted. Descriptions of the hole injection layer 6111 and the first hole transport layer 6131 may be substantially the same as the descriptions of the hole injection layer 611 and the first hole transport layer 613 described above with reference to FIGS. 4 and 5, and thus, repeated descriptions thereof are omitted.

According to an embodiment of the present disclosure, a thickness of the first hole functional layer may be different for each subpixel. Because a thickness of the first hole functional layer is different, an optimal cavity for each color may be implemented, and charge balance optimized for each color may be implemented. For example, because a thickness of the first hole functional layer is different, an optimal cavity for each subpixel may be implemented, and charge balance optimized for each subpixel may be implemented. A thickness of the first hole functional layer of the red subpixel R-sub may be equal to or different from a thickness of the first hole functional layer of the green subpixel G-sub. For example, a thickness of the first hole functional layer of the red subpixel R-sub may be greater than or equal to a thickness of the first hole functional layer of the green subpixel G-sub. For example, a thickness of the hole injection layer 6111 of the red subpixel R-sub may be equal to or different from a thickness of the hole injection layer 6111 of the green subpixel G-sub. For example, a thickness of the hole injection layer 6111 of the red subpixel R-sub may be greater than or equal to a thickness of the hole injection layer 6111 of the green subpixel G-sub. For example, the thickness of the hole injection layer 6111 of the red subpixel R-sub may be 15 nm to 35 nm, but embodiments of the present disclosure are not limited thereto. For example, the hole injection layer 6111 of the green subpixel G-sub may be 10 nm to 35 nm, but embodiments of the present disclosure are not limited thereto.

According to an embodiment of the present disclosure, a thickness of the first hole functional layer of the red subpixel R-sub may be different from a thickness of the first hole functional layer of the blue subpixel B-sub. For example, the thickness of the first hole functional layer of the red subpixel R-sub may be greater than the thickness of the first hole functional layer of the blue subpixel B-sub. For example, a thickness of the hole injection layer 6111 of the red subpixel R-sub may be different from a thickness of the hole injection layer 6111 of the blue subpixel B-sub. For example, the thickness of the hole injection layer 6111 of the red subpixel R-sub may be greater than the thickness of the hole injection layer 6111 of the blue subpixel B-sub. For example, the thickness of the hole injection layer 6111 of the red subpixel R-sub may be 15 nm to 35 nm, but embodiments of the present disclosure are not limited thereto. For example, the thickness of the hole injection layer 6111 of the blue subpixel B-sub may be 5 nm to 10 nm, but embodiments of the present disclosure are not limited thereto.

According to an embodiment of the present disclosure, a thickness of the first hole functional layer of the red subpixel R-sub may be different from a thickness of the first hole functional layer of the white subpixel W-sub. For example, the thickness of the first hole functional layer of the red subpixel R-sub may be smaller than the thickness of the first hole functional layer of the white subpixel W-sub. For example, a thickness of the hole injection layer 6111 of the red subpixel R-sub may be different from a thickness of the hole injection layer 6111 of the white subpixel W-sub. For example, the thickness of the hole injection layer 6111 of the red subpixel R-sub may be smaller than the thickness of the hole injection layer 6111 of the white subpixel W-sub. For example, the thickness of the hole injection layer 6111 of the red subpixel R-sub may be 15 nm to 35 nm, but embodiments of the present disclosure are not limited thereto. For example, the thickness of the hole injection layer 6111 of the white subpixel W-sub may be 20 nm to 40 nm, but embodiments of the present disclosure are not limited thereto.

According to an embodiment of the present disclosure, a thickness of the first hole functional layer of the green subpixel G-sub may be equal to or different from a thickness of the first hole functional layer of the blue subpixel B-sub. For example, the thickness of the first hole functional layer of the green subpixel G-sub may be greater than or equal to the thickness of the first hole functional layer of the blue subpixel B-sub. For example, a thickness of the hole injection layer 6111 of the green subpixel G-sub may be equal to or different from a thickness of the hole injection layer 6111 of the blue subpixel B-sub. For example, the thickness of the hole injection layer 6111 of the green subpixel G-sub may be greater than or equal to the thickness of the hole injection layer 6111 of the blue subpixel B-sub. For example, the thickness of the hole injection layer 6111 of the green subpixel G-sub may be 10 nm to 35 nm, but embodiments of the present disclosure are not limited thereto. For example, the thickness of the hole injection layer 6111 of the blue subpixel B-sub may be 5 nm to 10 nm, but embodiments of the present disclosure are not limited thereto.

According to an embodiment of the present disclosure, a thickness of the first hole functional layer of the green subpixel G-sub may be different from a thickness of the first hole functional layer of the white subpixel W-sub. For example, the thickness of the first hole functional layer of the green subpixel G-sub may be smaller than the thickness of the first hole functional layer of the white subpixel W-sub. For example, a thickness of the hole injection layer 6111 of the green subpixel G-sub may be different from a thickness of the hole injection layer 6111 of the white subpixel W-sub. For example, the thickness of the hole injection layer 6111 of the green subpixel G-sub may be smaller than the thickness of the hole injection layer 6111 of the white subpixel W-sub. For example, the thickness of the hole injection layer 6111 of the green subpixel G-sub may be 10 nm to 35 nm, but embodiments of the present disclosure are not limited thereto. For example, the thickness of the hole injection layer 6111 of the white subpixel W-sub may be 20 nm to 40 nm, but embodiments of the present disclosure are not limited thereto.

According to an embodiment of the present disclosure, a thickness of the first hole functional layer of the blue subpixel B-sub may be different from a thickness of the first hole functional layer of the white subpixel W-sub. For example, the thickness of the first hole functional layer of the blue subpixel B-sub may be smaller than the thickness of the first hole functional layer of the white subpixel W-sub. For example, a thickness of the hole injection layer 6111 of the blue subpixel B-sub may be different from a thickness of the hole injection layer 6111 of the white subpixel W-sub. For example, the thickness of the hole injection layer 6111 of the blue subpixel B-sub may be smaller than the thickness of the hole injection layer 6111 of the white subpixel W-sub. For example, the thickness of the hole injection layer 6111 of the blue subpixel B-sub may be 5 nm to 10 nm, but embodiments of the present disclosure are not limited thereto. For example, the thickness of the hole injection layer 6111 of the white subpixel W-sub may be 20 nm to 40 nm, but embodiments of the present disclosure are not limited thereto.

According to an embodiment of the present disclosure, a thickness of the first hole functional layer of the red subpixel R-sub may be different from a thickness of the first hole functional layer of the green subpixel G-sub and a thickness of the first hole functional layer of the blue subpixel B-sub. For example, the thickness of the first hole functional layer of the red subpixel R-sub may be greater than the thickness of the first hole functional layer of the green subpixel G-sub and the thickness of the first hole functional layer of the blue subpixel B-sub. For example, a thickness of the hole injection layer 6111 of the red subpixel R-sub may be different from a thickness of the hole injection layer 6111 of the green subpixel G-sub and a thickness of the hole injection layer 6111 of the blue subpixel B-sub. For example, the thickness of the hole injection layer 6111 of the red subpixel R-sub may be greater than the thickness of the hole injection layer 6111 of the green subpixel G-sub and the thickness of the hole injection layer 6111 of the blue subpixel B-sub. For example, the thickness of the hole injection layer 6111 of the red subpixel R-sub may be greater than the thickness of the hole injection layer 6111 of the green subpixel G-sub, and the thickness of the hole injection layer 6111 of the green subpixel G-sub may be greater than the thickness of the hole injection layer 6111 of the blue subpixel B-sub. For example, the thickness of the hole injection layer 6111 of the red subpixel R-sub may be a same as the thickness of the hole injection layer 6111 of the green subpixel G-sub, and the thickness of the hole injection layer 6111 of the red subpixel R-sub and the thickness of the hole injection layer 6111 of the green subpixel G-sub may be greater than the thickness of the hole injection layer 6111 of the blue subpixel B-sub. For example, the thickness of the hole injection layer 6111 of the red subpixel R-sub may be 15 nm to 35 nm, but embodiments of the present disclosure are not limited thereto. For example, the thickness of the hole injection layer 6111 of the green subpixel G-sub may be 10 nm to 35 nm, but embodiments of the present disclosure are not limited thereto. For example, the thickness of the hole injection layer 6111 of the blue subpixel B-sub may be 5 nm to 10 nm, but embodiments of the present disclosure are not limited thereto.

According to an embodiment of the present disclosure, a thickness of the first hole functional layer of the white subpixel W-sub may be different from a thickness of the first hole functional layer of the red subpixel R-sub, a thickness of the first hole functional layer of the green subpixel G-sub, and a thickness of the first hole functional layer of the blue subpixel B-sub. For example, the thickness of the first hole functional layer of the white subpixel W-sub may be greater than the thickness of the first hole functional layer of the red subpixel R-sub, the thickness of the first hole functional layer of the green subpixel G-sub, and the thickness of the first hole functional layer of the blue subpixel B-sub. For example, the thickness of the hole injection layer 6111 of the white subpixel W-sub may be different from the thickness of the hole injection layer 6111 of the red subpixel R-sub, the thickness of the hole injection layer 6111 of the green subpixel G-sub, and the thickness of the hole injection layer 6111 of the blue subpixel B-sub. For example, the thickness of the hole injection layer 6111 of the white subpixel W-sub may be greater than the thickness of the hole injection layer 6111 of the red subpixel R-sub, the thickness of the hole injection layer 6111 of the green subpixel G-sub, and the thickness of the hole injection layer 6111 of the blue subpixel B-sub. For example, the thickness of the hole injection layer 6111 of the white subpixel W-sub may be greater than the thickness of the hole injection layer 6111 of the red subpixel R-sub, the thickness of the hole injection layer 6111 of the red subpixel R-sub may be greater than the thickness of the hole injection layer 6111 of the green subpixel G-sub, and the thickness of the hole injection layer 6111 of the green subpixel G-sub may be greater than the thickness of the hole injection layer 6111 of the blue subpixel B-sub. For example, the thickness of the hole injection layer 6111 of the white subpixel W-sub may be greater than the thickness of the hole injection layer 6111 of the red subpixel R-sub and/or the thickness of the hole injection layer 6111 of the green subpixel G-sub, and the thickness of the hole injection layer 6111 of the red subpixel R-sub and/or the thickness of the hole injection layer 6111 of the green subpixel G-sub may be greater than the thickness of the hole injection layer 6111 of the blue subpixel B-sub. For example, the thickness of the hole injection layer 6111 of the red subpixel R-sub may be a same as the thickness of the hole injection layer 6111 of the green subpixel G-sub. For example, the thickness of the hole injection layer 6111 of the white subpixel W-sub may be 20 nm to 40 nm, but embodiments of the present disclosure are not limited thereto. For example, the thickness of the hole injection layer 6111 of the red subpixel R-sub may be 15 nm to 35 nm, but embodiments of the present disclosure are not limited thereto. For example, the thickness of the hole injection layer 6111 of the green subpixel G-sub may be 10 nm to 35 nm, but embodiments of the present disclosure are not limited thereto. For example, the thickness of the hole injection layer 6111 of the blue subpixel B-sub may be 5 nm to 10 nm, but embodiments of the present disclosure are not limited thereto.

According to an embodiment of the present disclosure, the first hole transport layer 6131 may be disposed on the hole injection layer 6111. The first hole transport layer 6131 may be at the red subpixel R-sub, the green subpixel G-sub, and the blue subpixel B-sub. For example, the first hole transport layer 6131 may be at the red subpixel R-sub, the green subpixel G-sub, the blue subpixel B-sub, and the white subpixel W-sub. The first hole transport layer 6131 may be formed by a solution process. For example, the first hole transport layer 6131 may be formed along a shape of the hole injection layer 6111. For example, the first hole transport layer 6131 may be formed to have an equal thickness or different thicknesses for each subpixel, but embodiments of the present disclosure are not limited thereto. For example, in a case where a thickness of the first hole transport layer 6131 is formed to have an equal thickness for each subpixel, cavity characteristic and efficiency may be more enhanced, and a current may be reduced. For example, a thickness of the first hole transport layer 6131 may be 10 nm to 15 nm, but embodiments of the present disclosure are not limited thereto.

According to an embodiment of the present disclosure, two or more of first emission layers in a red subpixel R-sub, a green subpixel G-sub, a blue subpixel B-sub, and a white subpixel W-sub may include the same emission layer. For example, the first emission layers in the blue subpixel B-sub and the white subpixel W-sub may be emission layers which emit lights having the same color. For example, the first emission layer in the blue subpixel B-sub and the white subpixel W-sub may be a blue emission layer.

According to an embodiment of the present disclosure, an emission layer may be disposed on the first hole transport layer 6131. The emission layer may be at the red subpixel R-sub, the green subpixel G-sub, and the blue subpixel B-sub. For example, the emission layer may be at the red subpixel R-sub, the green subpixel G-sub, the blue subpixel B-sub, and the white subpixel W-sub. The emission layer may be formed by a solution process. For example, the emission layer may be formed along a shape of the hole transport layer 6131.

The first emission layer 6211 of the red subpixel R-sub may be a red emission layer. For example, the first emission layer 6211 may include at least one or more dopants and at least one or more hosts, but embodiments of the present disclosure are not limited thereto. The dopant may be a fluorescent dopant or a phosphorescent dopant. For example, the dopant of the first emission layer 6211 may include a red phosphorescent dopant, but embodiments of the present disclosure are not limited thereto. For example, a peak wavelength of the first emission layer 6211 may be within a range of 600 nm to 650 nm. For example, the first emission layer 6211 may emit light in a wavelength of 600 nm to 650 nm. The at least one or more hosts may include a host having a hole characteristic and a host having an electron characteristic, but embodiments of the present disclosure are not limited thereto. For example, a hole of the first hole transport layer 6131 and an electron of the first electron transport layer 631 may be supplied to the first emission layer 6211. Accordingly, an exciton may be generated by a combination of a hole and an electron in the first emission layer 6211, and thus, the first emission layer 6211 may emit light.

According to an embodiment of the present disclosure, a first emission layer 6211 of the red subpixel R-sub may include a carbazole-based material, a fluorine-based material, a naphthalene-based material, a polycarbazole-based material, a polyfluorene-based material, a polyimidazole-based material, or a polynaphthalene-based material, but embodiments of the present disclosure are not limited thereto.

The first emission layer 6231 of the green subpixel G-sub may be a green emission layer. For example, the first emission layer 6231 may include at least one or more dopants and at least one or more hosts, but embodiments of the present disclosure are not limited thereto. The dopant may be a fluorescent dopant or a phosphorescent dopant. For example, the dopant of the first emission layer 6231 may include a green phosphorescent dopant, but embodiments of the present disclosure are not limited thereto. For example, a peak wavelength of the first emission layer 6231 may be within a range of 520 nm to 590 nm. For example, the first emission layer 6231 may emit light in a wavelength of 520 nm to 590 nm. The at least one or more hosts may include a host having a hole characteristic and a host having an electron characteristic, but embodiments of the present disclosure are not limited thereto. For example, a hole of the first hole transport layer 6131 and an electron of the first electron transport layer 631 may be supplied to the first emission layer 6231. Accordingly, an exciton may be generated by a combination of a hole and an electron in the first emission layer 6231, and thus, the first emission layer 6231 may emit light.

According to an embodiment of the present disclosure, a first emission layer 6231 of the green subpixel G-sub may include a carbazole-based material, a fluorine-based material, a polycarbazole-based material, or a polyfluorene-based material, but embodiments of the present disclosure are not limited thereto.

The first emission layer 6251 of the blue subpixel B-sub may be a blue emission layer. For example, the first emission layer 6251 may include at least one or more dopants and at least one or more hosts, but embodiments of the present disclosure are not limited thereto. The dopant may be a fluorescent dopant or a phosphorescent dopant. For example, the dopant of the first emission layer 6251 may include a blue fluorescent dopant, but embodiments of the present disclosure are not limited thereto. For example, a peak wavelength of the first emission layer 6251 may be within a range of 420 nm to 480 nm. For example, the first emission layer 6251 may emit light in a wavelength of 420 nm to 480 nm. The at least one or more hosts may include a host having a hole characteristic and a host having an electron characteristic, but embodiments of the present disclosure are not limited thereto. For example, a hole of the first hole transport layer 6131 and an electron of the first electron transport layer 631 may be supplied to the first emission layer 6251. Accordingly, an exciton may be generated by a combination of a hole and an electron in the first emission layer 6251, and thus, the first emission layer 6251 may emit light.

According to an embodiment of the present disclosure, a first emission layer 6251 of the blue subpixel B-sub may include a distrylarylene-based material, a pyrene-based material, an anthracene-based material, a polydistrylarylene-based material, a polyanthracene-based material, or a polypyrene-based material, but embodiments of the present disclosure are not limited thereto.

The first emission layer 6271 of the white subpixel W-sub may be a blue emission layer. For example, the first emission layer 6271 may include at least one or more dopants and at least one or more hosts, but embodiments of the present disclosure are not limited thereto. The dopant may be a fluorescent dopant or a phosphorescent dopant. For example, the dopant of the first emission layer 6271 may include a blue fluorescent dopant, but embodiments of the present disclosure are not limited thereto. For example, a peak wavelength of the first emission layer 6271 may be within a range of 420 nm to 480 nm. For example, the first emission layer 6271 may emit light in a wavelength of 420 nm to 480 nm. The at least one or more hosts may include a host having a hole characteristic and a host having an electron characteristic, but embodiments of the present disclosure are not limited thereto. For example, a hole of the first hole transport layer 6131 and an electron of the first electron transport layer 631 may be supplied to the first emission layer 6271. Accordingly, an exciton may be generated by a combination of a hole and an electron in the first emission layer 6271, and thus, the first emission layer 6271 may emit light.

According to an embodiment of the present disclosure, a first emission layer 6271 of the white subpixel W-sub may include a distrylarylene-based material, a pyrene-based material, an anthracene-based material, a polydistrylarylene-based material, a polyanthracene-based material, or a poly-pyrene-based material, but embodiments of the present disclosure are not limited thereto.

According to an embodiment of the present disclosure, a thickness of the first emission layer may be different for each subpixel. For example, a thickness of the first emission layer 6211 of the red subpixel R-sub may be different from a thickness of the first emission layer 6231 of the green subpixel G-sub. For example, the thickness of the first emission layer 6211 of the red subpixel R-sub may be greater than the thickness of the first emission layer 6231 of the green subpixel G-sub. For example, a thickness of the first emission layer 6211 of the red subpixel R-sub may be 80 nm to 100 nm, but embodiments of the present disclosure are not limited thereto. For example, a thickness of the first emission layer 6231 of the green subpixel G-sub may be 10 nm to 35 nm, but embodiments of the present disclosure are not limited thereto.

According to an embodiment of the present disclosure, a thickness of the first emission layer 6211 of the red subpixel R-sub may be different from a thickness of the first emission layer 6251 of the blue subpixel B-sub. For example, the thickness of the first emission layer 6211 of the red subpixel R-sub may be greater than the thickness of the first emission layer 6251 of the blue subpixel B-sub. For example, a thickness of the first emission layer 6211 of the red subpixel R-sub may be 80 nm to 100 nm, but embodiments of the present disclosure are not limited thereto. For example, a thickness of the first emission layer 6251 of the blue subpixel B-sub may be 10 nm to 35 nm, but embodiments of the present disclosure are not limited thereto.

According to an embodiment of the present disclosure, a thickness of the first emission layer 6211 of the red subpixel R-sub may be different from a thickness of the first emission layer 6271 of the white subpixel W-sub. For example, the thickness of the first emission layer 6211 of the red subpixel R-sub may be greater than the thickness of the first emission layer 6271 of the white subpixel W-sub. For example, a thickness of the first emission layer 6211 of the red subpixel R-sub may be 80 nm to 100 nm, but embodiments of the present disclosure are not limited thereto. For example, a thickness of the first emission layer 6271 of the white subpixel W-sub may be 10 nm to 30 nm, but embodiments of the present disclosure are not limited thereto.

According to an embodiment of the present disclosure, a thickness of the first emission layer 6231 of the green subpixel G-sub may be equal to or different from a thickness of the first emission layer 6251 of the blue subpixel B-sub. For example, the thickness of the first emission layer 6231 of the green subpixel G-sub may be smaller than or equal to the thickness of the first emission layer 6251 of the blue subpixel B-sub. For example, a thickness of the first emission layer 6231 of the green subpixel G-sub may be 10 nm to 35 nm, but embodiments of the present disclosure are not limited thereto. For example, a thickness of the first emission layer 6251 of the blue subpixel B-sub may be 15 nm to 35 nm, but embodiments of the present disclosure are not limited thereto.

According to an embodiment of the present disclosure, a thickness of the first emission layer 6231 of the green subpixel G-sub may be different from a thickness of the first emission layer 6271 of the white subpixel W-sub. For example, the thickness of the first emission layer 6231 of the green subpixel G-sub may be greater than the thickness of the first emission layer 6271 of the white subpixel W-sub. For example, a thickness of the first emission layer 6211 of the green subpixel G-sub may be 10 nm to 35 nm, but embodiments of the present disclosure are not limited thereto. For example, a thickness of the first emission layer 6271 of the white subpixel W-sub may be 10 nm to 30 nm, but embodiments of the present disclosure are not limited thereto.

According to an embodiment of the present disclosure, a thickness of the first emission layer 6251 of the blue subpixel B-sub may be different from a thickness of the first emission layer 6271 of the white subpixel W-sub. For example, the thickness of the first emission layer 6251 of the blue subpixel B-sub may be greater than the thickness of the first emission layer 6271 of the white subpixel W-sub. For example, a thickness of the first emission layer 6251 of the blue subpixel B-sub may be 15 nm to 35 nm, but embodiments of the present disclosure are not limited thereto. For example, a thickness of the first emission layer 6271 of the white subpixel W-sub may be 10 nm to 30 nm, but embodiments of the present disclosure are not limited thereto.

According to an embodiment of the present disclosure, a thickness of the first emission layer 6211 of the red subpixel R-sub may be different from a thickness of the first emission layer 6251 of the blue subpixel B-sub and a thickness of the first emission layer 6231 of the green subpixel G-sub. For example, the thickness of the first emission layer 6211 of the red subpixel R-sub may be greater than a thickness of the first emission layer 6251 of the blue subpixel B-sub and a thickness of the first emission layer 6231 of the green subpixel G-sub. For example, a thickness of the first emission layer 6211 of the red subpixel R-sub may be greater than a thickness of the first emission layer 6251 of the blue subpixel B-sub, and a thickness of the first emission layer 6251 of the blue subpixel B-sub may be greater than or equal to a thickness of the first emission layer 6231 of the green subpixel G-sub. For example, a thickness of the first emission layer 6211 of the red subpixel R-sub may be 80 nm to 100 nm, but embodiments of the present disclosure are not limited thereto. For example, a thickness of the first emission layer 6251 of the blue subpixel B-sub may be 15 nm to 35 nm, but embodiments of the present disclosure are not limited thereto. For example, a thickness of the first emission layer 6231 of the green subpixel G-sub may be 10 nm to 35 nm, but embodiments of the present disclosure are not limited thereto.

According to an embodiment of the present disclosure, a thickness of the first emission layer 6211 of the red subpixel R-sub may be different from a thickness of the first emission layer 6251 of the blue subpixel B-sub, a thickness of the first emission layer 6231 of the green subpixel G-sub, and a thickness of the first emission layer 6271 of the white subpixel W-sub. For example, the thickness of the first emission layer 6211 of the red subpixel R-sub may be greater than the thickness of the first emission layer 6251 of the blue subpixel B-sub, the thickness of the first emission layer 6231 of the green subpixel G-sub, and the thickness of the first emission layer 6271 of the white subpixel W-sub. For example, a thickness of the first emission layer 6211 of the red subpixel R-sub may be greater than a thickness of the first emission layer 6251 of the blue subpixel B-sub, a thickness of the first emission layer 6251 of the blue subpixel B-sub may be greater than or equal to a thickness of the first emission layer 6231 of the green subpixel G-sub, and a thickness of the first emission layer 6231 of the green subpixel G-sub may be greater than a thickness of the first emission layer 6271 of the white subpixel W-sub. For example, a thickness of the first emission layer 6211 of the red subpixel R-sub may be 80 nm to 100 nm, but embodiments of the present disclosure are not limited thereto. For example, a thickness of the first emission layer 6231 of the green subpixel G-sub may be 10 nm to 35 nm, but embodiments of the present disclosure are not limited thereto. For example, a thickness of the first emission layer 6251 of the blue subpixel B-sub may be 15 nm to 35 nm, but embodiments of the present disclosure are not limited thereto. For example, a thickness of the first emission layer 6271 of the white subpixel W-sub may be 10 nm to 30 nm, but embodiments of the present disclosure are not limited thereto.

According to an embodiment of the present disclosure, a thickness of the first emission layer 6211 of the red subpixel R-sub may be different from a thickness of the first emission layer 6251 of the blue subpixel B-sub, a thickness of the first emission layer 6231 of the green subpixel G-sub, and a thickness of the first emission layer 6271 of the white subpixel W-sub. For example, a thickness of the first emission layer 6211 of the red subpixel R-sub may be greater than a thickness of the first emission layer 6251 of the blue subpixel B-sub, a thickness of the first emission layer 6231 of the green subpixel G-sub, and a thickness of the first emission layer 6271 of the white subpixel W-sub. For example, a thickness of the first emission layer 6211 of the red subpixel R-sub may be greater than a thickness of the first emission layer 6251 of the blue subpixel B-sub, a thickness of the first emission layer 6251 of the blue subpixel B-sub and a thickness of the first emission layer 6231 of the green subpixel G-sub may be greater than a thickness of the first emission layer 6271 of the white subpixel W-sub. For example, a thickness of the first emission layer 6231 of the green subpixel G-sub and a thickness of the first emission layer 6251 of the blue subpixel B-sub may be equal to one another. For example, a thickness of the first emission layer 6211 of the red subpixel R-sub may be 80 nm to 100 nm, but embodiments of the present disclosure are not limited thereto. For example, a thickness of the first emission layer 6231 of the green subpixel G-sub may be 10 nm to 35 nm, but embodiments of the present disclosure are not limited thereto. For example, a thickness of the first emission layer 6251 of the blue subpixel B-sub may be 15 nm to 35 nm, but embodiments of the present disclosure are not limited thereto. For example, a thickness of the first emission layer 6271 of the white subpixel W-sub may be 10 nm to 30 nm, but embodiments of the present disclosure are not limited thereto.

According to an embodiment of the present disclosure, a sum of a thickness of the hole injection layer 6111 and a thickness of the first emission layer may be different for each subpixel. For example, a sum of a thickness of the hole injection layer 6111 and a thickness of the first emission layer 6211 of the red subpixel R-sub may be different from a sum of a thickness of the hole injection layer 6111 and a thickness of the first emission layer 6231 of the green subpixel G-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6231 of the green subpixel G-sub. For example, the sum of the thickness of the hole injection layer 6111 and the thickness of the first emission layer 6211 of the red subpixel R-sub may be 95 nm to 135 nm, but embodiments of the present disclosure are not limited thereto. For example, the sum of the thickness of the hole injection layer 6111 and the thickness of the first emission layer 6231 of the green subpixel G-sub may be 20 nm to 70 nm, but embodiments of the present disclosure are not limited thereto.

According to an embodiment of the present disclosure, a sum of a thickness of the hole injection layer 6111 and a thickness of the first emission layer 6211 of the red subpixel R-sub may be different from a sum of a thickness of the hole injection layer 6111 and a thickness of the first emission layer 6251 of the blue subpixel B-sub. For example, the sum of the thickness of the hole injection layer 6111 and the thickness of the first emission layer 6211 of the red subpixel R-sub may be greater than the sum of a thickness of the hole injection layer 6111 and the thickness of the first emission layer 6251 of the blue subpixel B-sub. For example, the sum of the thickness of the hole injection layer 6111 and the thickness of the first emission layer 6211 of the red subpixel R-sub may be 95 nm to 135 nm, but embodiments of the present disclosure are not limited thereto. For example, the sum of the thickness of the hole injection layer 6111 and the thickness of the first emission layer 6251 of the blue subpixel B-sub may be 20 nm to 45 nm, but embodiments of the present disclosure are not limited thereto.

According to an embodiment of the present disclosure, a sum of a thickness of the hole injection layer 6111 and a thickness of the first emission layer 6211 of the red subpixel R-sub may be different from a sum of a thickness of the hole injection layer 6111 and a thickness of the first emission layer 6271 of the white subpixel W-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6271 of the white subpixel W-sub. For example, the sum of the thickness of the hole injection layer 6111 and the thickness of the first emission layer 6211 of the red subpixel R-sub may be 95 nm to 135 nm, but embodiments of the present disclosure are not limited thereto. For example, the sum of the thickness of the hole injection layer 6111 and the thickness of the first emission layer 6271 of the white subpixel W-sub may be 30 nm to 70 nm, but embodiments of the present disclosure are not limited thereto.

According to an embodiment of the present disclosure, a sum of a thickness of the hole injection layer 6111 and a thickness of the first emission layer 6231 of the green subpixel G-sub may be different from a sum of a thickness of the hole injection layer 6111 and a thickness of the first emission layer 6251 of the blue subpixel B-sub. For example, the sum of the thickness of the hole injection layer 6111 and the thickness of the first emission layer 6231 of the green subpixel G-sub may be greater than the sum of the thickness of the hole injection layer 6111 and the thickness of the first emission layer 6251 of the blue subpixel B-sub. For example, the sum of the thickness of the hole injection layer 6111 and the thickness of the first emission layer 6231 of the green subpixel G-sub may be 20 nm to 70 nm, but embodiments of the present disclosure are not limited thereto. For example, the sum of the thickness of the hole injection layer 6111 and the thickness of the first emission layer 6251 of the blue subpixel B-sub may be 20 nm to 45 nm, but embodiments of the present disclosure are not limited thereto.

According to an embodiment of the present disclosure, a sum of a thickness of the hole injection layer 6111 and a thickness of the first emission layer 6231 of the green subpixel G-sub may be equal to or different from a sum of a thickness of the hole injection layer 6111 and a thickness of the first emission layer 6271 of the white subpixel W-sub. For example, the sum of the thickness of the hole injection layer 6111 and the thickness of the first emission layer 6231 of the green subpixel G-sub may be smaller than or equal to the sum of the thickness of the hole injection layer 6111 and the thickness of the first emission layer 6271 of the white subpixel W-sub. For example, the sum of the thickness of the hole injection layer 6111 and the thickness of the first emission layer 6231 of the green subpixel G-sub may be 20 nm to 70 nm, but embodiments of the present disclosure are not limited thereto. For example, the sum of the thickness of the hole injection layer 6111 and the thickness of the first emission layer 6271 of the white subpixel W-sub may be 30 nm to 70 nm, but embodiments of the present disclosure are not limited thereto.

According to an embodiment of the present disclosure, a sum of a thickness of the hole injection layer 6111 and a thickness of the first emission layer 6251 of the blue subpixel B-sub may be different from a sum of a thickness of the hole injection layer 6111 and a thickness of the first emission layer 6271 of the white subpixel W-sub. For example, the sum of the thickness of the hole injection layer 6111 and the thickness of the first emission layer 6251 of the blue subpixel B-sub may be smaller than the sum of the thickness of the hole injection layer 6111 and the thickness of the first emission layer 6271 of the white subpixel W-sub. For example, the sum of the thickness of the hole injection layer 6111 and the thickness of the first emission layer 6251 of the blue subpixel B-sub may be 20 nm to 45 nm, but embodiments of the present disclosure are not limited thereto. For example, the sum of the thickness of the hole injection layer 6111 and the thickness of the first emission layer 6271 of the white subpixel W-sub may be 30 nm to 70 nm, but embodiments of the present disclosure are not limited thereto.

According to an embodiment of the present disclosure, a sum of a thickness of the hole injection layer 6111 and a thickness of the first emission layer 6211 of the red subpixel R-sub may be different from a sum of a thickness of the hole injection layer 6111 and a thickness of the first emission layer 6231 of the green subpixel G-sub and a sum of a thickness of the hole injection layer 6111 and a thickness of the first emission layer 6251 of the blue subpixel B-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6231 of the green subpixel G-sub and the sum of the thickness of the hole injection layer 6111 and the thickness of the first emission layer 6251 of the blue subpixel B-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6231 of the green subpixel G-sub. For example, the sum of the thickness of the hole injection layer 6111 and the thickness of the first emission layer 6231 of the green subpixel G-sub may be greater than the sum of the thickness of the hole injection layer 6111 and the thickness of the first emission layer 6251 of the blue subpixel B-sub. For example, the sum of the thickness of the hole injection layer 6111 and the thickness of the first emission layer 6211 of the red subpixel R-sub may be 95 nm to 135 nm, but embodiments of the present disclosure are not limited thereto. For example, the sum of the thickness of the hole injection layer 6111 and the thickness of the first emission layer 6231 of the green subpixel G-sub may be 20 nm to 70 nm, but embodiments of the present disclosure are not limited thereto. For example, the sum of the thickness of the hole injection layer 6111 and the thickness of the first emission layer 6251 of the blue subpixel B-sub may be 20 nm to 45 nm, but embodiments of the present disclosure are not limited thereto.

According to an embodiment of the present disclosure, a sum of a thickness of the hole injection layer 6111 and a thickness of the first emission layer 6211 of the red subpixel R-sub may be different from a sum of a thickness of the hole injection layer 6111 and a thickness of the first emission layer 6271 of the white subpixel W-sub, a sum of a thickness of the hole injection layer 6111 and a thickness of the first emission layer 6231 of the green subpixel G-sub, and a sum of a thickness of the hole injection layer 6111 and a thickness of the first emission layer 6251 of the blue subpixel B-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6271 of the white subpixel W-sub, the sum of the thickness of the hole injection layer 6111 and the thickness of the first emission layer 6231 of the green subpixel G-sub, and the sum of the thickness of the hole injection layer 611 and the thickness of the first emission layer 6251 of the blue subpixel B-sub. For example, the sum of the thickness of the hole injection layer 6111 and the thickness of the first emission layer 6211 of the red subpixel R-sub may be greater than the sum of the thickness of the hole injection layer 6111 and the thickness of the first emission layer 6271 of the white subpixel W-sub. For example, the sum of the thickness of the hole injection layer 6111 and the thickness of the first emission layer 6271 of the white subpixel W-sub may be greater than or equal to the sum of the thickness of the hole injection layer 6111 and the thickness of the first emission layer 6231 of the green subpixel G-sub. For example, the sum of the thickness of the hole injection layer 6111 and the thickness of the first emission layer 6231 of the green subpixel G-sub may be greater than the sum of the thickness of the hole injection layer 6111 and the thickness of the first emission layer 6251 of the blue subpixel B-sub. For example, the sum of the thickness of the hole injection layer 6111 and the thickness of the first emission layer 6211 of the red subpixel R-sub may be 95 nm to 135 nm, but embodiments of the present disclosure are not limited thereto. For example, the sum of the thickness of the hole injection layer 6111 and the thickness of the first emission layer 6271 of the white subpixel W-sub may be 30 nm to 70 nm, but embodiments of the present disclosure are not limited thereto. For example, the sum of the thickness of the hole injection layer 6111 and the thickness of the first emission layer 6231 of the green subpixel G-sub may be 20 nm to 70 nm, but embodiments of the present disclosure are not limited thereto. For example, the sum of the thickness of the hole injection layer 6111 and the thickness of the first emission layer 6251 of the blue subpixel B-sub may be 20 nm to 45 nm, but embodiments of the present disclosure are not limited thereto.

According to an embodiment of the present disclosure, a sum of a thickness of the hole injection layer 6111, a thickness of the first hole transport layer 6131, and a thickness of the first emission layer may be different for each subpixel. For example, a sum of a thickness of the hole injection layer 6111, a thickness of the first hole transport layer 6131, and a thickness of the first emission layer 6211 of the red subpixel R-sub may be different from a sum of a thickness of the hole injection layer 6111, a thickness of the first hole transport layer 6131, and a thickness of the first emission layer 6231 of the green subpixel G-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6231 of the green subpixel G-sub. For example, the sum of the thickness of the hole injection layer 6111, the thickness of the first hole transport layer 6131, and the thickness of the first emission layer 6211 of the red subpixel R-sub may be 105 nm to 150 nm, but embodiments of the present disclosure are not limited thereto. For example, the sum of the thickness of the hole injection layer 6111, the thickness of the first hole transport layer 6131, and the thickness of the first emission layer 6231 of the green subpixel G-sub may be 30 nm to 85 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6211 of the red subpixel R-sub may be different from a sum of a thickness of the hole injection layer 6111, a thickness of the first hole transport layer 6131, and a thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be 105 nm to 150 nm, but embodiments of the present disclosure are not limited thereto. For example, the sum of the thickness of the hole injection layer 6111, the thickness of the first hole transport layer 6131, and the thickness of the first emission layer 6251 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6211 of the red subpixel R-sub may be different from a sum of a thickness of the hole injection layer 6111, a thickness of the first hole transport layer 6131, and a thickness of the first emission layer 6271 of the white subpixel W-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6271 of the white subpixel W-sub. For example, the sum of the thickness of the hole injection layer 6111, the thickness of the first hole transport layer 6131, and the thickness of the first emission layer 6211 of the red subpixel R-sub may be 105 nm to 150 nm, but embodiments of the present disclosure are not limited thereto. For example, the sum of the thickness of the hole injection layer 6111, the thickness of the first hole transport layer 6131, and the thickness of the first emission layer 6271 of the white subpixel W-sub may be 40 nm to 85 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6231 of the green subpixel G-sub may be different from a sum of a thickness of the hole injection layer 6111, a thickness of the first hole transport layer 6131, and a thickness of the first emission layer 6251 of the blue subpixel B-sub. For example, the sum of the thickness of the hole injection layer 6111, the thickness of the first hole transport layer 6131, and the thickness of the first emission layer 6231 of the green subpixel G-sub may be greater than the sum of the thickness of the hole injection layer 6111, the thickness of the first hole transport layer 6131, and the thickness of the first emission layer 6251 of the blue subpixel B-sub. For example, the sum of the thickness of the hole injection layer 6111, the thickness of the first hole transport layer 6131, and the thickness of the first emission layer 6231 of the green subpixel G-sub may be 30 nm to 85 nm, but embodiments of the present disclosure are not limited thereto. For example, the sum of the thickness of the hole injection layer 6111, the thickness of the first hole transport layer 6131, and the thickness of the first emission layer 6251 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6231 of the green subpixel G-sub may be equal to or different from a sum of a thickness of the hole injection layer 6111, a thickness of the first hole transport layer 6131, and a thickness of the first emission layer 6271 of the white subpixel W-sub. For example, the sum of the thickness of the hole injection layer 6111, the thickness of the first hole transport layer 6131, and the thickness of the first emission layer 6231 of the green subpixel G-sub may be smaller than or equal to the sum of the thickness of the hole injection layer 6111, the thickness of the first hole transport layer 6131, and the thickness of the first emission layer 6271 of the white subpixel W-sub. For example, the sum of the thickness of the hole injection layer 6111, the thickness of the first hole transport layer 6131, and the thickness of the first emission layer 6231 of the green subpixel G-sub may be 30 nm to 85 nm, but embodiments of the present disclosure are not limited thereto. For example, the sum of the thickness of the hole injection layer 6111, the thickness of the first hole transport layer 6131, and the thickness of the first emission layer 6271 of the white subpixel W-sub may be 40 nm to 85 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6251 of the blue subpixel B-sub may be different from a sum of a thickness of the hole injection layer 6111, a thickness of the first hole transport layer 6131, and a thickness of the first emission layer 6271 of the white subpixel W-sub. For example, the sum of the thickness of the hole injection layer 6111, the thickness of the first hole transport layer 6131, and the thickness of the first emission layer 6251 of the blue subpixel B-sub may be greater than the sum of the thickness of the hole injection layer 6111, the thickness of the first hole transport layer 6131, and the thickness of the first emission layer 6271 of the white subpixel W-sub. For example, the sum of the thickness of the hole injection layer 6111, the thickness of the first hole transport layer 6131, and the thickness of the first emission layer 6251 of the blue subpixel B-sub may be 30 nm to 60 nm, but embodiments of the present disclosure are not limited thereto. For example, the sum of the thickness of the hole injection layer 6111, the thickness of the first hole transport layer 6131, and the thickness of the first emission layer 6271 of the white subpixel W-sub may be 40 nm to 85 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6211 of the red subpixel R-sub may be different from a sum of a thickness of the hole injection layer 6111, a thickness of the first hole transport layer 6131, and a thickness of the first emission layer 6231 of the green subpixel G-sub and a sum of a thickness of the hole injection layer 6111, a thickness of the first hole transport layer 6131, and a thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6231 of the green subpixel G-sub and the sum of the thickness of the hole injection layer 6111, the thickness of the first hole transport layer 6131, and the thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6231 of the green subpixel G-sub. For example, the sum of the thickness of the hole injection layer 6111, the thickness of the first hole transport layer 6131, and the thickness of the first emission layer 6231 of the green subpixel G-sub may be greater than the sum of the thickness of the hole injection layer 6111, the thickness of the first hole transport layer 6131, and the thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be 105 nm to 150 nm, but embodiments of the present disclosure are not limited thereto. For example, the sum of the thickness of the hole injection layer 6111, the thickness of the first hole transport layer 6131, and the thickness of the first emission layer 6231 of the green subpixel G-sub may be 30 nm to 85 nm, but embodiments of the present disclosure are not limited thereto. For example, the sum of the thickness of the hole injection layer 6111, the thickness of the first hole transport layer 6131, and the thickness of the first emission layer 6251 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first hole transport layer 6131, and a thickness of the first emission layer 6211 of the red subpixel R-sub may be different from a sum of a thickness of the hole injection layer 6111, a thickness of the first hole transport layer 6131, and a thickness of the first emission layer 6271 of the white subpixel W-sub, a sum of a thickness of the hole injection layer 611, a thickness of the first hole transport layer 6131, and a thickness of the first emission layer 6231 of the green subpixel G-sub, and a sum of a thickness of the hole injection layer 6111, a thickness of the first hole transport layer 6131, and a thickness of the first emission layer 6251 of the blue subpixel B-sub. For example, the sum of the thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6271 of the white subpixel W-sub, the sum of a thickness of the hole injection layer 6111, the thickness of the first hole transport layer 6131, and the thickness of the first emission layer 6231 of the green subpixel G-sub, and the sum of the thickness of the hole injection layer 6111, the thickness of the first hole transport layer 6131, and the thickness of the first emission layer 6251 of the blue subpixel B-sub. For example, the sum of a thickness of the hole injection layer 6111, the thickness of the first hole transport layer 6131, and the thickness of the first emission layer 6211 of the red subpixel R-sub may be greater than the sum of the thickness of the hole injection layer 6111, the thickness of the first hole transport layer 6131, and the thickness of the first emission layer 6271 of the white subpixel W-sub. For example, the sum of the thickness of the hole injection layer 6111, the thickness of the first hole transport layer 6131, and the thickness of the first emission layer 6271 of the white subpixel W-sub may be greater than or equal to the sum of a thickness of the hole injection layer 6111, the thickness of the first hole transport layer 6131, and the thickness of the first emission layer 6231 of the green subpixel G-sub. For example, the sum of a thickness of the hole injection layer 6111, the thickness of the first hole transport layer 6131, and the thickness of the first emission layer 6231 of the green subpixel G-sub may be greater than the sum of the thickness of the hole injection layer 6111, the thickness of the first hole transport layer 6131, and the thickness of the first emission layer 6251 of the blue subpixel B-sub. For example, the sum of a thickness of the hole injection layer 6111, the thickness of the first hole transport layer 6131, and the thickness of the first emission layer 6211 of the red subpixel R-sub may be 105 nm to 150 nm, but embodiments of the present disclosure are not limited thereto. For example, the sum of the thickness of the hole injection layer 6111, the thickness of the first hole transport layer 6131, and the thickness of the first emission layer 6271 of the white subpixel W-sub may be 40 nm to 85 nm, but embodiments of the present disclosure are not limited thereto. For example, the sum of a thickness of the hole injection layer 6111, the thickness of the first hole transport layer 6131, and the thickness of the first emission layer 6231 of the green subpixel G-sub may be 30 nm to 85 nm, but embodiments of the present disclosure are not limited thereto. For example, the sum of the thickness of the hole injection layer 6111, the thickness of the first hole transport layer 6131, and the thickness of the first emission layer 6251 of the blue subpixel B-sub may be 30 nm to 60 nm, but embodiments of the present disclosure are not limited thereto.

According to an embodiment of the present disclosure, the first electron transport layer 631 may be disposed on the first emission layer. For example, the first electron transport layer 631 may be at the red subpixel R-sub, the green subpixel G-sub, and the blue subpixel B-sub. For example, the first electron transport layer 631 may be at the red subpixel R-sub, the green subpixel G-sub, the blue subpixel B-sub, and the white subpixel W-sub. For example, the first electron transport layer 631 may be disposed on the first emission layer of the red subpixel R-sub, the green subpixel G-sub, the blue subpixel B-sub, and the white subpixel W-sub. The first electron transport layer 631 may be formed by a deposition process. For example, the first electron transport layer 631 may be conformally formed along surfaces of the first emission layers 6211, 6231, 6251, and 6271. For example, the first electron transport layer 631 may be formed to correspond to a cross-sectional profile of each of the first emission layers 6211, 6231, 6251, and 6271. For example, a surface shape of the first electron transport layer 631 may be formed based on a surface shape of each of the first emission layers 6211, 6231, 6251, and 6271. For example, a thickness of the first electron transport layer 631 may be a same as a thickness of the first hole transport layer 6131. For example, the thickness of the first electron transport layer 631 may be 10 nm to 15 nm, but embodiments of the present disclosure are not limited thereto.

The first electron transport layer 631 may easily transfer an electron, supplied from the second electrode 505, to the emission layer. An exciton may be generated from a hole and an electron supplied from the emission layer, and thus, the emission layer may emit light. The first electron transport layer 631 may include the same material as the material described above with reference to FIG. 4, but embodiments of the present disclosure are not limited thereto.

According to an embodiment of the present disclosure, a sum of a thickness of the hole injection layer 6111, a thickness of the first emission layer, and a thickness of the first electron transport layer 631 may be different for each subpixel. For example, a sum of a thickness of the hole injection layer 6111, a thickness of the first emission layer 6211, and a thickness of the first electron transport layer 631 of the red subpixel R-sub may be different from a sum of a thickness of the hole injection layer 6111, a thickness of the first emission layer 6231, and a thickness of the first electron transport layer 631 of the green subpixel G-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6231, and the thickness of the first electron transport layer 631 of the green subpixel G-sub. For example, the sum of the thickness of the hole injection layer 6111, the thickness of the first emission layer 6211, and the thickness of the first electron transport layer 631 of the red subpixel R-sub may be 105 nm to 150 nm, but embodiments of the present disclosure are not limited thereto. For example, the sum of the thickness of the hole injection layer 6111, the thickness of the first emission layer 6231, and the thickness of the first electron transport layer 631 of the green subpixel G-sub may be 35 nm to 85 nm, but embodiments of the present disclosure are not limited thereto.

According to an embodiment of the present disclosure, a sum of a thickness of the hole injection layer 6111, a thickness of the first emission layer 6211, and a thickness of the first electron transport layer 631 of the red subpixel R-sub may be different from a sum of a thickness of the hole injection layer 6111, a thickness of the first emission layer 6251, and a thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6251, and the thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be 105 nm to 150 nm, but embodiments of the present disclosure are not limited thereto. For example, the sum of the thickness of the hole injection layer 6111, the thickness of the first emission layer 6251, and the thickness of the first electron transport layer 631 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first emission layer 6211, and a thickness of the first electron transport layer 631 of the red subpixel R-sub may be different from a sum of a thickness of the hole injection layer 6111, a thickness of the first emission layer 6271, and a thickness of the first electron transport layer 631 of the white subpixel W-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6271, and the thickness of the first electron transport layer 631 of the white subpixel W-sub. For example, the sum of the thickness of the hole injection layer 6111, the thickness of the first emission layer 6211, and the thickness of the first electron transport layer 631 of the red subpixel R-sub may be 105 nm to 150 nm, but embodiments of the present disclosure are not limited thereto. For example, the sum of the thickness of the hole injection layer 6111, the thickness of the first emission layer 6271, and the thickness of the first electron transport layer 631 of the white subpixel W-sub may be 40 nm to 85 nm, but embodiments of the present disclosure are not limited thereto.

According to an embodiment of the present disclosure, a sum of a thickness of the hole injection layer 6111, a thickness of the first emission layer 6231, and a thickness of the first electron transport layer 631 of the green subpixel G-sub may be different from a sum of a thickness of the hole injection layer 6111, a thickness of the first emission layer 6251, and a thickness of the first electron transport layer 631 of the blue subpixel B-sub. For example, the sum of the thickness of the hole injection layer 6111, the thickness of the first emission layer 6231, and the thickness of the first electron transport layer 631 of the green subpixel G-sub may be smaller than the sum of the thickness of the hole injection layer 6111, the thickness of the first emission layer 6251, and the thickness of the first electron transport layer 631 of the blue subpixel B-sub. For example, the sum of the thickness of the hole injection layer 6111, the thickness of the first emission layer 6231, and the thickness of the first electron transport layer 631 of the green subpixel G-sub may be 30 nm to 85 nm, but embodiments of the present disclosure are not limited thereto. For example, the sum of the thickness of the hole injection layer 6111, the thickness of the first emission layer 6251, and the thickness of the first electron transport layer 631 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first emission layer 6231, and a thickness of the first electron transport layer 631 of the green subpixel G-sub may be equal to or different from a sum of a thickness of the hole injection layer 6111, a thickness of the first emission layer 6271, and a thickness of the first electron transport layer 631 of the white subpixel W-sub. For example, the sum of the thickness of the hole injection layer 6111, the thickness of the first emission layer 6231, and the thickness of the first electron transport layer 631 of the green subpixel G-sub may be smaller than or equal to the sum of the thickness of the hole injection layer 6111, the thickness of the first emission layer 6271, and the thickness of the first electron transport layer 631 of the white subpixel W-sub. For example, the sum of the thickness of the hole injection layer 6111, the thickness of the first emission layer 6231, and the thickness of the first electron transport layer 631 of the green subpixel G-sub may be 30 nm to 85 nm, but embodiments of the present disclosure are not limited thereto. For example, the sum of the thickness of the hole injection layer 6111, the thickness of the first emission layer 6271, and the thickness of the first electron transport layer 631 of the white subpixel W-sub may be 40 nm to 85 nm, but embodiments of the present disclosure are not limited thereto.

According to an embodiment of the present disclosure, a sum of a thickness of the hole injection layer 6111, a thickness of the first emission layer 6251, and a thickness of the first electron transport layer 631 of the blue subpixel B-sub may be different from a sum of a thickness of the hole injection layer 6111, a thickness of the first emission layer 6271, and a thickness of the first electron transport layer 631 of the white subpixel W-sub. For example, the sum of the thickness of the hole injection layer 6111, the thickness of the first emission layer 6251, and the thickness of the first electron transport layer 631 of the blue subpixel B-sub may be greater than the sum of the thickness of the hole injection layer 6111, the thickness of the first emission layer 6271, and the thickness of the first electron transport layer 631 of the white subpixel W-sub. For example, the sum of the thickness of the hole injection layer 6111, the thickness of the first emission layer 6251, and the thickness of the first electron transport layer 631 of the blue subpixel B-sub may be 30 nm to 60 nm, but embodiments of the present disclosure are not limited thereto. For example, the sum of the thickness of the hole injection layer 6111, the thickness of the first emission layer 6271, and the thickness of the first electron transport layer 631 of the white subpixel W-sub may be 40 nm to 85 nm, but embodiments of the present disclosure are not limited thereto.

According to an embodiment of the present disclosure, a sum of a thickness of the hole injection layer 6111, a thickness of the first emission layer 6211, and a thickness of the first electron transport layer 631 of the red subpixel R-sub may be different from a sum of a thickness of the hole injection layer 6111, a thickness of the first emission layer 6231, and a thickness of the first electron transport layer 631 of the green subpixel G-sub and a sum of a thickness of the hole injection layer 6111, a thickness of the first emission layer 6211, and a thickness of the first electron transport layer 631 of the blue subpixel B-sub. For example, the sum of the thickness of the hole injection layer 6111, the thickness of the first emission layer 6251, and the thickness of the first electron transport layer 631 of the red subpixel R-sub may be greater than the sum of the thickness of the hole injection layer 6111, the thickness of the first emission layer 6231, and the thickness of the first electron transport layer 631 of the green subpixel G-sub and the sum of the thickness of the hole injection layer 6111, the thickness of the first emission layer 6251, and the thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6231, and the thickness of the first electron transport layer 631 of the green subpixel G-sub. For example, the sum of the thickness of the hole injection layer 6111, the thickness of the first emission layer 6231, and the thickness of the first electron transport layer 631 of the green subpixel G-sub may be greater than the sum of the thickness of the hole injection layer 6111, the thickness of the first emission layer 6251, and the thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be 105 nm to 150 nm, but embodiments of the present disclosure are not limited thereto. For example, the sum of the thickness of the hole injection layer 6111, the thickness of the first emission layer 6231, and the thickness of the first electron transport layer 631 of the green subpixel G-sub may be 30 nm to 85 nm, but embodiments of the present disclosure are not limited thereto. For example, the sum of the thickness of the hole injection layer 6111, the thickness of the first emission layer 6251, and the thickness of the first electron transport layer 631 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first emission layer 6211, and a thickness of the first electron transport layer 631 of the red subpixel R-sub may be different from a sum of a thickness of the hole injection layer 6111, a thickness of the first emission layer 6271, and a thickness of the first electron transport layer 631 of the white subpixel W-sub, and a sum of a thickness of the hole injection layer 6111, a thickness of the first emission layer 6231, a thickness of the first electron transport layer 631 of the green subpixel G-sub, and a sum of a thickness of the hole injection layer 6111, a thickness of the first emission layer 6251, and a thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6271, and the thickness of the first electron transport layer 631 of the white subpixel W-sub, the sum of the thickness of the hole injection layer 6111, the thickness of the first emission layer 6231, and the thickness of the first electron transport layer 631 of the green subpixel G-sub, and the sum of the thickness of the hole injection layer 6111, the thickness of the first emission layer 6251, and the thickness of the first electron transport layer 631 of the blue subpixel B-sub. For example, the sum of the thickness of the hole injection layer 6111, the thickness of the first emission layer 6211, and the thickness of the first electron transport layer 631 of the red subpixel R-sub may be greater than the sum of the thickness of the hole injection layer 6111, the thickness of the first emission layer 6271, and the thickness of the first electron transport layer 631 of the white subpixel W-sub. For example, the sum of the thickness of the hole injection layer 6111, the thickness of the first emission layer 6271, and the thickness of the first electron transport layer 631 of the white subpixel W-sub may be greater than the sum of the thickness of the hole injection layer 6111, the thickness of the first emission layer 6231, and the thickness of the first electron transport layer 631 of the green subpixel G-sub. For example, the sum of the thickness of the hole injection layer 6111, the thickness of the first emission layer 6231, and the thickness of the first electron transport layer 631 of the green subpixel G-sub may be greater than the sum of the thickness of the hole injection layer 6111, the thickness of the first emission layer 6251, and the thickness of the first electron transport layer 631 of the blue subpixel B-sub. For example, the sum of the thickness of the hole injection layer 6111 the thickness of the first emission layer 6211 and the thickness of the first electron transport layer 631 of the red subpixel R-sub may be 105 nm to 150 nm, but embodiments of the present disclosure are not limited thereto. For example, the sum of the thickness of the hole injection layer 6111, the thickness of the first emission layer 6271, and the thickness of the first electron transport layer 631 of the white subpixel W-sub may be 40 nm to 85 nm, but embodiments of the present disclosure are not limited thereto. For example, the sum of the thickness of the hole injection layer 6111, the thickness of the first emission layer 6231, and the thickness of the first electron transport layer 631 of the green subpixel G-sub may be 30 nm to 85 nm, but embodiments of the present disclosure are not limited thereto. For example, the sum of the thickness of the hole injection layer 6111, the thickness of the first emission layer 6251, and the thickness of the first electron transport layer 631 of the blue subpixel B-sub may be 30 nm to 60 nm, but embodiments of the present disclosure are not limited thereto.

According to an embodiment of the present disclosure, a sum of a thickness of the hole injection layer 6111, a thickness of the first hole transport layer 6131, a thickness of the first emission layer, and a thickness of the first electron transport layer 631 may be different for each subpixel. For example, a sum of a thickness of the hole injection layer 6111, a thickness of the first hole transport layer 6131, a thickness of the first emission layer 6211, and a thickness of the first electron transport layer 631 of the red subpixel R-sub may be different from a sum of a thickness of the hole injection layer 6111, a thickness of the first hole transport layer 6131, a thickness of the first emission layer 6231, and a thickness of the first electron transport layer 631 of the green subpixel G-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6231, and the thickness of the first electron transport layer 631 of the green subpixel G-sub. For example, the sum of the thickness of the hole injection layer 6111, the thickness of the first hole transport layer 6131, the thickness of the first emission layer 6211, and the thickness of the first electron transport layer 631 of the red subpixel R-sub may be 115 nm to 165 nm, but embodiments of the present disclosure are not limited thereto. For example, the sum of the thickness of the hole injection layer 6111, the thickness of the first hole transport layer 6131, the thickness of the first emission layer 6231, and the thickness of the first electron transport layer 631 of the green subpixel G-sub may be 40 nm to 100 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6211, and a thickness of the first electron transport layer 631 of the red subpixel R-sub may be different from a sum of a thickness of the hole injection layer 6111, a thickness of the first hole transport layer 6131, a thickness of the first emission layer 6251, and a thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be 115 nm to 165 nm, but embodiments of the present disclosure are not limited thereto. For example, the sum of the thickness of the hole injection layer 6111, the thickness of the first hole transport layer 6131, the thickness of the first emission layer 6251, and the thickness of the first electron transport layer 631 of the blue subpixel B-sub may be 40 nm to 75 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6211, and a thickness of the first electron transport layer 631 of the red subpixel R-sub may be different from a sum of a thickness of the hole injection layer 6111, a thickness of the first hole transport layer 6131, a thickness of the first emission layer 6271, and a thickness of the first electron transport layer 631 of the white subpixel W-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6271, and the thickness of the first electron transport layer 631 of the white subpixel W-sub. For example, the sum of the thickness of the hole injection layer 6111, the thickness of the first hole transport layer 6131, the thickness of the first emission layer 6211, and the thickness of the first electron transport layer 631 of the red subpixel R-sub may be 115 nm to 165 nm, but embodiments of the present disclosure are not limited thereto. For example, the sum of the thickness of the hole injection layer 6111, the thickness of the first hole transport layer 6131, the thickness of the first emission layer 6271, and the thickness of the first electron transport layer 631 of the white subpixel W-sub may be 50 nm to 100 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6231, and a thickness of the first electron transport layer 631 of the green subpixel G-sub may be different from a sum of a thickness of the hole injection layer 6111, a thickness of the first hole transport layer 6131, a thickness of the first emission layer 6251, and a thickness of the first electron transport layer 631 of the blue subpixel B-sub. For example, the sum of the thickness of the hole injection layer 6111, the thickness of the first hole transport layer 6131, the thickness of the first emission layer 6231, and the thickness of the first electron transport layer 631 of the green subpixel G-sub may be greater than the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer 6231, and the thickness of the first electron transport layer 631 of the green subpixel G-sub may be 40 nm to 100 nm, but embodiments of the present disclosure are not limited thereto. For example, the sum of the thickness of the hole injection layer 6111, the thickness of the first hole transport layer 6131, the thickness of the first emission layer 6251, and the thickness of the first electron transport layer 631 of the blue subpixel B-sub may be 40 nm to 75 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6231, and a thickness of the first electron transport layer 631 of the green subpixel G-sub may be equal to or different from a sum of a thickness of the hole injection layer 6111, a thickness of the first hole transport layer 6131, a thickness of the first emission layer 6271, and a thickness of the first electron transport layer 631 of the white subpixel W-sub. For example, the sum of the thickness of the hole injection layer 6111, the thickness of the first hole transport layer 6131, the thickness of the first emission layer 6231, and the thickness of the first electron transport layer 631 of the green subpixel G-sub may be smaller than or equal to the sum of the thickness of the hole injection layer 6111, the thickness of the first hole transport layer 6131, the thickness of the first emission layer 6271, and the thickness of the first electron transport layer 631 of the white subpixel W-sub. For example, the sum of the thickness of the hole injection layer 6111, the thickness of the first hole transport layer 6131, the thickness of the first emission layer 6231, and the thickness of the first electron transport layer 631 of the green subpixel G-sub may be 40 nm to 100 nm, but embodiments of the present disclosure are not limited thereto. For example, the sum of the thickness of the hole injection layer 6111, the thickness of the first hole transport layer 6131, the thickness of the first emission layer 6271, and the thickness of the first electron transport layer 631 of the white subpixel W-sub may be 50 nm to 100 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6251, and a thickness of the first electron transport layer 631 of the blue subpixel B-sub may be different from a sum of a thickness of the hole injection layer 6111, a thickness of the first hole transport layer 6131, a thickness of the first emission layer 6271, and a thickness of the first electron transport layer 631 of the white subpixel W-sub. For example, the sum of the thickness of the hole injection layer 6111, the thickness of the first hole transport layer 6131, the thickness of the first emission layer 6251, and the thickness of the first electron transport layer 631 of the blue subpixel B-sub may be greater than the sum of the thickness of the hole injection layer 6111, the thickness of the first hole transport layer 6131, the thickness of the first emission layer 6271, and the thickness of the first electron transport layer 631 of the white subpixel W-sub. For example, the sum of the thickness of the hole injection layer 6111, the thickness of the first hole transport layer 6131, the thickness of the first emission layer 6251, and the thickness of the first electron transport layer 631 of the blue subpixel B-sub may be 40 nm to 75 nm, but embodiments of the present disclosure are not limited thereto. For example, the sum of the thickness of the hole injection layer 6111, the thickness of the first hole transport layer 6131, the thickness of the first emission layer 6271, and the thickness of the first electron transport layer 631 of the white subpixel W-sub may be 50 nm to 100 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6211, and a thickness of the first electron transport layer 631 of the red subpixel R-sub may be different from a sum of a thickness of the hole injection layer 6111, a thickness of the first hole transport layer 6131, a thickness of the first emission layer 6231, and a thickness of the first electron transport layer 631 of the green subpixel G-sub and a sum of a thickness of the hole injection layer 6111, a thickness of the first hole transport layer 613, a thickness of the first emission layer 6251, and a thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6231, and the thickness of the first electron transport layer 631 of the green subpixel G-sub and the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6231, and the thickness of the first electron transport layer 631 of the green subpixel G-sub. For example, the sum of the thickness of the hole injection layer 6111, the thickness of the first hole transport layer 6131, the thickness of the first emission layer 6231, and the thickness of the first electron transport layer 631 of the green subpixel G-sub may be greater than the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer

6211, and the thickness of the first electron transport layer 631 of the red subpixel R-sub may be 115 nm to 165 nm, but embodiments of the present disclosure are not limited thereto. For example, the sum of the thickness of the hole injection layer 6111, the thickness of the first hole transport layer 6131, the thickness of the first emission layer 6231, and the thickness of the first electron transport layer 631 of the green subpixel G-sub may be 40 nm to 100 nm, but embodiments of the present disclosure are not limited thereto. For example, the sum of the thickness of the hole injection layer 6111, the thickness of the first hole transport layer 6131, the thickness of the first emission layer 6251, and the thickness of the first electron transport layer 631 of the blue subpixel B-sub may be 40 nm to 75 nm, but embodiments of the present disclosure are not limited thereto.

According to an embodiment of the present disclosure, a sum of a thickness of the hole injection layer 6111, a thickness of the first hole transport layer 6131, a thickness of the first emission layer 6211, and a thickness of the first electron transport layer 631 of the red subpixel R-sub may be different from a sum of a thickness of the hole injection layer 6111, a thickness of the first hole transport layer 6131, a thickness of the first emission layer 6271, and a thickness of the first electron transport layer 631 of the white subpixel W-sub, a sum of a thickness of the hole injection layer 6111, a thickness of the first hole transport layer 6131, a thickness of the first emission layer 6231, and a thickness of the first electron transport layer 631 of the green subpixel G-sub, and a sum of a thickness of the hole injection layer 6111, a thickness of the first hole transport layer 6131, a thickness of the first emission layer 6251, and a thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6271, and the thickness of the first electron transport layer 631 of the white subpixel W-sub, the sum of the thickness of the hole injection layer 6111, the thickness of the first hole transport layer 6131, the thickness of the first emission layer 6231, and the thickness of the first electron transport layer 631 of the green subpixel G-sub, and the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub may be greater than the sum of the thickness of the hole injection layer 6111, the thickness of the first hole transport layer 6131, the thickness of the first emission layer 6271, and the thickness of the first electron transport layer 631 of the white subpixel W-sub. For example, the sum of the thickness of the hole injection layer 6111, the thickness of the first hole transport layer 6131, the thickness of the first emission layer 6271, and the thickness of the first electron transport layer 631 of the white subpixel W-sub may be greater than or equal to the sum of the thickness of the hole injection layer 6111, the thickness of the first hole transport layer 6131, the thickness of the first emission layer 6231, and the thickness of the first electron transport layer 631 of the green subpixel G-sub. For example, the sum of the thickness of the hole injection layer 6111, the thickness of the first hole transport layer 6131, the thickness of the first emission layer 6231, and the thickness of the first electron transport layer 631 of the green subpixel G-sub may be greater than the sum of the thickness of the hole injection layer 6111, the thickness of the first hole transport layer 6131, the thickness of the first emission layer 6251, and the thickness of the first electron transport layer 631 of the blue subpixel B-sub. For example, the sum of the thickness of the hole injection layer 6111, the thickness of the first hole transport layer 6131, the thickness of the first emission layer 6211, and the thickness of the first electron transport layer 631 of the red subpixel R-sub 115 nm to 165 nm, but embodiments of the present disclosure are not limited thereto. For example, the sum of the thickness of the hole injection layer 6111, the thickness of the first hole transport layer 6131, the thickness of the first emission layer 6271, and the thickness of the first electron transport layer 631 of the white subpixel W-sub may be 50 nm to 100 nm, but embodiments of the present disclosure are not limited thereto. For example, the sum of the thickness of the hole injection layer 6111, the thickness of the first hole transport layer 6131, the thickness of the first emission layer 6231, and the thickness of the first electron transport layer 631 of the green subpixel G-sub may be 40 nm to 100 nm, but embodiments of the present disclosure are not limited thereto. For example, the sum of the thickness of the hole injection layer 6111, the thickness of the first hole transport layer 6131, the thickness of the first emission layer 6251, and the thickness of the first electron transport layer 631 of the blue subpixel B-sub 40 nm to 75 nm, but embodiments of the present disclosure are not limited thereto.

According to an embodiment of the present disclosure, the hole injection layer 6111, the first hole transport layer 6131, and the first emission layers 6211, 6231, 6251, and 6271 are formed by a solution process, and thus, a thickness of layers configuring the first emission part 3100 may be adjusted. For example, a thickness of the hole injection layer 6111, the first hole transport layer 6131, and the first emission layers 6211, 6231, 6251, and 6271 of the first emission part 3100 may be adjusted, and thus, a thickness of layers between the first electrode 501 and the second electrode 505 may be differently implemented for each subpixel. Therefore, a multi-cavity effect may be obtained based on a change in thickness of the layers between the first electrode 501 and the second electrode 505, and thus, the luminance and/or efficiency of the display apparatus 3 may be enhanced. For example, a thickness of the layers between the first electrode 501 and the second electrode 505 may be different for each subpixel, and different cavity characteristics for each subpixel may be obtained based on a change in thickness of the layers between the first electrode 501 and the second electrode 505. Accordingly, the display apparatus 3 may be provided where efficiency is improved and a current is reduced for each subpixel.

According to an embodiment of the present disclosure, a second emission part 3200 may be disposed on the first emission part 3100. Layers of the second emission part 3200 may be at the red subpixel R-sub, the green subpixel G-sub, and the blue subpixel B-sub. For example, layers of the second emission part 3200 may be at the red subpixel R-sub, the green subpixel G-sub, the blue subpixel B-sub, and the white subpixel W-sub. Layers of the second emission part 3200 may be formed by a deposition process. For example, layers of the second emission part 3200 may be conformally formed along surfaces of the first emission layers 6211, 6231, 6251, and 6271. For example, the layers of the second emission part 3200 may be formed to correspond to a cross-sectional profile of the first emission layers 6211, 6231, 6251, and 6271. For example, a surface shape of the layers of the second emission part 3200 may be based on a surface shape of the first emission layers 6211, 6231, 6251, and 6271. For example, the second emission part 3200 may include a second hole functional layer, an emission layer, and a second electron functional layer, but embodiments of the present disclosure are not limited thereto. For example, the second emission part 3200 may include a second hole transport layer 713, a second emission layer 725, and a second electron transport layer 731, but embodiments of the present disclosure are not limited thereto.

The second emission layer 725 may be disposed on the second hole transport layer 713. The second hole transport layer 713 may be at the red subpixel R-sub, the green subpixel G-sub, and the blue subpixel B-sub. For example, the second hole transport layer 713 may be at the red subpixel R-sub, the green subpixel G-sub, the blue subpixel B-sub, and the white subpixel W-sub. The second hole transport layer 713 may be formed by a deposition process. For example, the second hole transport layer 713 may be conformally formed along a surface of the first emission layers 6211, 6231, 6251, and 6271. For example, the second hole transport layer 713 may be formed to correspond to a cross-sectional profile of the surface of the first emission layers 6211, 6231, 6251, and 6271. For example, a surface shape of the second hole transport layer 713 may be based on the surface shape of the first emission layers 6211, 6231, 6251, and 6271. The second emission layer 725 may be formed by a deposition process. For example, the second emission layer 725 may be conformally formed along a surface of the first emission layers 6211, 6231, 6251, and 6271. For example, the second emission layer 725 may be formed to correspond to a cross-sectional profile of the surface of the first emission layers 6211, 6231, 6251, and 6271. For example, a surface shape of the second emission layer 725 may be based on the surface shape of the first emission layers 6211, 6231, 6251, and 6271.

The second emission layer 725 may be an emission layer which emits blue light. For example, the second emission layer 725 may be at the red subpixel R-sub, the green subpixel G-sub, the blue subpixel B-sub, and the white subpixel W-sub. For example, the second emission layer 725 may include at least one or more dopants and at least one or more hosts, but embodiments of the present disclosure are not limited thereto. The dopant may be a fluorescent dopant or a phosphorescent dopant. For example, the dopant of the second emission layer 725 may include a blue fluorescent dopant, but embodiments of the present disclosure are not limited thereto. For example, a peak wavelength of the second emission layer 725 may be within a range of 420 nm to 480 nm. For example, the second emission layer 725 may emit light in a wavelength of 420 nm to 480 nm. The at least one or more hosts may include a host having a hole characteristic and a host having an electron characteristic, but embodiments of the present disclosure are not limited thereto.

The second electron transport layer 731 may be disposed on the second emission layer 725. For example, the second electron transport layer 731 may be at the red subpixel R-sub, the green subpixel G-sub, and the blue subpixel B-sub. For example, the second electron transport layer 731 may be at the red subpixel R-sub, the green subpixel G-sub, the blue subpixel B-sub, and the white subpixel W-sub. For example, the first electron transport layer 631 may be on the second emission layer 725 of the red subpixel R-sub, the green subpixel G-sub, the blue subpixel B-sub, and the white subpixel W-sub. For example, the second electron transport layer 731 may be formed by a deposition process. For example, the second electron transport layer 731 may be conformally formed along a surface of the first emission layers 6211, 6231, 6251, and 6271. For example, the second electron transport layer 731 may be formed to correspond to a cross-sectional profile of the surface of the first emission layers 6211, 6231, 6251, and 6271. For example, a surface shape of the second electron transport layer 731 may be based on the surface shape of the first emission layers 6211, 6231, 6251, and 6271. The second electron transport layer 731 may include the same material as the first electron transport layer 631, but embodiments of the present disclosure are not limited thereto.

A first charge generating layer may be provided between the first emission part 3100 and the second emission part 3200. For example, the first charge generating layer may be provided on the first emission part 3100. For example, the first charge generating layer may be at the red subpixel R-sub, the green subpixel G-sub, and the blue subpixel B-sub. For example, the first charge generating layer may be at the red subpixel R-sub, the green subpixel G-sub, the blue subpixel B-sub, and the white subpixel W-sub. The first charge generating layer may be formed by a deposition process. For example, the first charge generating layer may be conformally formed along the surface of the first emission layers 6211, 6231, 6251, and 6271. For example, the first charge generating layer may be formed to correspond to a cross-sectional profile of the first emission layers 6211, 6231, 6251, and 6271. For example, a surface shape of the first charge generating layer may be based on a surface shape of the first emission layers 6211, 6231, 6251, and 6271. The first charge generating layer may include a first N-type charge generating layer 641 and a first P-type charge generating layer 642. For example, the second hole transport layer 713 may be disposed on the first P-type charge generating layer 642. A description of the first charge generating layer may be substantially the same as the description of the first charge generating layer described above with reference to FIG. 4, and thus, a description thereof is omitted.

According to an embodiment of the present disclosure, a third emission part 3300 may be disposed on the second emission part 3200. Layers of the third emission part 3300 may be at the red subpixel R-sub, the green subpixel G-sub, and the blue subpixel B-sub. For example, layers of the third emission part 3300 may be at the red subpixel R-sub, the green subpixel G-sub, the blue subpixel B-sub, and the white subpixel W-sub. Layers of the third emission part 3300 may be formed by a deposition process. For example, the third emission part 3300 may be conformally formed along the surface shape of the first emission layers 6211, 6231, 6251, and 6271. For example, the layers of the third emission part 3300 may be formed to correspond to a cross-sectional profile of the first emission layers 6211, 6231, 6251, and 6271. For example, a surface shape of the third emission part 3300 may be based on surface shapes of the first emission layers 6211, 6231, 6251, and 6271. For example, the third emission part 3300 may include a hole functional layer, an emission layer, and an electron functional layer, but embodiments of the present disclosure are not limited thereto. For example, the third emission part 3300 may include a third hole transport layer 813, at least one or more emission layer, and a third electron transport layer 831, but embodiments of the present disclosure are not limited thereto. The at least one or more emission layer may include a third emission layer 823 and a fourth emission layer 825, but embodiments of the present disclosure are not limited thereto. For example, the third emission layer 823 and the fourth emission layer 825 may be disposed on the red subpixel R-sub, the green subpixel G-sub, the blue subpixel B-sub, and the white subpixel W-sub.

The third hole transport layer 813 may be disposed at the red subpixel R-sub, the green subpixel G-sub, and the blue subpixel B-sub. For example, the third hole transport layer 813 may be at the red subpixel R-sub, the green subpixel G-sub, the blue subpixel B-sub, and the white subpixel W-sub. For example, the third emission layer 823 may be disposed on the third hole transport layer 813 of the red subpixel R-sub, the green subpixel G-sub, the blue subpixel B-sub, and the white subpixel W-sub. The third hole transport layer 813 may be formed by a deposition process. For example, the third hole transport layer 813 may be conformally formed along the surface of the first emission layers 6211, 6231, 6251, and 6271. For example, the third hole transport layer 813 may be formed to correspond to a cross-sectional profile of the first emission layers 6211, 6231, 6251, and 6271. For example, a surface shape of the third hole transport layer 813 may be based on the surface shape of the first emission layers 6211, 6231, 6251, and 6271.

The third emission layer 823 may be disposed on the third hole transport layer 813. For example, the third emission layer 823 may be disposed at the red subpixel R-sub, the green subpixel G-sub, and the blue subpixel B-sub. For example, the third emission layer 823 may be disposed at the red subpixel R-sub, the green subpixel G-sub, the blue subpixel B-sub, and the white subpixel W-sub. The third emission layer 823 may be formed by a deposition process. For example, the third emission layer 823 may be conformally formed along the surface of the first emission layers 6211, 6231, 6251, and 6271. For example, the third emission layer 823 may be formed to correspond to a cross-sectional profile of the first emission layers 6211, 6231, 6251, and 6271. For example, a surface shape of the third emission layer 823 may be based on the surface shape of the first emission layers 6211, 6231, 6251, and 6271.

The third emission layer 823 may be an emission layer which emits green light. For example, the third emission layer 823 may include at least one or more dopants and at least one or more hosts, but embodiments of the present disclosure are not limited thereto. The dopant may be a fluorescent dopant or a phosphorescent dopant. For example, the dopant of the third emission layer 823 may include a green phosphorescent dopant, but embodiments of the present disclosure are not limited thereto. For example, a peak wavelength of the third emission layer 823 may be within a range of 520 nm to 590 nm. For example, the third emission layer 823 may emit light in a wavelength of 520 nm to 590 nm. The at least one or more hosts may include a host having a hole characteristic and a host having an electron characteristic, but embodiments of the present disclosure are not limited thereto.

The fourth emission layer 825 may be disposed on the third emission layer 823. The fourth emission layer 825 may be at the red subpixel R-sub, the green subpixel G-sub, and the blue subpixel B-sub. For example, the fourth emission layer 825 may be at the red subpixel R-sub, the green subpixel G-sub, the blue subpixel B-sub, and the white subpixel W-sub. The fourth emission layer 825 may be formed by a deposition process. For example, the fourth emission layer 825 may be conformally formed along a surface of the first emission layers 6211, 6231, 6251, and

6271. For example, the fourth emission layer 825 may be formed to correspond to a cross-sectional profile of the surface of the first emission layers 6211, 6231, 6251, and 6271. For example, a surface shape of the fourth emission layer 825 may be based on the surface shape of the first emission layers 6211, 6231, 6251, and 6271. The fourth emission layer 825 may be an emission layer which emits red light. For example, the fourth emission layer 825 may include at least one or more dopants and at least one or more hosts, but embodiments of the present disclosure are not limited thereto. The dopant may be a fluorescent dopant or a phosphorescent dopant. For example, the dopant of the fourth emission layer 825 may include a red phosphorescent dopant, but embodiments of the present disclosure are not limited thereto. For example, a peak wavelength of the fourth emission layer 825 may be within a range of 600 nm to 650 nm. For example, the fourth emission layer 825 may emit light in a wavelength of 600 nm to 650 nm. The at least one or more hosts may include a host having a hole characteristic and a host having an electron characteristic, but embodiments of the present disclosure are not limited thereto. For example, the third emission layer 823 and the fourth emission layer 825 may be a third emission layer, but the terms are not limited thereto.

A second charge generating layer may be provided between the second emission part 3200 and the third emission part 3300. For example, the second charge generating layer may be provided on the second emission part 3200. For example, the second charge generating layer may be at the red subpixel R-sub, the green subpixel G-sub, and the blue subpixel B-sub. For example, the second charge generating layer may be at the red subpixel R-sub, the green subpixel G-sub, the blue subpixel B-sub, and the white subpixel W-sub. The second charge generating layer may be formed by a deposition process. For example, the second charge generating layer may be conformally formed along the surface of the first emission layers 6211, 6231, 6251, and 6271. For example, the second charge generating layer may be formed to correspond to a cross-sectional profile of the first emission layers 6211, 6231, 6251, and 6271. For example, a surface shape of the second charge generating layer may be based on a surface shape of the first emission layers 6211, 6231, 6251, and 6271. The second charge generating layer may include a second N-type charge generating layer 741 and a second P-type charge generating layer 742. For example, the third hole transport layer 813 may be disposed on the second P-type charge generating layer 742. A description of the second charge generating layer may be substantially the same as the description of the first charge generating layer described above with reference to FIG. 4, and thus, a description thereof is omitted.

According to an embodiment of the present disclosure, a fourth emission part 3400 may be disposed on the third emission part 3300. Layers of the fourth emission part 3400 may be at the red subpixel R-sub, the green subpixel G-sub, and the blue subpixel B-sub. For example, layers of the fourth emission part 3400 may be at the red subpixel R-sub, the green subpixel G-sub, the blue subpixel B-sub, and the white subpixel W-sub. Layers of the fourth emission part 3400 may be formed by a deposition process. For example, the fourth emission part 3400 may be conformally formed along the surface shape of the first emission layers 6211, 6231, 6251, and 6271. For example, the layers of the fourth emission part 3400 may be formed to correspond to a cross-sectional profile of the first emission layers 6211, 6231, 6251, and 6271. For example, a surface shape of the fourth emission part 3400 may be based on surface shapes of the first emission layers 6211, 6231, 6251, and 6271. For example, the fourth emission part 3400 may include a fourth hole functional layer, an emission layer, and a fourth electron functional layer, but embodiments of the present disclosure are not limited thereto. For example, the fourth emission part 3400 may include at least one or more hole transport layer, a fifth emission layer 921, and a fourth electron transport layer 931, but embodiments of the present disclosure are not limited thereto. The at least one or more hole transport layer may include a fourth hole transport layer 913 and a fifth hole transport layer 915, but embodiments of the present disclosure are not limited thereto.

The fourth hole transport layer 913 and the fifth hole transport layer 915 may be disposed on the third emission part 3300. For example, the fourth hole transport layer 913 and the fifth hole transport layer 915 may be at the red subpixel R-sub, the green subpixel G-sub, and the blue subpixel B-sub. For example, the fourth hole transport layer 913 and the fifth hole transport layer 915 may be at the red subpixel R-sub, the green subpixel G-sub, the blue subpixel B-sub, and the white subpixel W-sub. For example, the fifth hole transport layer 915 may be disposed on the fourth hole transport layer 913. The fourth hole transport layer 913 and the fifth hole transport layer 915 may be formed by a deposition process. For example, the fourth hole transport layer 913 and the fifth hole transport layer 915 may be conformally formed along the surface of the first emission layers 6211, 6231, 6251, and 6271. For example, the fourth hole transport layer 913 and the fifth hole transport layer 915 may be formed to correspond to a cross-sectional profile of the first emission layers 6211, 6231, 6251, and 6271. For example, a surface shape of the fourth hole transport layer 913 and the fifth hole transport layer 915 may be based on the surface shape of the first emission layers 6211, 6231, 6251, and 6271. The fourth hole transport layer 913 and the fifth hole transport layer 915 may include the same material as the second hole transport layer 713, but embodiments of the present disclosure are not limited thereto. As another example, fourth hole transport layer 913 and the fifth hole transport layer 915 may be provided as one transport layer, or one of the fourth hole transport layer 913 and the fifth hole transport layer 915 may be omitted. For example, the fourth hole transport layer 913 and the fifth hole transport layer 915 may be the fourth hole transport layer, but embodiments of the present disclosure are not limited thereto.

The fifth emission layer 921 may be disposed on the fifth hole transport layer 915. For example, the fifth emission layer 921 may be at the red subpixel R-sub, the green subpixel G-sub, and the blue subpixel B-sub. For example, the fifth emission layer 921 may be disposed at the red subpixel R-sub, the green subpixel G-sub, the blue subpixel B-sub, and the white subpixel W-sub. The fifth emission layer 921 may be formed by a deposition process. For example, the fifth emission layer 921 may be conformally formed along the surface of the first emission layers 6211, 6231, 6251, and 6271. For example, the fifth emission layer 921 may be formed to correspond to a cross-sectional profile of the first emission layers 6211, 6231, 6251, and 6271. For example, a surface shape of the fifth emission layer 921 may be based on the surface shape of the first emission layers 6211, 6231, 6251, and 6271. For example, the fifth emission layer 921 may be a fourth emission layer, but the terms are not limited thereto.

The fifth emission layer 921 may be an emission layer which emits blue light. For example, the fifth emission layer 921 may include at least one or more dopants and at least one or more hosts, but embodiments of the present disclosure are not limited thereto. The dopant may be a fluorescent dopant or a phosphorescent dopant. For example, the dopant of the fifth emission layer 921 may include a blue fluorescent dopant, but embodiments of the present disclosure are not limited thereto. For example, a peak wavelength of the fifth emission layer 921 may be within a range of 420 nm to 480 nm. For example, the fifth emission layer 921 may emit light in a wavelength of 420 nm to 480 nm. The at least one or more hosts may include a host having a hole characteristic and a host having an electron characteristic, but embodiments of the present disclosure are not limited thereto.

The fourth electron transport layer 931 may be disposed on the fifth emission layer 921. For example, the fourth electron transport layer 931 may be at the red subpixel R-sub, the green subpixel G-sub, and the blue subpixel B-sub. For example, the fourth electron transport layer 931 may be at the red subpixel R-sub, the green subpixel G-sub, the blue subpixel B-sub, and the white subpixel W-sub. For example, the fourth electron transport layer 931 may be formed by a deposition process. For example, the fourth electron transport layer 931 may be conformally formed along a surface of the first emission layers 6211, 6231, 6251, and 6271. For example, the fourth electron transport layer 931 may be formed to correspond to a cross-sectional profile of the surface of the first emission layers 6211, 6231, 6251, and 6271. For example, a surface shape of the fourth electron transport layer 931 may be based on the surface shape of the first emission layers 6211, 6231, 6251, and 6271. The fourth electron transport layer 931 may include the same material as the first electron transport layer 631, but embodiments of the present disclosure are not limited thereto.

A third charge generating layer may be provided between the third emission part 3300 and the fourth emission part 3400. For example, the third charge generating layer may be at the red subpixel R-sub, the green subpixel G-sub, and the blue subpixel B-sub. For example, the third charge generating layer may be at the red subpixel R-sub, the green subpixel G-sub, the blue subpixel B-sub, and the white subpixel W-sub. The third charge generating layer may be formed by a deposition process. For example, the third charge generating layer may be conformally formed along the surface of the first emission layers 6211, 6231, 6251, and 6271. For example, the third charge generating layer may be formed to correspond to a cross-sectional profile of the first emission layers 6211, 6231, 6251, and 6271. For example, a surface shape of the third charge generating layer may be based on a surface shape of the first emission layers 6211, 6231, 6251, and 6271. The third charge generating layer may include a third N-type charge generating layer 841 and a third P-type charge generating layer 842. For example, the fourth hole transport layer 913 may be disposed on the third P-type charge generating layer 842. A description of the third charge generating layer may be substantially the same as the description of the second charge generating layer described above with reference to FIG. 4, and thus, a description thereof is omitted.

According to an embodiment of the present disclosure, surface shapes of the first charge generating layers 641 and 642, the second emission part 3200, the second charge generating layers 741 and 742, the third emission part 3300, the third charge generating layers 841 and 842, and the fourth emission part 3400 may be based on surface shapes of the first emission layers 6211, 6231, 6251, and 6271.

According to an embodiment of the present disclosure, an electron injection layer 811 may be further provided on the fourth emission part 3400. For example, the electron injection layer 811 may be disposed on the fourth electron transport layer 931. The electron injection layer 811 may be formed by a deposition process. For example, the electron injection layer 811 may be conformally formed along the surface of the first emission layers 6211, 6231, 6251, and 6271. For example, the electron injection layer 811 may be formed to correspond to a cross-sectional profile of the first emission layers 6211, 6231, 6251, and 6271. For example, a surface shape of the electron injection layer 811 may be based on the surface shape of the first emission layers 621, 623, 625, and 627. A second electrode 505 may be disposed on the electron injection layer 811. The second electrode 505 may be formed by a deposition process. For example, the second electrode 505 may be conformally formed along the surface of the first emission layers 6211, 6231, 6251, and 6271. For example, the second electrode 505 may be formed to correspond to a cross-sectional profile of the first emission layers 6211, 6231, 6251, and 6271. For example, a surface A color filter may be disposed on the second electrode 505. The color filter may include a red color filter, a green color filter, a blue color filter, and a white color filter. For example, the red color filter may be disposed to correspond to the red subpixel R-sub. For example, the green color filter may be disposed to correspond to the green subpixel G-sub. For example, the blue color filter may be disposed to correspond to the blue subpixel B-sub. For example, the white color filter may be disposed to correspond to the white subpixel W-sub. Accordingly, the display apparatus may output light based on a wavelength which is selectively transmitted by the color filter.

The following Table 3 represents efficiency according to an experimental example and another embodiment of the present disclosure. The experimental example may be the same as the descriptions of Table 1, and thus, repeated descriptions thereof are omitted.

TABLE 3

| | | Experimental Example | | | | Embodiment | | | |
| --- | --- | --- | --- | --- | --- | --- | --- | --- | --- |
| | | R | G | B | W | R | G | B | W |
| Device | CIEx | 0.682 | 0.252 | 0.155 | 0.273 | 0.680 | 0.262 | 0.150 | 0.251 |
| Characteristic | CIEy | 0.316 | 0.715 | 0.042 | 0.285 | 0.316 | 0.705 | 0.057 | 0.285 |
| | Efficiency | 3.70 | 15.40 | 4.90 | 74.70 | 32.40 | 76.00 | 8.90 | 64.00 |
| Panel | Luminance | 5.40 | 13.30 | 0.80 | 48.60 | 8.00 | 11.10 | 0.90 | 47.90 |
| Characteristic | Current | 2.69 | 1.60 | 0.31 | 1.21 | 0.45 | 0.27 | 0.19 | 1.39 |
| | Panel Efficiency | | 21.76 | | | | 54.57 | | | shape of the second electrode 505 may be based on the surface shape of the first emission layers 6211, 6231, and 6271. A description of the electron injection layer 811 and the second electrode 505 may be substantially the same as the description of the electron injection layer 811 and the second electrode 505 described above with reference to FIG. 4, and thus, a description thereof is omitted.

According to an embodiment of the present disclosure, at least one or more emission part of the first emission part 3100, the second emission part 3200, the third emission part 3300, and the fourth emission part 3400 may be formed by a process which differs from other one or more emission parts. For example, the first emission part 3100 may be formed by a solution process, and at least one or more of the second emission part 3200, the third emission part 3300, and the fourth emission part 3400 may be formed by a deposition process. For example, the hole injection layer 611, the first hole transport layer 613, and the first emission layers 6211, 6231, 6251, and 6271 in the first emission part 3100 may be formed by a solution process. For example, the first electron transport layer 631, the first charge generating layers 641 and 642, the second emission part 3200, the second charge generating layers 741 and 742, the third charge generating layers 841 and 842, the third emission part 3300, the electron injection layer 811, and the second electrode 505, which are at the first emission layers 6211, 6231, 6251, and 6271, may be formed by a deposition process.

According to an embodiment of the present disclosure, a surface shape of the first electron transport layer 631, the first charge generating layers 641 and 642, the second emission part 3200, the second charge generating layers 741 and 742, the third charge generating layers 841 and 842, the third emission part 3300, the electron injection layer 811, and the second electrode 505 may be based on a surface shape of the first emission layers 6211, 6231, 6251, and 6271.

In Table 3, a device characteristic, color coordinates and efficiency have been measured. The device characteristic has been measured under a condition where a display apparatus is configured as in FIG. 6. The efficiency of an embodiment represents a relative value compared to the efficiency of the experimental example. Color coordinates of red of the experimental example have been measured to be (0.682, 0.316), and color coordinates of red of an embodiment have been measured to be (0.680, 0.316). Color coordinates of green of the experimental example have been measured to be (0.252, 0.715), and color coordinates of green of an embodiment have been measured to be (0.262, 0.705). Color coordinates of blue of the experimental example have been measured to be (0.155, 0.042), and color coordinates of blue of an embodiment have been measured to be (0.150, 0.057). Color coordinates of white of the experimental example have been measured to be (0.273, 0.285), and color coordinates of white of an embodiment have been measured to be (0.251, 0.285). Accordingly, it may be seen that an embodiment of the present disclosure has a color coordinate characteristic similar to the experimental example, or is enhanced in color coordinate characteristic of white. For example, it may be seen that an embodiment where a hole injection layer, a hole transport layer, and an emission layer are formed by a solution process has a color coordinate characteristic similar to the experimental example, or is enhanced in color coordinate characteristic of white.

An efficiency of red of the experimental example has been measured to be 3.70 cd/A, and the efficiency of red of an embodiment has been measured to be 32.40 cd/A. An efficiency of green of the experimental example has been measured to be 15.40 cd/A, and the efficiency of green of an embodiment has been measured to be 76.00 cd/A. An efficiency of blue of the experimental example has been measured to be 4.90 cd/A, and the efficiency of blue of an embodiment has been measured to be 8.90 cd/A. An efficiency of white of the experimental example has been measured to be 74.70 cd/A, and the efficiency of white of an embodiment has been measured to be 64.00 cd/A. Accordingly, it may be seen that an embodiment of the present disclosure is enhanced more in efficiency than the experimental example. For example, it may be seen that an embodiment of the present disclosure is enhanced more in red, green, and blue efficiency than the experimental example. For example, it may be seen that an embodiment where the hole injection layer, the hole transport layer, and an emission layer are formed by the solution process and is configured in four emission parts is enhanced more in red, green, and blue efficiency than the experimental example.

Table 3 shows that the luminance, the current, and the panel efficiency have been measured in a case where a display apparatus is driven based on a dynamic image. Luminance represents average luminance. The panel characteristic has been measured under a condition where the display apparatus of FIG. 3 is configured and the light emitting device layer 503 of FIG. 3 is configured as in FIG. 6.

The luminance of red of the experimental example has been measured to be 5.40 cd/m$^2$, and the luminance of red of an embodiment has been measured to be 8.00 cd/m$^2$. The luminance of green of the experimental example has been measured to be 13.30 cd/m$^2$, and the luminance of green of an embodiment has been measured to be 11.10 cd/m$^2$. The luminance of blue of the experimental example has been measured to be 0.80 cd/m$^2$, and the luminance of blue of an embodiment has been measured to be 0.90 cd/m$^2$. The luminance of white of the experimental example has been measured to be 48.60 cd/m$^2$, and the luminance of white of an embodiment has been measured to be 47.90 cd/m$^2$. For example, average luminance of red, green, blue, and white of the experimental example has been measured to be 68.10 cd/m$^2$, and average luminance of red, green, blue, and white of an embodiment has been measured to be 67.90 cd/m$^2$. Accordingly, it may be seen that an embodiment of the present disclosure has luminance similar to the experimental example. For example, it may be seen that an embodiment where the hole injection layer, the hole transport layer, and an emission layer are formed by the solution process and is configured in four emission parts has luminance similar to the experimental example.

The current of red of the experimental example has been measured to be 2.69 A, and the current of red of an embodiment has been measured to be 0.45 A. The current of green of the experimental example has been measured to be 1.6 A, and the current of green of an embodiment has been measured to be 0.27 A. The current of blue of the experimental example has been measured to be 0.31 A, and the current of blue of an embodiment has been measured to be 0.19 A. The current of white of the experimental example has been measured to be 1.21 A, and the current of white of an embodiment has been measured to be 1.39 A. For example, average current of red, green, blue, and white of the experimental example has been measured to be 5.81 A, and average current of red, green, blue, and white of an embodiment has been measured to be 2.30 A. Accordingly, it may be seen that an embodiment of the present disclosure is reduced more in current than the experimental example. For example, it may be seen that an embodiment of the present disclosure is reduced more in current of red, green, blue, and white than the experimental example. For example, it may be seen that an embodiment where the hole injection layer, the hole transport layer, and an emission layer are formed by the solution process and is configured in four emission parts is reduced more in current of red, green, blue, and white than the experimental example.

The panel efficiency of the experimental example has been measured to be 21.76 cd/A, and the panel efficiency of an embodiment has been measured to be 54.57 cd/A. The panel efficiency of an embodiment represents a relative value compared to the panel efficiency of the experimental example. Accordingly, it may be seen that an embodiment of the present disclosure is enhanced more in panel efficiency than the experimental example. For example, it may be seen that an embodiment of the present disclosure is enhanced about 251% more in panel efficiency than the experimental example. For example, it may be seen that an embodiment where the hole injection layer, the hole transport layer, and an emission layer are formed by the solution process and is configured in four emission parts is enhanced more in panel efficiency than the experimental example.

In an embodiment where the hole injection layer, the hole transport layer, and an emission layer according to an embodiment of the present disclosure is formed by the solution process and is configured in four emission parts, it may be seen that the device efficiency and the panel efficiency in a dynamic image are enhanced and a current in a dynamic image is reduced. Accordingly, a display apparatus may be provided where efficiency is enhanced and a current is reduced.

Figure 7A:
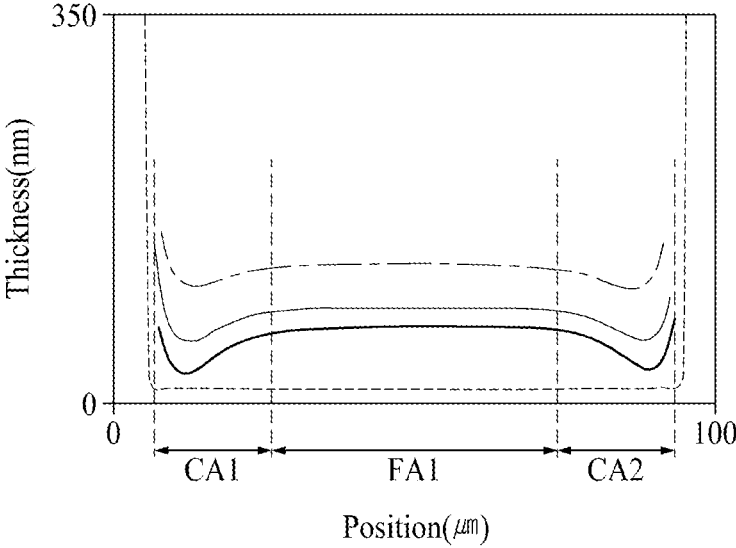
FIGS. 7A and 7B illustrate cross-sectional profiles of a hole transfer layer and an emission layer according to an embodiment of the present disclosure.
Figure 7B:
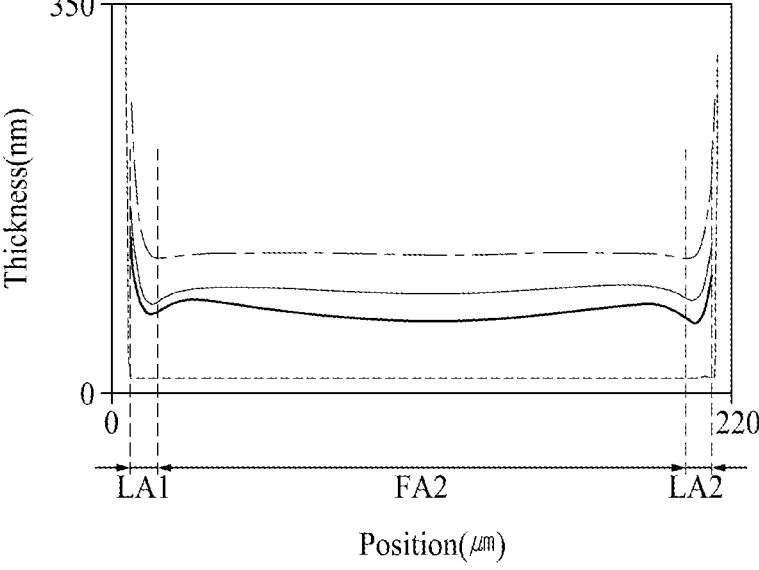

FIGS. 7A and 7B illustrate cross-sectional profiles of a hole functional layer and an emission layer according to an embodiment of the present disclosure.

FIGS. 7A and 7B illustrate cross-sectional profiles of a hole functional layer and an emission layer of a pixel at the blue subpixel B-sub of FIG. 5. The hole functional layer may include a hole injection layer and a first hole transport layer. For example, FIGS. 7A and 7B illustrate cross-sectional profiles of a hole injection layer, a hole transport layer, and an emission layer of a pixel in the blue subpixel B-sub. FIG. 7A is a cross-sectional profile of a short axis of a pixel in the blue subpixel B-sub, and FIG. 7B is a cross-sectional profile of a long axis of a pixel in the blue subpixel B-sub.

In FIGS. 7A and 7B, the abscissa axis represents a position (or distance) (unit: μm), and the ordinate axis represents a thickness (unit: nm). For example, the abscissa axis may be a length of a long axis and a length of a short axis of a pixel. FIGS. 7A and 7B are for showing cross-sectional profiles of a hole functional layer and an emission layer, and numerical values of the abscissa axis and the ordinate axis in FIGS. 7A and 7B may not limit the descriptions of the present disclosure.

In FIGS. 7A and 7B, a thick solid line represents a hole injection layer, and a thin solid line represents a hole injection layer and a first hole transport layer. A dash-single dotted line represents a hole injection layer, a first hole transport layer, and a first emission layer. A thin dotted line represents a first electrode.

Referring to FIG. 7A, a hole injection layer may be formed by a solution process, and thus, may have a U-shape. A first hole transport layer and a first emission layer formed on the hole injection layer may be formed by a solution process, and thus, may be formed along a shape of the hole injection layer. For example, the hole injection layer, the first hole transport layer, and the first emission layer may have a U-shape.

According to an embodiment of the present disclosure, the hole injection layer may include a first flat portion FA1, a first curved portion CA1, and a second curved portion CA2. The first flat portion FA1 may be disposed between the first curved portion CA1 and the second curved portion CA2. A height of a center portion of the first flat portion FA1 may not be equal to a height of an outer portion thereof adjacent to the first curved portion CA1 and the second curved portion CA2. Each of the first curved portion CA1 and the second curved portion CA2 may be a region where a thickness thereof is thinned progressively toward an inner portion thereof adjacent to the first flat portion FA1.

Referring to FIG. 7B, a profile shape of a long axis of a pixel may be different from a profile shape of a short axis of the pixel at the blue subpixel B-sub of FIG. 7A. For example, a hole injection layer may be formed by a solution process, and thus, may have a concave shape. A first hole transport layer and a first emission layer formed on the hole injection layer may be formed by a solution process, and thus, may be formed along a shape of the hole injection layer. For example, the hole injection layer, the first hole transport layer, and the first emission layer may have a concave shape.

According to an embodiment of the present disclosure, the hole injection layer may include a second flat portion FA2, a first rectilinear portion LA1, and a second rectilinear portion LA2. A portion of the second flat portion FA2 may include a curved portion. The second flat portion FA2 may be disposed between the first rectilinear portion LA1 and the second rectilinear portion LA2. A thickness of the first rectilinear portion LA1 adjacent to a first electrode may be different from a thickness of a first curved portion CA1 adjacent to the first electrode. For example, a thickness of the first rectilinear portion LA1 adjacent to the first electrode may be greater than a thickness of the first curved portion CAL A thickness of the second rectilinear portion LA2 adjacent to the first electrode may be different from a thickness of a second curved portion CA2 adjacent to the first electrode. For example, a thickness of the second rectilinear portion LA2 adjacent to the first electrode may be greater than a thickness of the second curved portion CA2 adjacent to the first electrode. Each of the first rectilinear portion LA1 and the second rectilinear portion LA2 may be a region where a thickness thereof is thicker progressively toward an outer portion thereof adjacent to the second flat portion FA2.

According to an embodiment of the present disclosure, in the hole injection layer of the blue subpixel B-sub, a cross-sectional profile of a short axis of a pixel may be different from a cross-sectional profile of a long axis of the pixel. For example, in the hole injection layer of the blue subpixel B-sub, the cross-sectional profile of the short axis of the pixel may have a U-shape. For example, in the hole injection layer of the blue subpixel B-sub, the cross-sectional profile of the short axis of the pixel may have a concave shape. For example, in the hole injection layer of the blue subpixel B-sub, a height of a center portion of a first flat portion FA1 of the cross-sectional profile of the short axis of the pixel may be different from a height of a center portion of a second flat portion FA2 of the cross-sectional profile of the long axis of the pixel. For example, in the hole injection layer of the blue subpixel B-sub, a height of the center portion of the first flat portion FA1 of the cross-sectional profile of the short axis of the pixel may be greater than a height of the center portion of the second flat portion FA2 of the cross-sectional profile of the long axis of the pixel.

According to an embodiment of the present disclosure, in the blue subpixel B-sub, a thickness of the hole injection layer adjacent to the first electrode in the cross-sectional profile of the short axis of the pixel may be different from a thickness of the hole injection layer adjacent to the first electrode in the cross-sectional profile of the long axis of the pixel. For example, in the blue subpixel B-sub, a thickness of the hole injection layer adjacent to the first electrode in the cross-sectional profile of the short axis of the pixel may be greater than a thickness of the hole injection layer adjacent to the first electrode in the cross-sectional profile of the long axis of the pixel.

Figure 8A:
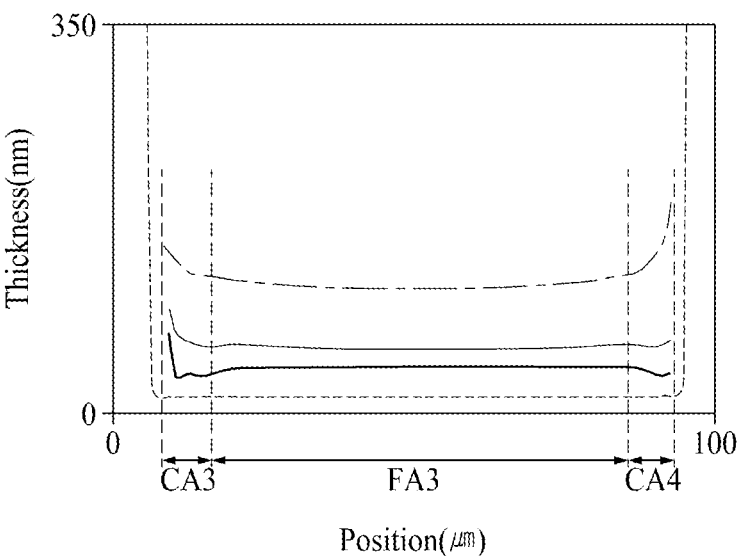
FIGS. 8A and 8B illustrate cross-sectional profiles of a hole transfer layer and an emission layer according to an embodiment of the present disclosure.
Figure 8B:
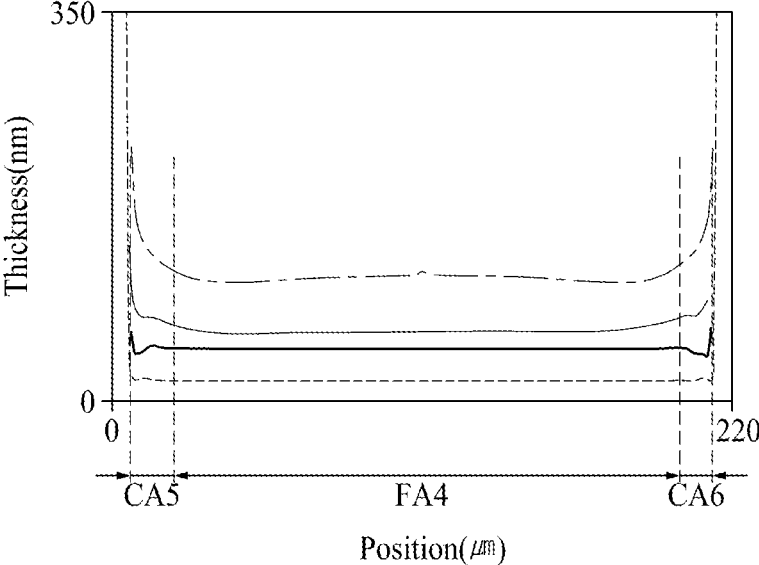

FIGS. 8A and 8B illustrate cross-sectional profiles of a hole functional layer and an emission layer according to an embodiment of the present disclosure.

FIGS. 8A and 8B illustrate cross-sectional profiles of a hole functional layer and an emission layer of a pixel in the red subpixel R-sub of FIG. 5. The hole functional layer may include a hole injection layer and a first hole transport layer. For example, FIGS. 8A and 8B illustrate cross-sectional profiles of a hole injection layer, a hole transport layer, and an emission layer of a pixel in the red subpixel R-sub. FIG. 8A is a cross-sectional profile of a short axis of a pixel in the red subpixel R-sub, and FIG. 8B is a cross-sectional profile of a long axis of a pixel in the red subpixel R-sub. The descriptions of FIGS. 8A and 8B may be applied identical or similar to a pixel in a green subpixel G-sub and/or a pixel in a white subpixel W-sub also. For example, the cross-sectional profiles of the hole functional layer and the emission layer of the pixel in the red subpixel R-sub may be equal or similar to cross-sectional profiles of a hole functional layer and an emission layer of a pixel in the green subpixel G-sub. For example, the cross-sectional profiles of the hole functional layer and the emission layer of the pixel in the red subpixel R-sub may be equal or similar to cross-sectional profiles of a hole functional layer and an emission layer of a pixel in the white subpixel W-sub.

In FIGS. 8A and 8B, the abscissa axis represents a position (or distance) (unit: μm), and the ordinate axis represents a thickness (unit: nm). For example, the abscissa axis may be a length of a long axis and a length of a short axis of a pixel. FIGS. 8A and 8B are for showing cross-sectional profiles of a hole functional layer and an emission layer, and numerical values of the abscissa axis and the ordinate axis in FIGS. 8A and 8B may not limit the descriptions of the present disclosure.

In FIGS. 8A and 8B, a thick solid line represents a hole injection layer, and a thin solid line represents a hole injection layer and a first hole transport layer. A dash-single dotted line represents a hole injection layer, a first hole transport layer, and a first emission layer. A thin dotted line represents a first electrode.

Referring to FIG. 8A, a hole injection layer may be formed by a solution process. A first hole transport layer and a first emission layer formed on the hole injection layer may be formed by a solution process, and thus, may be formed along a shape of the hole injection layer.

According to an embodiment of the present disclosure, the hole injection layer may include a third flat portion FA3, a third curved portion CA3, and a fourth curved portion CA4. The third flat portion FA3 may be disposed between the third curved portion CA3 and the fourth curved portion CA4. A height of a center portion of the third flat portion FA3 may not be equal to a height of an outer portion thereof adjacent to the third curved portion CA3 and the fourth curved portion CA4. Each of the third curved portion CA3 and the fourth curved portion CA4 may be a region where a thickness thereof is thinned progressively toward an inner portion thereof adjacent to the third flat portion FA3.

Referring to FIG. 8B, a profile shape of a long axis of a pixel may be different from a profile shape of a short axis of the pixel at the red subpixel R-sub of FIG. 8A. For example, a hole injection layer may be formed by a solution process, and thus, may have a concave shape. A first hole transport layer and a first emission layer formed on the hole injection layer may be formed by a solution process, and thus, may be formed along a shape of the hole injection layer. For example, the hole injection layer, the first hole transport layer, and the first emission layer may have a concave shape.

According to an embodiment of the present disclosure, the hole injection layer may include a fourth flat portion FA4, a fifth curved portion CA5, and a sixth curved portion CA6. The fourth flat portion FA4 may be disposed between the fifth curved portion CA5 and the sixth curved portion CA6. The fifth curved portion CA5 and the sixth curved portion CA6 may be a region where a thickness thereof is thicker progressively toward an outer portion thereof adjacent to the fourth flat portion FA4. A thickness of the third curved portion CA3 adjacent to a first electrode may be different from a thickness of the fifth curved portion CA5 adjacent to the first electrode. For example, a thickness of the third curved portion CA3 adjacent to a first electrode may be greater than a thickness of the fifth curved portion CA5 adjacent to the first electrode. A thickness of the fourth curved portion CA4 adjacent to a first electrode may be different from a thickness of the sixth curved portion CA6 adjacent to the first electrode. For example, a thickness of the fourth curved portion CA4 adjacent to a first electrode may be greater than a thickness of the sixth curved portion CA6 adjacent to the first electrode.

According to an embodiment of the present disclosure, in the hole injection layer of the red subpixel R-sub, a cross-sectional profile of a short axis of a pixel may be different from a cross-sectional profile of a long axis of the pixel. For example, in the hole injection layer of the red subpixel R-sub, the cross-sectional profile of the short axis of the pixel may have a U-shape. For example, in the hole injection layer of the red subpixel R-sub, a height of a center portion of a third flat portion FA3 of the cross-sectional profile of the short axis of the pixel may be equal to or different from a height of a center portion of a fourth flat portion FA4 of the cross-sectional profile of the long axis of the pixel.

According to an embodiment of the present disclosure, in the red subpixel R-sub, a thickness of the hole injection layer adjacent to the first electrode in the cross-sectional profile of the short axis of the pixel may be different from a thickness of the hole injection layer adjacent to the first electrode in the cross-sectional profile of the long axis of the pixel. For example, in the red subpixel R-sub, a thickness of the hole injection layer adjacent to the first electrode in the cross-sectional profile of the short axis of the pixel may be greater than a thickness of the hole injection layer adjacent to the first electrode in the cross-sectional profile of the long axis of the pixel.

According to an embodiment of the present disclosure, in the hole injection layer of the green subpixel G-sub, a cross-sectional profile of a short axis of a pixel may be different from a cross-sectional profile of a long axis of the pixel. For example, in the green subpixel G-sub, a thickness of the hole injection layer adjacent to the first electrode in the cross-sectional profile of the short axis of the pixel may be different from a thickness of the hole injection layer adjacent to the first electrode in the cross-sectional profile of the long axis of the pixel. For example, in the green subpixel G-sub, a thickness of the hole injection layer adjacent to the first electrode in the cross-sectional profile of the short axis of the pixel may be greater than a thickness of the hole injection layer adjacent to the first electrode in the cross-sectional profile of the long axis of the pixel.

According to an embodiment of the present disclosure, in the hole injection layer of the white subpixel W-sub, a cross-sectional profile of a short axis of a pixel may be different from a cross-sectional profile of a long axis of the pixel. For example, in the white subpixel W-sub, a thickness of the hole injection layer adjacent to the first electrode in the cross-sectional profile of the short axis of the pixel may be different from a thickness of the hole injection layer adjacent to the first electrode in the cross-sectional profile of the long axis of the pixel. For example, in the white subpixel W-sub, a thickness of the hole injection layer adjacent to the first electrode in the cross-sectional profile of the short axis of the pixel may be greater than a thickness of the hole injection layer adjacent to the first electrode in the cross-sectional profile of the long axis of the pixel.

Figure 9A:
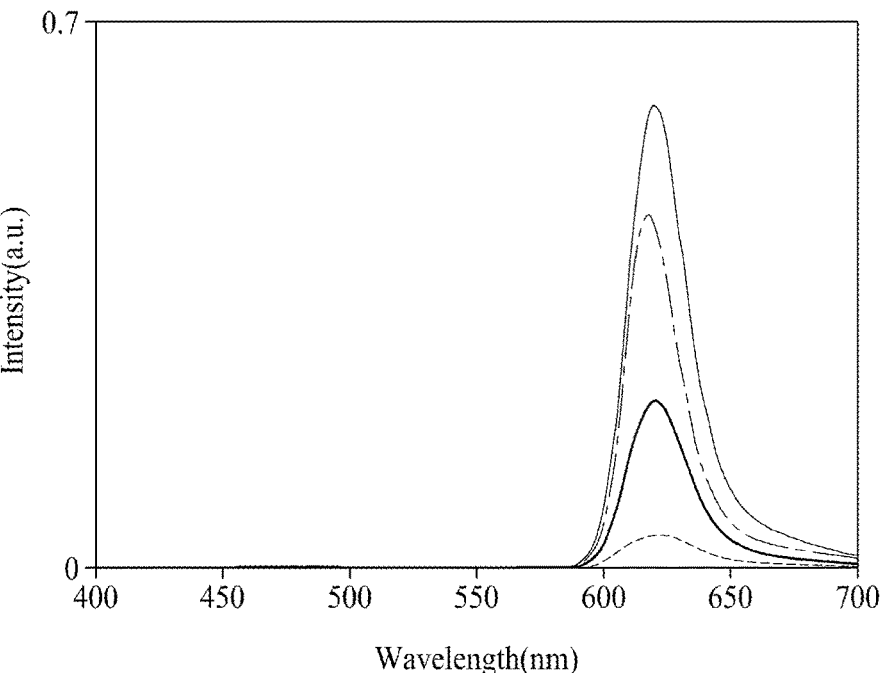
FIGS. 9A to 9C illustrate an emission intensity according to an embodiment of the present disclosure.
Figure 9B:
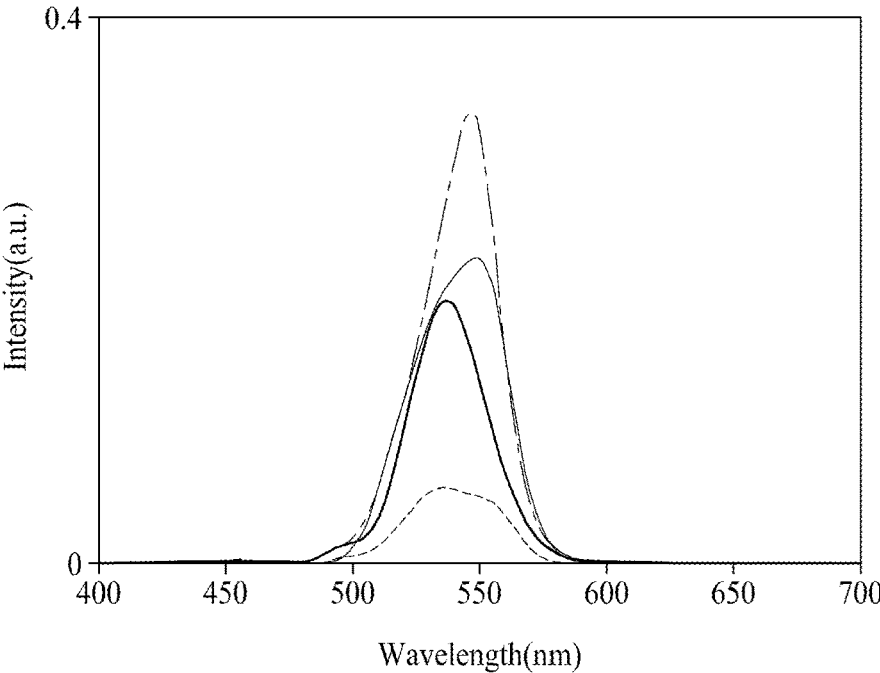
Figure 9C:
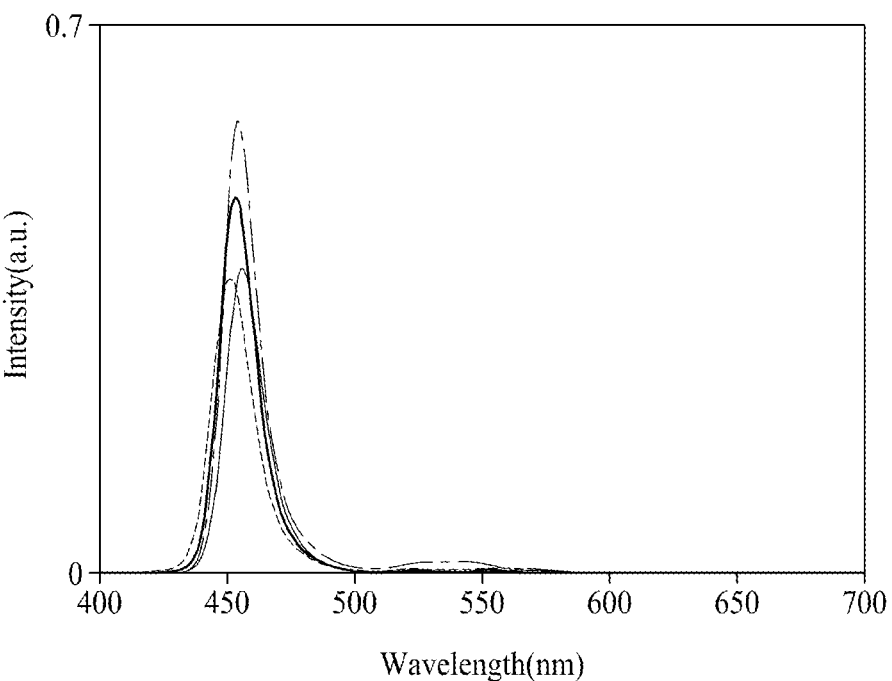

FIGS. 9A to 9C illustrate an emission intensity according to an embodiment of the present disclosure.

In FIGS. 9A to 9C, the abscissa axis represents a wavelength range (nm) of light, and the ordinate axis represents emission intensity (arbitrary unit; a.u.). The emission intensity is a numerical value expressed as a relative value with respect to a maximum value of an electroluminescence (EL) spectrum. EL may be light which is finally emitted from a display apparatus and may be expressed as the multiplication of photoluminescence (PL) and emittance. A wavelength where organic layers configuring an emission part emit unique light may denote PL, and light emitted based on an influence of a thickness or an optical characteristic of layers configuring the organic layers may denote emittance.

FIG. 9A illustrates an emission intensity of a red wavelength range. A thin dotted line represents an emission intensity of an experimental example, and a thick solid line represents an emission intensity of the display apparatus of FIG. 4. A thin solid line represents an emission intensity of the display apparatus of FIG. 5, and a dash-single dotted line represents an emission intensity of the display apparatus of FIG. 6.

Referring to FIG. 9A, it may be seen that an emission intensity of FIGS. 4 to 6 is greater than the experimental example in 600 nm to 650 nm which is a wavelength range of red. For example, it may be seen that an emission intensity of FIG. 5 where a hole injection layer, a hole transport layer, and an emission layer are formed by a solution process is greater than FIG. 4 where a hole injection layer is formed by a solution process. For example, it may be seen that an emission intensity of FIG. 6 where a hole injection layer, a hole transport layer, and an emission layer are formed by a solution process is greater than FIG. 4 where the hole injection layer is formed by the solution process. For example, it may be seen that an emission intensity of FIG. 5 including three emission parts where the hole injection layer, the hole transport layer, and the emission layer are formed by the solution process is greater than FIG. 6 including four emission parts where the hole injection layer, the hole transport layer, and the emission layer are formed by the solution process.

According to an embodiment of the present disclosure, in a case where at least one or more of a hole injection layer, a hole transport layer, and an emission layer are formed by a solution process, it may be seen that emission intensity is enhanced more than a case where layers are formed by a deposition process.

FIG. 9B illustrates an emission intensity of a green wavelength range. A thin dotted line represents an emission intensity of an experimental example, and a thick solid line represents an emission intensity of the display apparatus of FIG. 4. A thin solid line represents an emission intensity of the display apparatus of FIG. 5, and a dash-single dotted line represents an emission intensity of the display apparatus of FIG. 6.

Referring to FIG. 9B, it may be seen that an emission intensity of FIGS. 4 to 6 is greater than the experimental example in 520 nm to 590 nm which is a wavelength range of green. For example, it may be seen that an emission intensity of FIG. 5 where a hole injection layer, a hole transport layer, and an emission layer are formed by a solution process is greater than FIG. 4 where a hole injection layer is formed by a solution process. For example, it may be seen that an emission intensity of FIG. 6 where a hole injection layer, a hole transport layer, and an emission layer are formed by a solution process is greater than FIG. 4 where the hole injection layer is formed by the solution process. For example, it may be seen that an emission intensity of FIG. 6 including four emission parts where the hole injection layer, the hole transport layer, and the emission layer are formed by the solution process is greater than FIG. 5 including three emission parts where the hole injection layer, the hole transport layer, and the emission layer are formed by the solution process.

According to an embodiment of the present disclosure, in a case where at least one or more of a hole injection layer, a hole transport layer, and an emission layer are formed by a solution process, it may be seen that emission intensity is enhanced more than a case where layers are formed by a deposition process.

FIG. 9C illustrates an emission intensity of a blue wavelength range. A thin dotted line represents an emission intensity of an experimental example, and a thick solid line represents an emission intensity of the display apparatus of FIG. 4. A thin solid line represents an emission intensity of the display apparatus of FIG. 5, and a dash-single dotted line represents an emission intensity of the display apparatus of FIG. 6.

Referring to FIG. 9C, it may be seen that an emission intensity of FIGS. 4 to 6 is greater than the experimental example in 420 nm to 480 nm which is a wavelength range of blue. For example, it may be seen that an emission intensity of FIG. 5 where a hole injection layer, a hole transport layer, and an emission layer are formed by a solution process is greater than FIG. 4 where a hole injection layer is formed by a solution process. For example, it may be seen that an emission intensity of FIG. 6 where a hole injection layer, a hole transport layer, and an emission layer are formed by a solution process is greater than FIG. 4 where the hole injection layer is formed by the solution process. For example, it may be seen that an emission intensity of FIG. 6 including four emission parts where the hole injection layer, the hole transport layer, and the emission layer are formed by the solution process is greater than FIG. 5 including three emission parts where the hole injection layer, the hole transport layer, and the emission layer are formed by the solution process.

According to an embodiment of the present disclosure, in a case where at least one or more of a hole injection layer, a hole transport layer, and an emission layer are formed by a solution process, it may be seen that emission intensity is enhanced more than a case where layers are formed by a deposition process.

Figure 10:
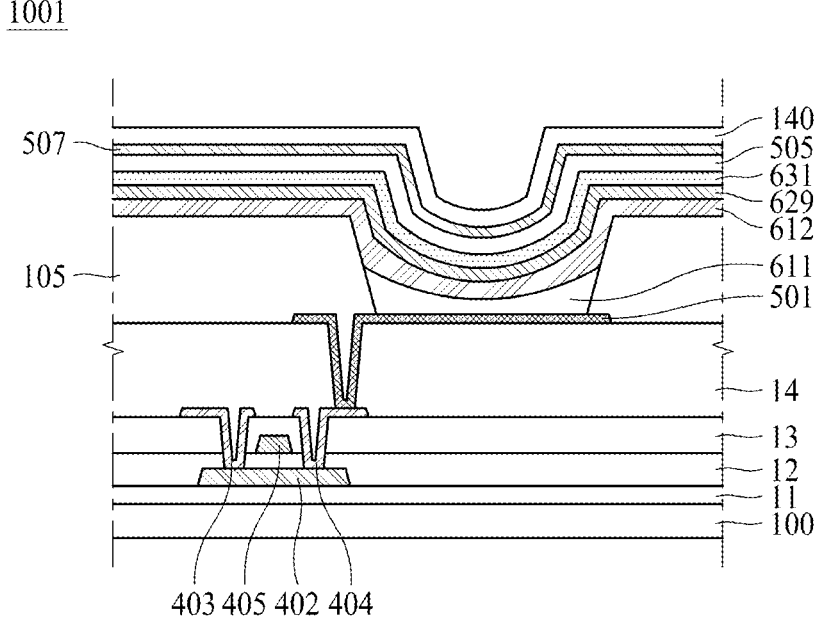
FIG. 10 illustrate a display apparatus according to another embodiment of the present disclosure.

FIG. 10 illustrates a display apparatus according to another embodiment of the present disclosure.

FIG. 10 illustrates a diagram where the hole injection layer, the first hole transport layer, and the first emission layer of FIG. 4 are formed by a solution process. In FIG. 10, a hole injection layer 611, a first hole transport layer 612, a first electron transport layer 631, and a first emission layer 629 of a first emission part 1100 between a first electrode 501 and a second electrode 505 are illustrated, and only one red subpixel R-sub is illustrated. A description of a transistor on a substrate 100 in FIG. 10 may be the same as the description of FIG. 3, and thus, a repeated description thereof is omitted.

Referring to FIG. 10, the hole injection layer 611 may be formed by a solution process. For example, the hole injection layer 611 may be formed in a U-shape. The first hole transport layer 612 may be disposed on the hole injection layer 611. The first hole transport layer 612 may be formed by a deposition process. For example, the first hole transport layer 612 may be conformally formed along the surface of the hole injection layer 611. For example, the first hole transport layer 612 may be formed to correspond to a cross-sectional profile of the hole injection layer 611. For example, a surface shape of the first hole transport layer 612 may be based on a surface shape of the hole injection layer 611.

The first emission layer 629 may be disposed on the first hole transport layer 612. The first emission layer 629 may be formed by a deposition process. For example, the first emission layer 629 may be conformally formed along the surface of the hole injection layer 611. For example, the first emission layer 629 may be formed to correspond to a cross-sectional profile of the hole injection layer 611. For example, a surface shape of the first emission layer 629 may be based on a surface shape of the hole injection layer 611.

The first electron transport layer 631 may be disposed on the first emission layer 629. The first electron transport layer 631 may be formed by a deposition process. For example, the first electron transport layer 631 may be conformally formed along the surface of the hole injection layer 611. For example, the first electron transport layer 631 may be formed to correspond to a cross-sectional profile of the hole injection layer 611. For example, a surface shape of the first electron transport layer 631 may be based on a surface shape of the hole injection layer 611. In addition, a protection layer 140 may be disposed on the second electrode 505.

According to an embodiment of the present disclosure, a multi-cavity effect may be obtained based on a change in thickness of the layers between the first electrode 501 and the second electrode 505, and thus, the luminance and/or efficiency of the display apparatus may be enhanced. For example, a thickness of the layers between the first electrode 501 and the second electrode 505 may be different for each subpixel, and different cavity characteristics for each subpixel may be obtained based on a change in thickness of the layers between the first electrode 501 and the second electrode 505. Accordingly, the display apparatus may be provided where efficiency is improved and a current is reduced for each subpixel.

A display apparatus according to one or more embodiments of the present disclosure may be applied to or included in mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), motion pictures expert group audio layer 3 (MP3) players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the pixel structure of the display apparatus according to one or more embodiments of the present disclosure may be applied to or included in a lighting part (or a lighting layer) of an organic light-emitting lighting apparatus or an inorganic light-emitting lighting apparatus.

A display apparatus according to one or more embodiments of the present disclosure will be described below.

A display apparatus according to one or more embodiments of the present disclosure may comprise a substrate including a plurality of subpixels, each of the plurality of subpixels may comprise a first electrode; a first emission part on the first electrode, the first emission part including a first hole functional layer and a first emission layer; a first charge generating layer on the first emission part; a second emission part on the first charge generating layer, the second emission part including a second hole functional layer and a second emission layer; a second charge generating layer on the second emission part; and a third emission part on the second charge generating layer, the third emission part including a third hole functional layer and a third emission layer. Thicknesses of the first hole functional layers respectively at the plurality of subpixels are different.

According to one or more embodiments of the present disclosure, the plurality of subpixels may comprise a red subpixel, a green subpixel, and a blue subpixel, the first hole functional layer may be at the red subpixel, the green subpixel, and the blue subpixel, and a thickness of the first hole functional layer of the red subpixel maybe greater than a thickness of the first hole functional layer of the blue subpixel.

According to one or more embodiments of the present disclosure, a thickness of the first hole functional layer of the blue subpixel may be greater than a thickness of the first hole functional layer of the green subpixel.

According to one or more embodiments of the present disclosure, the plurality of subpixels may further comprise a white subpixel, the first hole functional layer may be at the white subpixel, a thickness of the first hole functional layer of the blue subpixel may be greater than a thickness of the first hole functional layer of the white subpixel, and a thickness of the first hole functional layer of the white subpixel may be greater than a thickness of the first hole functional layer of the green subpixel.

According to one or more embodiments of the present disclosure, the first hole functional layer may comprise one or more of a hole injection layer and a first hole transport layer, and a surface shape of the first hole transport layer may be based on a surface shape of the hole injection layer.

According to one or more embodiments of the present disclosure, a surface shape of the first emission layer may be based on the surface shape of the hole injection layer.

According to one or more embodiments of the present disclosure, the display apparatus may further comprise a first electron functional layer on the first emission layer, a second electron functional layer on the second emission layer, and a third electron functional layer on the third emission layer. The surface shapes of the first emission layer, the first electron functional layer, the first charge generating layer, the second hole functional layer, the second emission layer, the second electron functional layer, the second charge generating layer, the third hole functional layer, the third emission layer, and the third electron functional layer may be based on the surface shape of the hole injection layer.

According to one or more embodiments of the present disclosure, at least two or more of the first emission layer, the second emission layer, and the third emission layer may comprise the same emission layer.

According to one or more embodiments of the present disclosure, the plurality of subpixels may comprise a red subpixel, a green subpixel, a blue subpixel, and a white subpixel, and the first emission layer in the red subpixel, the green subpixel, the blue subpixel, and the white subpixel may comprise a blue emission layer.

According to one or more embodiments of the present disclosure, the second emission layer at the red subpixel, the green subpixel, the blue subpixel, and the white subpixel may comprise a green emission layer and a red emission layer.

According to one or more embodiments of the present disclosure, the third emission layer at the red subpixel, the green subpixel, the blue subpixel, and the white subpixel may comprise a blue emission layer.

According to one or more embodiments of the present disclosure, the plurality of subpixels may comprise a red subpixel, a green subpixel, and a blue subpixel, the first hole functional layer may be at the red subpixel, the green subpixel, and the blue subpixel, and a thickness of the first hole functional layer of the blue subpixel may be greater than a thickness of the first hole functional layer of the green subpixel.

According to one or more embodiments of the present disclosure, a thickness of the first hole functional layer of the green subpixel may be greater than or equal to a thickness of the first hole functional layer of the red subpixel.

According to one or more embodiments of the present disclosure, the first hole functional layer may comprise one or more of a hole injection layer and a first hole transport layer, and thicknesses of the first hole transport layers of the red subpixel, the green subpixel, and the blue subpixel may be equal to one another.

According to one or more embodiments of the present disclosure, the plurality of subpixels may comprise a red subpixel, a green subpixel, a blue subpixel, and a white subpixel, and the first hole functional layer may be at the red subpixel, the green subpixel, the blue subpixel, and the white subpixel, a thickness of the first hole functional layer of the blue subpixel may be greater than a thickness of the first hole functional layer of the white subpixel, and a thickness of the first hole functional layer of the white subpixel may be greater than a thickness of the first hole functional layer of the green subpixel.

According to one or more embodiments of the present disclosure, the plurality of subpixels may comprise a red subpixel, a green subpixel, a blue subpixel, and a white subpixel, and thicknesses of the first emission layers of the red subpixel, the green subpixel, the blue subpixel, and the white subpixel may be different.

According to one or more embodiments of the present disclosure, a thickness of the first emission layer of the red subpixel may be greater than a thickness of the first emission layer of the green subpixel.

According to one or more embodiments of the present disclosure, a thickness of the first emission layer of the red subpixel may be greater than a thickness of the first emission layer of the blue subpixel.

According to one or more embodiments of the present disclosure, a thickness of the first emission layer of the red subpixel may be greater than a thickness of the first emission layer of the blue subpixel, and a thickness of the first emission layer of the blue subpixel may be greater than or equal to a thickness of the first emission layer of the green subpixel.

According to one or more embodiments of the present disclosure, a thickness of the first emission layer of the red subpixel may be greater than a thickness of the first emission layer of the blue subpixel, a thickness of the first emission layer of the blue subpixel may be greater than or equal to a thickness of the first emission layer of the green subpixel, and a thickness of the first emission layer of the green subpixel may be greater than a thickness of the first emission layer of the white subpixel.

According to one or more embodiments of the present disclosure, at least two or more of the first emission layers of the red subpixel, the green subpixel, the blue subpixel, and the white subpixel may comprise a same emission layer.

According to one or more embodiments of the present disclosure, the first emission layer of the red subpixel may comprise a red emission layer, the first emission layer of the green subpixel may comprise a green emission layer, the first emission layer of the blue subpixel may comprise a blue emission layer, and the first emission layer of the white subpixel may comprise a blue emission layer.

According to one or more embodiments of the present disclosure, the second emission layers of the red subpixel, the green subpixel, the blue subpixel, and the white subpixel may comprise a green emission layer and a red emission layer.

According to one or more embodiments of the present disclosure, the third emission layers at the red subpixel, the green subpixel, the blue subpixel, and the white subpixel may comprise a blue emission layer.

According to one or more embodiments of the present disclosure, the first charge generating layer, the second emission part, the second charge generating layer, and the third emission part may be based on a surface shape of the first emission layer.

According to one or more embodiments of the present disclosure, the plurality of subpixels may comprise a red subpixel, a green subpixel, and a blue subpixel, the first hole functional layer may be at the red subpixel, the green subpixel, and the blue subpixel, and a thickness of the first hole functional layer of the red subpixel may be greater than or equal to a thickness of the first hole functional layer of the green subpixel.

According to one or more embodiments of the present disclosure, a thickness of the first hole functional layer of the green subpixel may be greater than a thickness of the first hole functional layer of the blue subpixel.

According to one or more embodiments of the present disclosure, the first hole functional layer may comprise one or more of a hole injection layer and a first hole transport layer, and thicknesses of the first hole transport layers of the red subpixel, the green subpixel, and the blue subpixel may be equal to one another.

According to one or more embodiments of the present disclosure, the plurality of subpixels may comprise a red subpixel, a green subpixel, a blue subpixel, and a white subpixel, and the first hole functional layer may be at the red subpixel, the green subpixel, the blue subpixel, and the white subpixel, and a thickness of the first hole functional layer of the white subpixel may be greater than a thickness of the first hole functional layer of the red subpixel.

According to one or more embodiments of the present disclosure, the plurality of subpixels may comprise a red subpixel, a green subpixel, a blue subpixel, and a white subpixel, and thicknesses of the first emission layers of the red subpixel, the green subpixel, the blue subpixel, and the white subpixel may be different.

According to one or more embodiments of the present disclosure, a thickness of the first emission layer of the red subpixel may be greater than a thickness of the first emission layer of the green subpixel.

According to one or more embodiments of the present disclosure, a thickness of the first emission layer of the red subpixel may be greater than a thickness of the first emission layer of the blue subpixel.

According to one or more embodiments of the present disclosure, a thickness of the first emission layer of the red subpixel may be greater than a thickness of the first emission layer of the blue subpixel, and a thickness of the first emission layer of the blue subpixel may be greater than or equal to a thickness of the first emission layer of the green subpixel.

According to one or more embodiments of the present disclosure, a thickness of the first emission layer of the red subpixel may be greater than a thickness of the first emission layer of the blue subpixel, a thickness of the first emission layer of the blue subpixel may be greater than or equal to a thickness of the first emission layer of the green subpixel, and a thickness of the first emission layer of the green subpixel may be greater than a thickness of the first emission layer of the white subpixel.

According to one or more embodiments of the present disclosure, at least two or more of the first emission layers of the red subpixel, the green subpixel, the blue subpixel, and the white subpixel may comprise a same emission layer.

According to one or more embodiments of the present disclosure, the first emission layer of the red subpixel may comprise a red emission layer, the first emission layer of the green subpixel may comprise a green emission layer, the first emission layer of the blue subpixel may comprises a blue emission layer, and the first emission layer of the white subpixel may comprises a blue emission layer.

According to one or more embodiments of the present disclosure, the second emission layers of the red subpixel, the green subpixel, the blue subpixel, and the white subpixel may comprise a blue emission layer.

According to one or more embodiments of the present disclosure, the third emission layers at the red subpixel, the green subpixel, the blue subpixel, and the white subpixel may comprise a green emission layer and a red emission layer.

According to one or more embodiments of the present disclosure, each of the plurality of subpixels may further comprise a fourth emission part on the third emission part, the fourth emission part including a fourth hole functional layer and a fourth emission layer; and a third charge generating layer between the third emission part and the fourth emission part.

According to one or more embodiments of the present disclosure, the fourth emission layers of the red subpixel, the green subpixel, the blue subpixel, and the white subpixel may comprise a blue emission layer.

According to one or more embodiments of the present disclosure, the first charge generating layer, the second emission part, the second charge generating layer, the third emission part, the third charge generating layer, and the fourth emission part may be based on a surface shape of the first emission layer.

It will be apparent to those skilled in the art that various modifications and variations can be made in the present disclosure without departing from the scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a substrate including a plurality of subpixels,
wherein each of the plurality of subpixels comprises:
   a first electrode;
   a first emission part on the first electrode, the first emission part including a first hole functional layer and a first emission layer;
   a first charge generating layer on the first emission part;
   a second emission part on the first charge generating layer, the second emission part including a second hole functional layer and a second emission layer;
   a second charge generating layer on the second emission part; and
   a third emission part on the second charge generating layer, the third emission part including a third hole functional layer and a third emission layer,
wherein thicknesses of the first hole functional layers respectively included at different subpixels within the plurality of subpixels are different from each other.

2. The display apparatus of claim 1, wherein:
the plurality of subpixels comprises a red subpixel, a green subpixel, and a blue subpixel;
the first hole functional layer is at the red subpixel, the green subpixel, and the blue subpixel; and
a thickness of the first hole functional layer of the red subpixel is greater than a thickness of the first hole functional layer of the blue subpixel.

3. The display apparatus of claim 2, wherein a thickness of the first hole functional layer of the blue subpixel is greater than a thickness of the first hole functional layer of the green subpixel.

4. The display apparatus of claim 2, wherein:
the plurality of subpixels further comprises a white subpixel;
the first hole functional layer is at the white subpixel;
a thickness of the first hole functional layer of the blue subpixel is greater than a thickness of the first hole functional layer of the white subpixel; and
a thickness of the first hole functional layer of the white subpixel is greater than a thickness of the first hole functional layer of the green subpixel.

5. The display apparatus of claim 2, wherein:
the first hole functional layer comprises one or more of a hole injection layer and a first hole transport layer; and a surface shape of the first hole transport layer is based on a surface shape of the hole injection layer.

6. The display apparatus of claim 5, wherein a surface shape of the first emission layer is based on the surface shape of the hole injection layer.

7. The display apparatus of claim 5, further comprising:
a first electron functional layer on the first emission layer;
a second electron functional layer on the second emission layer; and
a third electron functional layer on the third emission layer,
wherein surface shapes of the first emission layer, the first electron functional layer, the first charge generating layer, the second hole functional layer, the second emission layer, the second electron functional layer, the second charge generating layer, the third hole functional layer, the third emission layer, and the third electron functional layer are based on the surface shape of the hole injection layer.

8. The display apparatus of claim 2, wherein at least two or more of the first emission layer, the second emission layer, and the third emission layer comprise the same emission layer.

9. The display apparatus of claim 1, wherein:
the plurality of subpixels comprises a red subpixel, a green subpixel, a blue subpixel, and a white subpixel; and
the first emission layer in the red subpixel, the green subpixel, the blue subpixel, and the white subpixel comprise a blue emission layer.

10. The display apparatus of claim 9, wherein the second emission layer at the red subpixel, the green subpixel, the blue subpixel, and the white subpixel comprise a green emission layer and a red emission layer.

11. The display apparatus of claim 9, wherein the third emission layer at the red subpixel, the green subpixel, the blue subpixel, and the white subpixel comprise a blue emission layer.

12. The display apparatus of claim 1, wherein:
the plurality of subpixels comprises a red subpixel, a green subpixel, and a blue subpixel;
the first hole functional layer is at the red subpixel, the green subpixel, and the blue subpixel; and
a thickness of the first hole functional layer of the blue subpixel is greater than a thickness of the first hole functional layer of the green subpixel.

13. The display apparatus of claim 12, wherein a thickness of the first hole functional layer of the green subpixel is greater than or equal to a thickness of the first hole functional layer of the red subpixel.

14. The display apparatus of claim 12, wherein:
the first hole functional layer comprises one or more of a hole injection layer and a first hole transport layer; and
thicknesses of the first hole transport layers of the red subpixel, the green subpixel, and the blue subpixel are equal to one another.

15. The display apparatus of claim 1, wherein:
the plurality of subpixels comprises a red subpixel, a green subpixel, a blue subpixel, and a white subpixel, and
the first hole functional layer is at the red subpixel, the green subpixel, the blue subpixel, and the white subpixel;
a thickness of the first hole functional layer of the blue subpixel is greater than a thickness of the first hole functional layer of the white subpixel; and a thickness of the first hole functional layer of the white subpixel is greater than a thickness of the first hole functional layer of the green subpixel.

16. The display apparatus of claim 1, wherein:
the plurality of subpixels comprises a red subpixel, a green subpixel, a blue subpixel, and a white subpixel; and
thicknesses of the first emission layers of the red subpixel, the green subpixel, the blue subpixel, and the white subpixel are different.

17. The display apparatus of claim 16, wherein a thickness of the first emission layer of the red subpixel is greater than a thickness of the first emission layer of the green subpixel.

18. The display apparatus of claim 16, wherein a thickness of the first emission layer of the red subpixel is greater than a thickness of the first emission layer of the blue subpixel.

19. The display apparatus of claim 16, wherein:
a thickness of the first emission layer of the red subpixel is greater than a thickness of the first emission layer of the blue subpixel; and
a thickness of the first emission layer of the blue subpixel is greater than or equal to a thickness of the first emission layer of the green subpixel.

20. The display apparatus of claim 16, wherein:
a thickness of the first emission layer of the red subpixel is greater than a thickness of the first emission layer of the blue subpixel;
a thickness of the first emission layer of the blue subpixel is greater than or equal to a thickness of the first emission layer of the green subpixel; and
a thickness of the first emission layer of the green subpixel is greater than a thickness of the first emission layer of the white subpixel.

21. The display apparatus of claim 16, wherein at least two or more of the first emission layers of the red subpixel, the green subpixel, the blue subpixel, and the white subpixel comprise a same emission layer.

22. The display apparatus of claim 16, wherein:
the first emission layer of the red subpixel comprises a red emission layer;
the first emission layer of the green subpixel comprises a green emission layer;
the first emission layer of the blue subpixel comprises a blue emission layer; and
the first emission layer of the white subpixel comprises a blue emission layer.

23. The display apparatus of claim 16, wherein the second emission layers of the red subpixel, the green subpixel, the blue subpixel, and the white subpixel comprise a green emission layer and a red emission layer.

24. The display apparatus of claim 16, wherein the third emission layers at the red subpixel, the green subpixel, the blue subpixel, and the white subpixel comprise a blue emission layer.

25. The display apparatus of claim 16, wherein the first charge generating layer, the second emission part, the second charge generating layer, and the third emission part are based on a surface shape of the first emission layer.

26. The display apparatus of claim 1, wherein:
the plurality of subpixels comprises a red subpixel, a green subpixel, and a blue subpixel;
the first hole functional layer is at the red subpixel, the green subpixel, and the blue subpixel; and
a thickness of the first hole functional layer of the red subpixel is greater than or equal to a thickness of the first hole functional layer of the green subpixel.

27. The display apparatus of claim 26, wherein a thickness of the first hole functional layer of the green subpixel is greater than a thickness of the first hole functional layer of the blue subpixel.

28. The display apparatus of claim 26, wherein:
the first hole functional layer comprises one or more of a hole injection layer and a first hole transport layer; and
thicknesses of the first hole transport layers of the red subpixel, the green subpixel, and the blue subpixel are equal to one another.

29. The display apparatus of claim 1, wherein:
the plurality of subpixels comprises a red subpixel, a green subpixel, a blue subpixel, and a white subpixel, and
the first hole functional layer is at the red subpixel, the green subpixel, the blue subpixel, and the white subpixel; and
a thickness of the first hole functional layer of the white subpixel is greater than a thickness of the first hole functional layer of the red subpixel.

30. The display apparatus of claim 29, wherein:
the plurality of subpixels comprises a red subpixel, a green subpixel, a blue subpixel, and a white subpixel; and
thicknesses of the first emission layers of the red subpixel, the green subpixel, the blue subpixel, and the white subpixel are different.

31. The display apparatus of claim 30, wherein a thickness of the first emission layer of the red subpixel is greater than a thickness of the first emission layer of the green subpixel.

32. The display apparatus of claim 30, wherein a thickness of the first emission layer of the red subpixel is greater than a thickness of the first emission layer of the blue subpixel.

33. The display apparatus of claim 30, wherein:
a thickness of the first emission layer of the red subpixel is greater than a thickness of the first emission layer of the blue subpixel; and
a thickness of the first emission layer of the blue subpixel is greater than or equal to a thickness of the first emission layer of the green subpixel.

34. The display apparatus of claim 30, wherein:
a thickness of the first emission layer of the red subpixel is greater than a thickness of the first emission layer of the blue subpixel;
a thickness of the first emission layer of the blue subpixel is greater than or equal to a thickness of the first emission layer of the green subpixel; and
a thickness of the first emission layer of the green subpixel is greater than a thickness of the first emission layer of the white subpixel.

35. The display apparatus of claim 30, wherein at least two or more of the first emission layers of the red subpixel, the green subpixel, the blue subpixel, and the white subpixel comprise a same emission layer.

36. The display apparatus of claim 30, wherein:
the first emission layer of the red subpixel comprises a red emission layer;
the first emission layer of the green subpixel comprises a green emission layer;
the first emission layer of the blue subpixel comprises a blue emission layer; and
the first emission layer of the white subpixel comprises a blue emission layer.

37. The display apparatus of claim 30, wherein the second emission layers of the red subpixel, the green subpixel, the blue subpixel, and the white subpixel comprise a blue emission layer.

38. The display apparatus of claim 30, wherein the third emission layers at the red subpixel, the green subpixel, the blue subpixel, and the white subpixel comprise a green emission layer and a red emission layer.

39. The display apparatus of claim 26, wherein each of the plurality of subpixels further comprise:

a fourth emission part on the third emission part, the fourth emission part including a fourth hole functional layer and a fourth emission layer; and a third charge generating layer between the third emission part and the fourth emission part.

40. The display apparatus of claim 39, wherein the fourth emission layers of the red subpixel, the green subpixel, the blue subpixel, and the white subpixel comprise a blue emission layer.

41. The display apparatus of claim 39, wherein the first charge generating layer, the second emission part, the second charge generating layer, the third emission part, the third charge generating layer, and the fourth emission part are based on a surface shape of the first emission layer.

* * * * *